US 6,665,050 B2

(12) United States Patent
Shiraishi

(10) Patent No.: US 6,665,050 B2
(45) Date of Patent: *Dec. 16, 2003

(54) PROJECTION EXPOSURE METHODS USING DIFRACTED LIGHT WITH INCREASED INTENSITY PORTIONS SPACED FROM THE OPTICAL AXIS

(75) Inventor: Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/195,421

(22) Filed: Jul. 16, 2002

(65) Prior Publication Data

US 2002/0196416 A1 Dec. 26, 2002

Related U.S. Application Data

(63) Continuation of application No. 09/960,952, filed on Sep. 25, 2001, now abandoned, which is a continuation of application No. 09/163,166, filed on Sep. 30, 1998, now abandoned, which is a division of application No. 08/376,676, filed on Jan. 20, 1995, which is a continuation of application No. 08/122,318, filed on Sep. 17, 1993, now abandoned, which is a continuation of application No. 07/791,138, filed on Nov. 13, 1991, now abandoned, said application No. 08/376,676, is a continuation-in-part of application No. 08/257,956, filed on Jun. 10, 1994, now Pat. No. 5,638,211, which is a continuation of application No. 08/101,674, filed on Aug. 4, 1993, now abandoned, which is a continuation of application No. 07/847,030, filed as application No. PCT/JP91/01103 on Aug. 19, 1991, now abandoned.

(30) Foreign Application Priority Data

| Nov. 15, 1990 | (JP) | 2-309458 |
| Nov. 15, 1990 | (JP) | 2-309459 |
| Dec. 27, 1990 | (JP) | 2-408093 |
| Dec. 27, 1990 | (JP) | 2-408094 |
| Dec. 27, 1990 | (JP) | 2-408095 |
| Dec. 27, 1990 | (JP) | 2-408096 |

(51) Int. Cl.$^7$ .................................................. G03B 27/42
(52) U.S. Cl. .................................................. 355/53
(58) Field of Search .............................. 355/53, 67, 70, 355/71

(56) References Cited

U.S. PATENT DOCUMENTS

| 3,492,635 A | 1/1970 | Farr |
| 3,630,598 A | 12/1971 | Little |
| 3,639,039 A | 2/1972 | Rhodes, Jr. |

(List continued on next page.)

FOREIGN PATENT DOCUMENTS

| EP | A1-0 282 593 | 9/1988 |

(List continued on next page.)

OTHER PUBLICATIONS

"Illuminator Modification of an Optical Aligner" by Delmer L. Fehrs et al., KTI Microelectronics Seminar, Nov. 6–7, 1989.

(List continued on next page.)

*Primary Examiner*—Fred L Braun
(74) *Attorney, Agent, or Firm*—Oliff & Berridge PLC

(57) ABSTRACT

An exposure method of exposing a mask pattern having linear features in orthogonal first and second directions onto an object including the steps of disposing a diffraction optical element that diffracts light in different directions from an optical axis of the illumination optical system between the light source and an optical integrator in the illumination optical system; distributing the diffracted light at regions apart from the optical axis on a predetermined plane substantially conjugate with a pupil plane of the projection optical system to form on the predetermined plane an intensity distribution having increased intensity portions relative to a portion on first and second axes defined to intersect each other at the optical axis along the first and second directions; and projecting the illuminated pattern having the intensity distribution onto the object.

48 Claims, 24 Drawing Sheets

U.S. PATENT DOCUMENTS

| | | |
|---|---|---|
| 3,658,420 A | 4/1972 | Axelrod |
| 3,729,252 A | 4/1973 | Nelson |
| 3,770,340 A | 11/1973 | Cronin et al. |
| 3,776,633 A | 12/1973 | Frosch et al. |
| 4,132,479 A | 1/1979 | Dubroeucq et al. |
| 4,179,708 A | 12/1979 | Sheng et al. |
| 4,207,370 A | 6/1980 | Liu |
| 4,241,389 A | 12/1980 | Heimer |
| 4,249,793 A | 2/1981 | Uehara |
| 4,275,288 A | 6/1981 | Makosch et al. |
| 4,291,938 A | 9/1981 | Wagner |
| 4,370,026 A | 1/1983 | Dubroeucq et al. |
| 4,370,034 A | 1/1983 | Nohda |
| 4,389,701 A | 6/1983 | Phillips |
| 4,472,023 A | 9/1984 | Yamamoto |
| 4,476,519 A | 10/1984 | Hayamizu |
| 4,497,013 A | 1/1985 | Ohta |
| 4,497,015 A | 1/1985 | Konno et al. |
| 4,498,742 A | 2/1985 | Uehara |
| 4,547,037 A | 10/1985 | Case |
| 4,566,765 A | 1/1986 | Miyauchi et al. |
| 4,585,315 A | 4/1986 | Sincerbox et al. |
| 4,619,508 A | 10/1986 | Shibuya et al. |
| 4,637,691 A | 1/1987 | Uehara et al. |
| 4,668,077 A | 5/1987 | Tanaka |
| 4,739,373 A | 4/1988 | Nishi et al. |
| 4,749,278 A | 6/1988 | van der Werf |
| 4,769,750 A | 9/1988 | Matsumoto et al. |
| 4,778,275 A | 10/1988 | van den Brink et al. |
| 4,780,747 A | 10/1988 | Suzuki et al. |
| 4,780,749 A | 10/1988 | Schulman |
| 4,789,222 A | 12/1988 | Ota et al. |
| 4,814,829 A | 3/1989 | Kosugi et al. |
| 4,828,392 A | 5/1989 | Nomura et al. |
| 4,841,341 A | 6/1989 | Ogawa et al. |
| 4,851,882 A | 7/1989 | Takahashi et al. |
| 4,851,978 A | 7/1989 | Ichihara |
| 4,853,756 A | 8/1989 | Matsuki |
| 4,854,669 A | 8/1989 | Birnbach et al. |
| 4,918,583 A | 4/1990 | Kudo et al. |
| 4,931,830 A | 6/1990 | Suwa et al. |
| 4,936,665 A | 6/1990 | Whitney |
| 4,939,630 A | 7/1990 | Kikuchi et al. |
| 4,947,413 A | 8/1990 | Jewell et al. |
| 4,952,815 A | 8/1990 | Nishi |
| 4,970,546 A | 11/1990 | Suzuki et al. |
| 4,974,919 A | 12/1990 | Muraki et al. |
| 4,988,188 A | 1/1991 | Ohta |
| 4,992,825 A | 2/1991 | Fukuda et al. |
| 5,004,348 A | 4/1991 | Magome |
| 5,016,149 A | 5/1991 | Tanaka et al. |
| 5,048,926 A | 9/1991 | Tanimoto |
| 5,091,744 A | 2/1992 | Omata |
| 5,098,184 A | 3/1992 | van den Brandt et al. |
| 5,121,160 A | 6/1992 | Sano et al. |
| 5,153,419 A | 10/1992 | Takahashi |
| 5,153,773 A | 10/1992 | Muraki et al. |
| 5,191,374 A | 3/1993 | Hazama et al. |
| 5,208,629 A | 5/1993 | Matsuo et al. |
| 5,237,367 A | 8/1993 | Kudo |
| 5,245,384 A | 9/1993 | Mori |
| 5,264,898 A | 11/1993 | Kamon et al. |
| 5,286,963 A | 2/1994 | Torigoe |
| 5,300,971 A | 4/1994 | Kudo |
| 5,305,054 A | 4/1994 | Suzuki et al. |
| 5,307,207 A | 4/1994 | Ichihara |
| 5,309,198 A | 5/1994 | Nakagawa |
| RE34,634 E | 6/1994 | Konno et al. |
| 5,329,336 A | 7/1994 | Hirano et al. |
| 5,337,097 A | 8/1994 | Suzuki et al. |
| 5,392,094 A | 2/1995 | Kudo |
| 5,440,426 A | 8/1995 | Sandstrom |
| 5,446,587 A | 8/1995 | Kang et al. |
| 5,463,497 A | 10/1995 | Muraki et al. |
| 5,638,211 A | 6/1997 | Shiraishi |
| 5,673,102 A | 9/1997 | Suzuki et al. |

FOREIGN PATENT DOCUMENTS

| | | |
|---|---|---|
| EP | A2-0 346 844 | 12/1989 |
| EP | A2-0 352 975 | 1/1990 |
| GB | 1137243 | 12/1968 |
| JP | A-56-12615 | 2/1981 |
| JP | A-58-16214 | 1/1983 |
| JP | A-59-49514 | 3/1984 |
| JP | 59-83165 | 5/1984 |
| JP | A-61-41150 | 2/1986 |
| JP | A-61-91662 | 5/1986 |
| JP | A-1-295215 | 11/1989 |
| JP | A-2-50417 | 2/1990 |
| JP | B2-2-48090 | 10/1990 |
| WO | WO 88/08932 | 11/1988 |

OTHER PUBLICATIONS

"Pattern Recognition Automatic Fine Alignment" by D.H. Berry, Proc SPIE vol. 334, pp. 10–16 (1982).

IBM Technical Disclosure Bulletin, vol. 32, No. 1, "Extended Focal Depth Optical Microlithography", Jun. 1989, pp. 125–127.

Optical Engineering, vol. 12, No. 2, Mar./Apr. 1973, "Dynamic Coherent Optical System", David J. Cronin et al., p. 50–55.

Optical Engineering, vol. 26, No. 4, Apr. 1987, "Excimer laser based lithography: a deep–ultraviolet wafer stepper for VLSI processing", Victor POL et al., p. 311–318.

SPIE vol. 1264 Optical/Laser Microlithography III (1990), "Effect of central obscuration on image formation in projection lithography", S.T. Yang et al., p. 477–485.

SPIE vol. 1674 Optical/Laser Microlithography V (1992), "New imaging technique for 64M–DRAM", Naomasa Shiraishi et al., p. 741–752.

SPIE vol. 633 Optical Microlithography V (1986), "A concept for a high resolution Optical Lithographic System for Producing one–half Micron Linewidth", George O. Reynolds, p. 228–238.

"On the use of an illumination azimuth diaphragm during coaxial dark field illumination", A. Szegvari et al., 1923, p. 1–11.

Charles C. Thomas, Publisher, Springfield, IL, (1958) "The practical use of the microscope, including photomicrography", George H. Needham, chapter XX, pp. 315–327; and p. 97.

W.H. Freeman and Company, Publisher, San Francisco 1958, "Concepts of classical optics", John Strong, Appendix K, The wave theory of microscopic image formation by F. Zernike, pp. 525–536.

SPIE vol. 1674 Optical/Laser Microlithography V (1992), "Subhalf micron lithography system with phase–shifting effect", Miyoko Noguchi et al., p. 92–104.

Microelectronic Engineering 11 (1990), Elsevier Science Publishers B.V., "Heterodyne holographic nanometer alignment for a wafer stepper", N. Nomura et al., p. 133–136.

J. Vac. Sci. Technol. B 10(6), Nov./Dec. 1992, "Investigation of single sideband optical lithography using oblique incidence illumination", Emi Tamechika et al., p. 3027–3031.

"Resolution improvement with annular illumination" May 15, 1992, Keiichiro Tounai et al., 11 pages.

IEEE 1992, "Characterization of super-resolution photolithography", H. Fukuda et al., p. 49–52.

Jpn. J. Appl. Phys. vol. 31 (1992), Part 1, No. 12B, Dec. 1992, "A new pupil filter for annular illumination in optical lithography", Hiroshi Fukuda et al., p. 4126–4130.

Elsevier, PWN—Polish Scientific Publishers, 1988, "Advanced light microscopy", vol. 1, Principles and Basic Properties, Maksymilian PLUTA, p. 460–463.

Microscope Publications, Ltd. 1974, "The optical performance of the light microscope, physical optical aspects of image formation", H. Wolfgang Zieler, p. 32–55.

Marcel Dekker, Inc., New York, Basel, Microlithography, Science and technology, (1998) Chapter 2, "Optical Lithography Modeling", Chris A. Mack, p. 109–270.

McGraw–Hill Book Company, San Francisco, Introduction to Fourier Optics, (1968) Chapter 6, Frequency Analysis of optical imaging systems, Joseph W. Goodman, p. 101–197.

Elsevier, PWN–Polish Scientific Publishers 1989, Advanced Light Microscopy, vol. 2, Specialized Methods, Maksymilian PLUTA, p. 100–113.

J. Vac. Sci. Technol. B 9(6), Nov./Dec. 1991, "Improving projection lithography image illumination by using sources far from the optical axis", Satoru Asai et al., p. 2788–2791.

North–Holland Publishing Company, 1980, Chapter 2, "Optical methods for fine line lithography", B.J. Lin, p. 107–232.

Lens aberration measurement technique using attenuated phase–shifting mask, Akira Imai et al., Device Development Center, Hitachi Ltd., 1998.

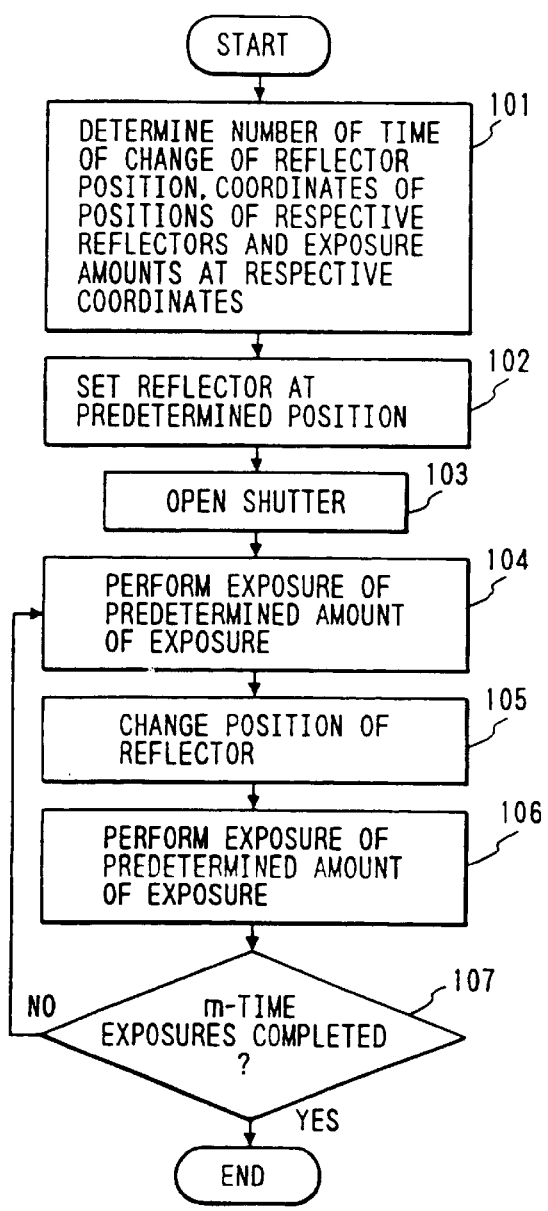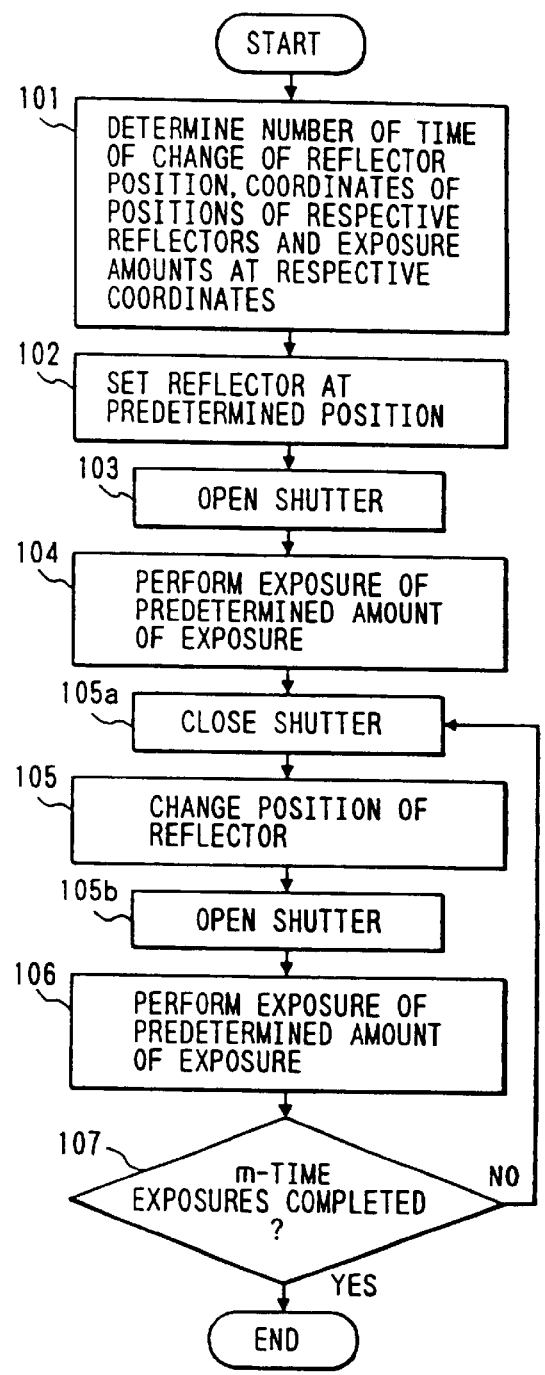

PROJECTION EXPOSURE METHODS USING DIFRACTED LIGHT WITH INCREASED INTENSITY PORTIONS SPACED FROM THE OPTICAL AXIS

This is a Continuation of Application Ser. No. 09/960,952 filed Sep. 25, 2001, now abandoned, which in turn is a Continuation of Application Ser. No. 09/163,166 filed Sep. 30, 1998, now abandoned, which in turn is a Divisional of Application Ser. No. 08/376,676, filed Jan. 20, 1995, which is a Continuation of Application No. 08/122,318 filed Sep. 17, 1993, now abandoned, which is a Continuation of Application Ser. No. 07/791,138 filed Nov. 13, 1991, now abandoned. In addition, Application Ser. No. 08/376,676 also is a Continuation-In-Part of Application Ser. No. 08/257,956 filed Jun. 10, 1994 (now U.S. Pat. No 5,638,211, which in turn is a Continuation of Application Ser. No. 08/101,674 filed Aug. 4, 1993, now abandoned, which is a Continuation of Application Ser. No. 07/847,030 filed Apr. 15, 1992, now abandoned, filed as PCT/JP91/01103 on Aug. 19, 1991. The entire disclosure of the prior applications is hereby incorporated by reference herein in its entirety.

BACKGROUND OF THE INVENTION

1. Field of the Invention

The present invention is directed generally to an exposure method and an exposure apparatus, and more particularly, to a projection exposure method and a projection exposure apparatus which are employed in a lithography process for liquid crystal elements and semiconductor memory cells having regular hyperfine patterns.

2. Related Background Art

A method of transferring mask patterns on a substrate typically by the photolithography method is adopted in manufacturing semiconductor memories and liquid crystal elements. In this case, the illumination light such as ultra-violet rays for exposure strikes on the substrate having its surface formed with a photosensitive resist layer through a mask formed with the mask patterns. The mask patterns are thereby photo-transferred on the substrate.

The typical hyperfine mask patterns of the semiconductor memory and the liquid crystal element can be conceived as regular grating patterns arrayed vertically or horizontally at equal spacings. Formed, in other words, in the densest pattern region in this type of mask patterns are the grating patterns in which equally-spaced transparent lines and opaque lines, formable on the substrate, for attaining the minimum line width are arrayed alternately in X and/or Y directions. On the other hand, the patterns having a relatively moderate degree of fineness are formed in other regions. In any case, the oblique patterns are exceptional.

Besides, a typical material for the photosensitive resist exhibits a non-linear photosensitive property. A chemical variation thereof quickly advances on giving an acceptance quantity greater than a certain level. If smaller than this level, however, no chemical variation advances. Hence, there exists a background wherein if a difference in light quantity between a light portion and a shade portion is sufficiently secured with respect to a mask pattern projected image on the substrate, a desired resist image according to the mask patterns can be obtained even when a boundary contrast between the light portion and the shade portion is somewhat low.

In recent years, a projection exposure apparatus such as a stepper, etc. for transferring the mask pattern on the substrate by reductive projection has been often employed with a hyperfiner pattern construction of the semiconductor memory and the liquid crystal element. Special ultra-violet rays having a shorter wavelength a narrower wavelength distributing width are employed as illumination light for exposure. The reason why the wavelength distribution width is herein narrowed lies in a purpose for eliminating a deterioration in quantity of the projected image due to a chromatic aberration of the projection optical system of the projection exposure apparatus. The reason why the shorter wavelength is selected lies in a purpose for improving the contrast of the projected image. Shortening of the wavelength of the illumination light induces a limit in terms of constraints of lens materials and resist materials in addition to the fact that no appropriate light source exists for the much hyperfiner mask patterns required, e.g., for the projection exposure of line widths on the submicron order. This is the real situation.

In the hyperfine mask patterns, a required value of the pattern resolution line width is approximate to the wavelength of the illumination light. Hence, it is impossible to ignore influences of diffracted light generated when the illumination light penetrates the mask patterns. It is also difficult to secure a sufficicinet light-and-shade contrast of the mask pattern projected image on the substrate. In particular, the light-and-shade contrast at the pattern line edges remarkably declines.

More specifically, respective diffracted light components a 0th-order diffracted light component, (±) primary diffracted light components and those greater than (±) secondary diffracted light components that are generated at respective points on the mask patterns due to the illumination light incident on the mask from above-pass through the projection optical system. These light components are converged again at the respective points on the substrate conjugate these points, thereby forming the image. However, the (±) primary diffracted light components and those larger than the (±) secondary diffracted light components have a much larger diffraction angle than that of the 0th-order diffracted light component with respect to the hyperfiner mask patterns and are therefore incident on the substrate at a shallower angle. As a result, a focal depth of the projected image outstandingly decreases. This causes such a problem that a sufficient exposure energy can not be supplied only to some portions corresponding to a part of thickness of the resist layer.

It is therefore required to selectively use the exposure light source having a shorter wavelength or the projection optical system having a larger numerical aperture in order to transfer the hyperfiner patterns. As a matter of course, a strive for optimizing both of the wavelength and the numerical aperture can be also considered. Proposed in Japanese Patent Publication No. 62-50811 was a so-called phase shift reticle in which a phase of the transmitted light from a specific portion among the transmissive portions of reticle circuit patterns deviates by $\pi$ from a phase of the transmitted light from other transmissive portions. When using this phase shift reticle, the patterns which are hyperfiner than in the prior art are transferable.

In the conventional exposure apparatus, however, it is presently difficult to provide the illumination light source with a shorter wavelength (e.g., 200 nm or under) than the present one for the reason that there exists no appropriate optical material usable for the transmission optical member.

The numerical aperture of the projection optical system is already approximate to the theoretical limit at the present time, and a much larger numerical aperture can not be probably expected.

Even if the much larger numerical aperture than at present is attainable, a focal depth expressed by $\pm\lambda/2NA^2$ is abruptly reduced with an increase of the numerical aperture. There goes conspicuous the problem that the focal depth needed for an actual use becomes smaller and smaller. On the other hand, a good number of problems inherent in the phase shift reticle, wherein the costs increase with more complicated manufacturing steps thereof, and the inspecting and modifying methods are not yet established.

Disclosed, on the other hand, in U.S. Pat. No. 4,947,413 granted to T. E. Jewell et al is the projection lithography method by which a high contrast pattern projected image is formed with a high resolving power on the substrate by making the 0th-order diffracted light component coming from the mask patterns and only one of the (+) and (−) primary diffracted light components possible of interference by utilizing a spatial filter processing within the Fourier transform surface in the projection optical system by use of an off-axis illumination light source. Based on this method, however, the illumination light source has to be off-axis-disposed obliquely to the mask. Besides, the 0th-order diffracted light component is merely interfered with only one of the (+) and (−) primary diffracted light components. Therefore, the light-and-shade contrast of edges of the pattern image is not yet sufficient, the image being obtained by the interference due to unbalance in terms of a light quantity difference between the 0th-order diffracted light component and the primary diffracted light component.

SUMMARY OF THE INVENTION

It is a primary object of the present invention, which has been devised in the light of the foregoing problems, to attain the exposure with a high resolving power and large focal depth even when using an ordinary reticle by making the illumination light incident on a mask at a predetermined angle inclined to the optical axis of an illumination optical axis or a projection optical system, providing a member for making the illumination light incident obliquely on the mask in the illumination optical system and illuminating the mask without any loss in light quantity.

It is another object of the present invention to provide such an arrangement that passage positions of a 0th-order diffracted light component and (±) primary diffracted light components within a Fourier transfer surface for mask patterns in the projection optical system are set as arbitrary positions symmetric with respect to the optical axis of the projection optical system.

To accomplish the objects described above, according to one aspect of the present invention, there is provided, in the illumination optical system, a luminous flux distributing member such as a prism, etc. for distributing the illumination light into at least four luminous fluxes penetrating only a predetermined region on the Fourier transform surface for the mask patterns.

According to another aspect of the present invention, there is provided a movable optical member such as a movable mirror or the like in the illumination optical system to concentrate the luminous fluxes in predetermined positions on the Fourier transform surface for the mask patterns. The movable optical member is drivable to cause at least two beams of illumination light to pass through only the predetermined region on the Fourier transform surface with time differences from each other.

According to still another aspect of the present invention, there are provided the luminous flux distributing member or the movable optical member between an optical integrator such as a fly eye lens, etc. and the mask or between the light source and the optical integrator.

According to a further aspect of the present invention, the optical integrator is divided into a plurality of optical integrator groups which are set in discrete positions eccentric from the optical axis. At the same time, the illumination light is focused on the plurality of optical integrator groups, respectively.

According to still a further aspect of the present invention, the luminous flux distributing member is movable and exchangeable. The position in which the luminous flux passes above the Fourier transform surface for the mask patterns is arbitrarily set.

According to yet another aspect of the present invention, in a method of effecting the exposure while deviating a substrate position in the optical-axis direction of the projection optical system from an image forming surface of the mask patterns, the exposure is performed by making the illumination light incident on the mask at an inclined angle.

In accordance with the present invention, it is possible to actualize a projection type exposure apparatus exhibiting a higher resolving power and larger focal depth than in the prior art even by employing the ordinary reticle. Further, although the effect of improving the resolving power competes with a phase shifter, the conventional photo mask can be used as it is. It is also feasible to follow the conventional photo mask inspecting technique as it is. Besides, when adopting the phase shifter, the effect of increasing the focal depth is obtained, but it is hard to undergo influences of a wavefront aberration due to defocus even in the present invention. For this reason, a large focal depth (focal tolerance) is obtained.

Other objects and advantages of the present invention will become apparent during the following discussion taken in conjunction with the accompanying drawings.

BRIEF DESCRIPTION OF THE DRAWINGS

FIGS. 19A and 19B are flowcharts showing an exposure method in the second embodiment of the present invention;

DETAILED DESCRIPTION OF THE PREFERRED EMBODIMENTS

Figure 1:
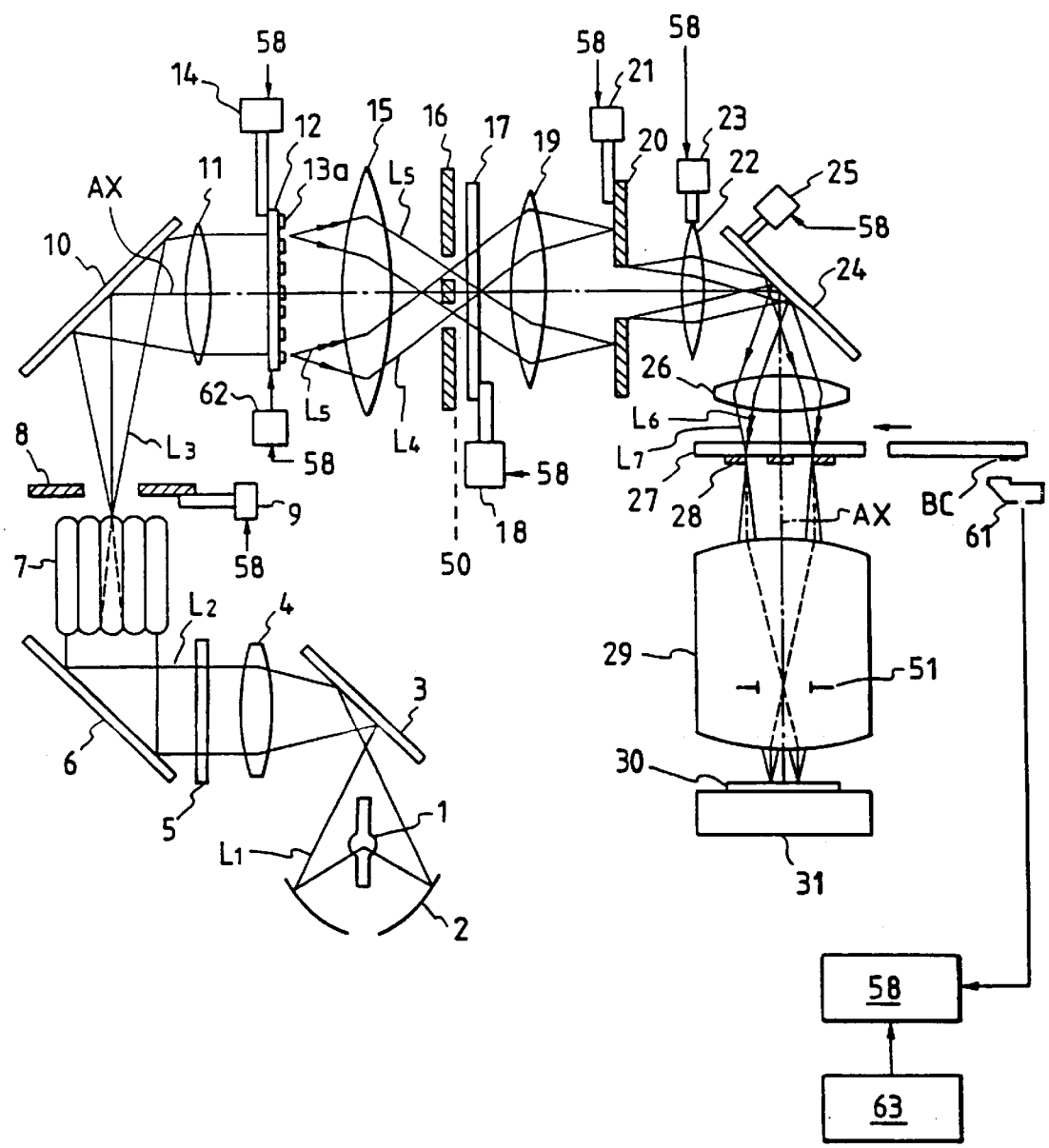
FIG. 1 is a view schematically illustrating a projection type exposure apparatus in a first embodiment of the present invention.

Embodiments of the present invention will hereinafter be described in detail with reference to the accompanying drawings. FIG. 1 is a block diagram illustrating a whole projection type exposure apparatus in accordance with a first embodiment of the present invention. A luminous flux L1 emitted from an exposure light source 1 such a mercury lamp or the like and converged by an elliptical mirror 2 is reflected by a mirror 3. The luminous flux reflected by the mirror 3 passes through a relay lens 4 and is monochromatized by a wavelength selection element 5. A monochromatized luminous flux L2 is refracted by a mirror 6 and is incident on a fly eye lens 7. At this moment, an incident surface of the fly eye lens 7 is provided in a position substantially conjugate to reticle patterns 28. An exit surface of the fly eye lens 7 is formed on a Fourier transform corresponding surface (Fourier transform surface) of the reticle patterns 28 or in the vicinity of this surface. An aperture stop 8 is provided in close proximity to the exit surface of the fly eye lens 7. A numerical aperture of illumination light L3 is determined by a drive unit 9 for making variable a size of an opening of the aperture stop 8. The illumination light L3 is reflected by a mirror 10. Illuminated with the illumination light through a condenser lens 11 is a diffraction grating pattern plate (light transmissive flat plate) 12 incised with diffraction grating patterns 13a. This diffraction grating pattern plate 12 functions as a luminous flux distribution member in the present invention. This plate 12 is attachable/detachable and interchangeable. At this time, the diffraction rating pattern plate 12 is provided on a surface substantially conjugate to the hyperfine reticle pattern surfaces 28 formed on a reticle 7. The reticle patterns 28 may be herein isolated patterns or patterns having a periodic structure.

As described above, an optical integrator such as the fly eye lens and fibers is used in an illumination optical system for illuminating the reticle with the light. Uniformed is an intensity distribution of the illumination light with which the reticle is illuminated. In the case of employing the fly eye lens to optically effect this homogenizing process, a reticle side focal surface and a reticle surface are linked based substantially on a relation of Fourier transform. The reticle side focal surface and a light source side focal surface are also linked based the relation of Fourier transform. Hence, the pattern surface of the reticle and the light source side focal surface (precisely the light source side focal surface of each individual lens element of the fly eye lens) are linked based on an image forming relation (conjugate relation). For this reason, on the reticle, the illumination beams from the respective elements (secondary illuminant image) of the fly eye lens are added (overlapped) and thereby averaged. An illuminance homogeneity on the reticle can be thus enhanced.

Figure 2:
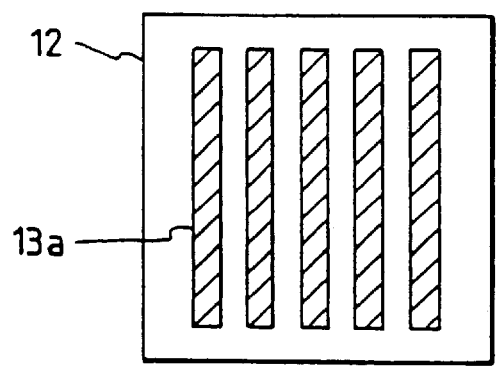
FIG. 2 is a view depicting a light transmissive substrate (luminous flux distributing member) including patterns of periodic structure in the first embodiment of the present invention.

FIG. 2 is a plan view showing one example of the diffraction grating pattern plate.

The diffraction grating pattern plate 12 is a transparent substrate of fused quartz or the like and is formed with the diffraction grating pattern 13a. The diffraction grating patterns 13a are conceived as line-and-space patterns formed of a flare metal thin film of Cr and the like. Note that at this time, a pitch Pg of the diffraction grating patterns 13a are desirably substantially given by Pg=2Pr×M (m is the magnification of image formation between the diffraction grating pattern 13a and the reticle patterns 28) with respect to a pitch Pr of the reticle patterns 28. A duty thereof is not necessarily 1:1 but may be arbitrary.

Now, returning to the description of FIG. 1, (−) primary diffracted light L4 and (+) primary diffracted light L5 generated by the diffraction grating pattern plate 12 are separated from each other by a condenser lens 15 on a Fourier transform surface 50 in the illumination optical system. The beams of light are then condensed in a position eccentric from the optical axis of the illumination optical system (or a projection optical system (29)). The positions through which the beams of (±) primary diffracted light L4, L5 pass above the Fourier transform surface are symmetric with respect to an optical axis AX. A spatial filter 16 is provided on the Fourier transform surface or on a surface in the vicinity of the Fourier transform surface. Light transmissive positions (openings) are provided in such positions as to transmit only the beams of diffracted light ((±) primary diffracted light L4, L5 in this embodiment) of the specific order among the beams of diffracted light generated from the diffraction grating patterns 13a. Note that this spatial filter 16 may be such a variable type filter as to make variable a position and a configuration of the transmissive portion or may be a filter of such a type that the spatial filter 16 itself is attachable/detachable and interchangeable. The spatial filter 16 is preferably provided with, when the 0th-order diffracted light is generated from the diffraction grating pattern 13a, a Cr thin film having a size enough to shield the 0th-order diffracted light. Beams of light of unnecessary orders can be also shielded.

Figure 3:
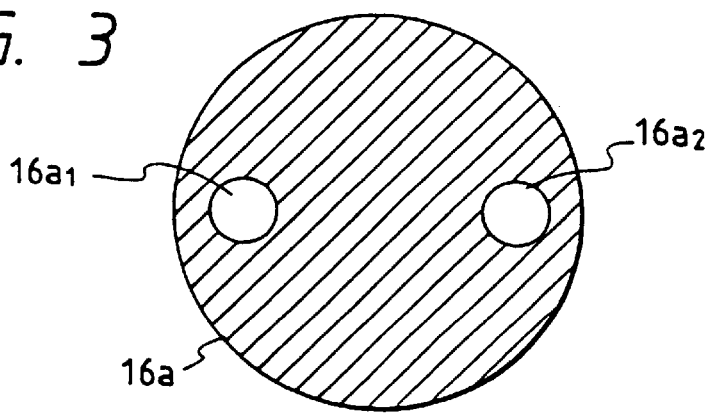
FIG. 3 is a view depicting a spatial filter corresponding to the patterns shown in FIG. 2.

FIG. 3 depicts a spatial filter 16a suitable when using the diffraction grating patterns 13a shown in FIG. 2. An oblique line portion indicates a light shielding portion. A radius of the spatial filter 16a is set greater than a total numerical aperture of the illumination optical system. Two light transmissive portions (openings) 16a1, 16a2 are provided in portions symmetric with respect to the central point of the spatial filter 16a.

An intensity distribution (positions of luminous fluxes) on the Fourier transform surface of the illumination optical system required differs depending on the directivity of the reticle pattern 28. It is, however, desirable that the directivity of the diffraction grating patterns 13a be equal to the directivity of the reticle patterns 28. In this case, it is not necessary that the directivities be identical. The directivity of the diffraction grating patterns 13a projected on the reticle pattern 28 may be coincident with a large proportion of the directivity of the reticle patterns 28. To implement these requirements, intrinsic diffraction grating patterns determined for the respective reticle patterns 28 are incised in individual diffraction rating pattern plates. Simultaneously when replacing a reticle 27, the reticle 27 may be replaced while matching it with the diffraction grating pattern plate.

The diffraction grating patterns 13a are determined by the pitch or line width and the directivity of the reticle patterns 28. Hence, the same diffraction grating patterns plate may be used in common to a plurality of reticles having patterns in which the pitches, line widths and the directivities are substantially equal.

If the directivities of the plurality of retircles are different, they may be made coincident with the directivities of the patterns on the respective reticles by rotating the diffraction grating pattern plate 12 within a plate vertical to the optical axis. Further, if the diffraction grating pattern plate 12 is rotatable (through, e.g., 90°), a correspondence can be given to such a case that the line-and-space pattern directions of the reticle patterns 13a are different from directions x, y.

The relay lens 15 is set as a zoom lens (afocal zoom expander and the like) composed of a plurality of lens elements, wherein a condensing distance is variable by changing a focal distance. In this case, however, the conjugate relation between the diffraction grating pattern plate 12 and the reticle 27 should be kept. Further, an image of the pattern 13a may be rotated by use of an image rotator.

For instance, the diffraction grating patterns 13a may be employed in a state of being rotated about the optical axis of the illumination optical system to obtain an arbitrary angle in accordance with the directivity of the reticle patterns 28.

Now, as illustrated in FIG. 1, the luminous fluxes L4, L5 passing through the spatial filter 16 are led to a reticle blind 20 via a condenser lens 19. The reticle blind 20 is provided on a surface substantially conjugate to the reticle pattern surfaces 28 and is a field stop for illuminating only the specific area on the reticle 27 with the light. This reticle blind 20 has an aperture openable and closable, with the aid of a drive system 21 and is capable of adjusting a size of the illumination area on the reticle 27. The reticle 27 is illuminated with luminous fluxes L6, L7 passing through the reticle blind 20 through condenser lenses 22, 26 and a mirror 24 disposed substantially in the vicinity of the Fourier transform surface. The luminous fluxes L6, L7 are incident on the reticle patterns 28. The beams of diffracted light generated from the reticle patterns 28 are condensed to form an image on a wafer 30 by means of a projection optical system 29. The wafer 30 is two-dimensionally movable within the plane vertical to the optical axis. The wafer 30 is placed on a wafer stage 31 movable in the optical-axis direction.

Figure 40:
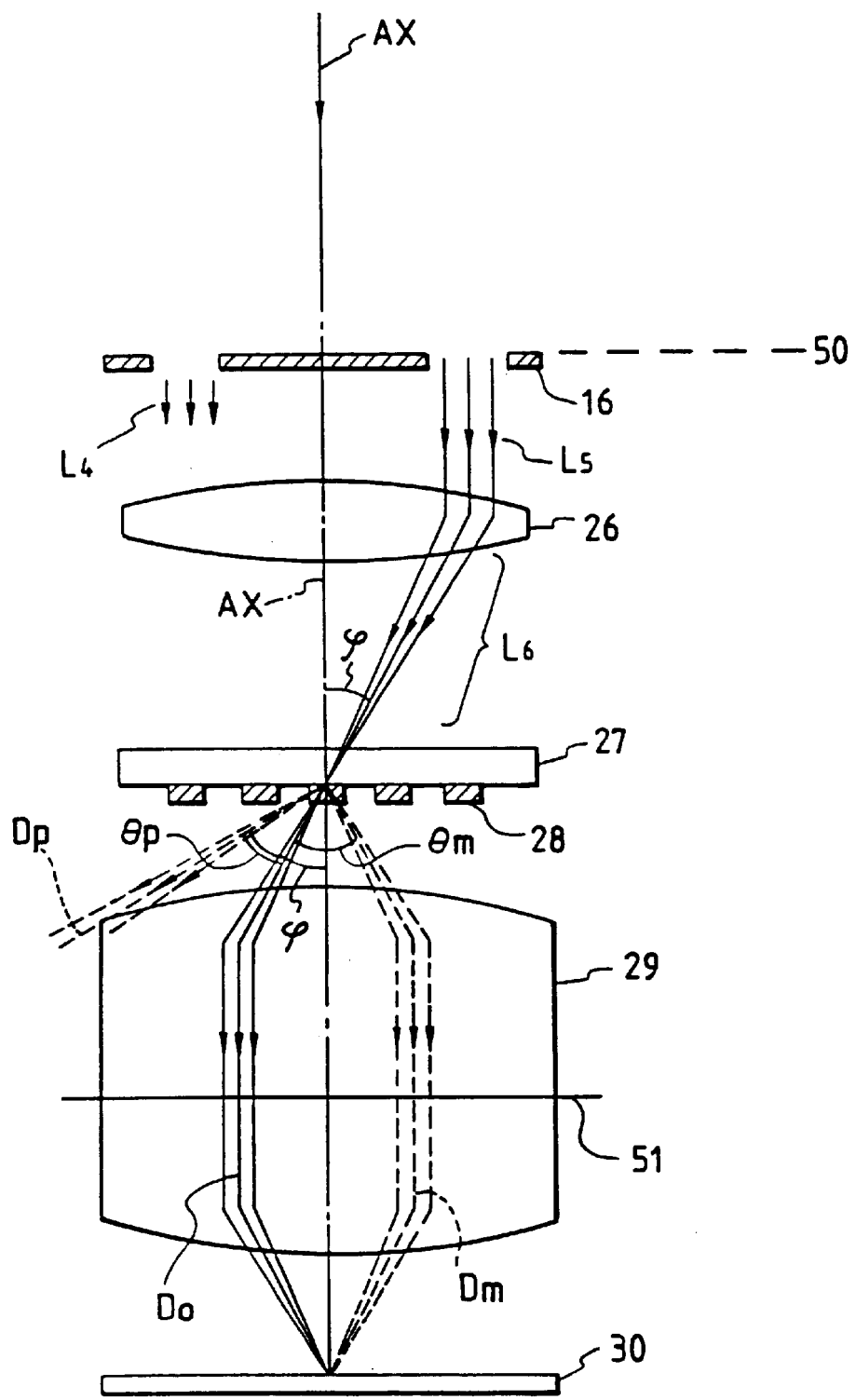
FIG. 40 is a view schematically showing a fundamental construction of a light path in the first embodiment of the present invention.

FIG. 40 schematically illustrates a fundamental configuration of light paths for illumination beams in an exposure apparatus in this embodiment. Referring to FIG. 40, the light transmissive portion (opening) 16a of the spatial filter 16 is disposed in a position eccentric from the optical axis AX of the projection optical system or the illumination optical system on the Fourier transform surface. A coordinate position of the luminous fluxes passing through the Fourier transform surface is eccentric from the optical axis AX.

Now, the illumination light L5 emitted from the exit portion 16a of the spatial filter 16 is incident on the reticle 27 via the condenser lens 26. The reticle patterns 28 depicted on the reticle (mask) 27 typically contain a large number of periodic patterns. Therefore, a 0th-order diffracted light component D0, (±) primary diffracted light components Dp, Dm and higher-order diffracted light components are generated in directions corresponding to degrees of fineness of the patterns from the reticle patterns 28 illuminated with the light. At this moment, the illumination luminous fluxes (central line) are incident on the reticle 27 at an inclined angle. Hence, the diffracted light component of the respective orders are also generated from the reticle patterns 28 with an inclination (angular deviation) as compared with the vertical illumination. The illumination light L6 shown in FIG. 40 is incident on the reticle 27 with an inclination Φ to the optical axis.

The illumination light L6 is diffracted by the reticle patterns 28, thereby generating a 0th-order diffracted light component Do traveling in a direction with the inclination Φ to the optical axis AX, a (+) primary diffracted light component Dp with an inclination θp to the 0th-order diffracted light component and a (−) primary diffracted light component Dm traveling with an inclination θm to the 0th-order diffracted light component Do. The illumination light L6 is, however, incident on the reticle patterns at the inclined angle Φ to the optical axis AX of the projection optical system 29 both sides of which are telecentric. For this reason, the 0th-order diffracted light component Do also travels in the direction inclined at the angle Φ to the optical axis AX of the projection optical system.

Hence, the (+) primary diffracted light component Dp travels in a direction of (θp+Φ) to the optical axis AX, while the (−) primary diffracted light component Dm goes in a direction of (θm−Φ) to the optical axis AX.

At this time, the diffracted angles Op, Om are expressed such as:

$$\sin(\theta p + \Phi) - \sin \Phi = \lambda/P \tag{1}$$

$$\sin(\theta m - \Phi) + \sin \Phi = \lambda/P \tag{2}$$

where it is assumed that both of the (+) primary diffracted light component Dp and (−) primary diffracted light component Dm penetrate a pupil surface (the Fourier transform surface of the reticle patterns) 51 of the projection optical system 29.

When the diffracted angle increases with finer reticle patterns 28, the (+) primary diffracted light component Dp traveling in the direction inclined at the angle of ($\theta$p+$\Phi$) at first becomes incapable of penetrating the pupil surface 51 of the projection optical system 29. Namely, there is developed a relation such as sin ($\theta$p+$\Phi$)>$NA_R$. A beam of illumination light L131 is incident with an inclination to the optical axis AX, and hence the (−) primary diffracted light component Dm is capable of incidence on the projection optical system 29 even at the diffracted angle of this time. Namely, there is developed a relation such as sin ($\theta$m−$\Phi$) <$NA_R$.

Produced consequently on the wafer 30 are interference fringes by two luminous fluxes of the 0th-order diffracted light component Do and the (−) primary diffracted light component Dm. The interference fringes are conceived as an image of the reticle patterns 28. A contrast of approximately 90% is obtained when the reticle patterns 28 have a line-and-space of 1:1, and patterning of the image of the reticle patterns 28 can be effected on a resist applied over the wafer 30.

A resolving limit at this moment is given by:

$$\sin(\theta m - \Phi) = NA_R \quad (3)$$

Hence, a reticle-side pitch of the transferable minimum pattern is given by:

$$NA_R + \sin\Phi = \lambda/P$$

$$P = \lambda/(NA_R + \sin\Phi) \quad (4)$$

Now, supposing that sin $\Phi$ is set to approximately 0.5× $NA_R$ as one example, the minimum pitch of the pattern on the transferable reticle is given by:

$$P = \lambda/(NA_R + 0.5 NA_R) \quad (5)$$
$$= 2\lambda/3 NA_R$$

On the other hand, in the case of a known projection exposure apparatus in which a distribution of illumination light on the pupil surface 51 of the Fourier transform surface falls within a circular range (rectangular range) about the optical axis AX, the resolving limit is expressed by sin $\theta$m=$\lambda$/P≅$NA_R$. The minimum pitch is given by P≅$\lambda$/$NA_R$. It can be therefore understood that the projection type exposure apparatus in this embodiment attains a higher resolving power than in the known exposure apparatus.

The following is an elucidation about why a focal depth becomes large on the basis of a method of forming image forming patterns on the wafer by use of the 0th-order diffracted light component and the primary diffracted light component while the reticle patterns are irradiated with the exposure light in a specific incident direction at a specific incident angle.

As illustrated in FIG. 40, when the wafer 30 is coincident with the focal position (the best image forming surface) of the projection optical system 29, all the individual diffracted light components emerging from one point of the reticle patterns 28 and reaching one point on the wafer 30, even if they pass through any part of the projection optical system 29, have an equal length of light path. For this reason, even when the 0th-order diffracted light component penetrates substantially the center (in the vicinity of the optical axis) of the pupil surface 51 of the projection optical system 29, the 0oth-order diffracted light component and other diffracted light components are equal in terms of lengths of their light paths, and a mutual wavefront aberration is zero. When the wafer 30 is in a defocus state (the wafer 30 does not coincide with the focal position of the projection optical system 29), however, the lengths of the high-order diffracted light components obliquely falling thereon are short in front of the focal point as compared with the 0th-order diffracted light component passing in the 0th-order diffracted light component passing in the vicinity of the optical axis. Whereas in rear of the focal point (closer to the projection optical system 29), the lengths increases. A difference therebetween corresponds to a difference between the incident angles. Hence, the 0th-order, primary, . . . diffracted light components mutually form the wavefront aberration, resulting in creation of unsharpness in front and in rear of the position of the focal point.

The wavefront aberration caused by the defocus described above is defined as a quantity given by $\Delta F r^2 / 2$, where $\Delta F$ is the amount of deviation from the focal point position of the wafer 30, and r (r=sin $\theta$w) is the sine of an incident angle $\theta$w in the case of (−) incidence of the individual diffracted light component. (At this time, r represents a distance from the optical axis AX on the pupil surface 51.) In the conventional known projection type exposure apparatus, the 0th-order diffracted light component Do passes in the vicinity of the optical axis AX, and hence r (0th-order)=0. On the other hand, in the (±) primary diffracted light components Dp, Dm, r (primary)=M. $\lambda$/P (M is the magnification of the projection optical system).

Therefore, the wavefront aberration due to defocusing of the 0th-order diffracted light component Do and the (+) primary diffracted light components Dp, Dm is given by:

$$\Delta F \cdot M^2 (\lambda/P)^2/2$$

On the other hand, in the projection type exposure apparatus according to this invention, as illustrated in FIG. 40, the 0th-order diffracted light component Do is generated in the direction inclined at the angle $\Phi$ to the optical axis AX. Thus, the distance of the 0th-order diffracted light component from the optical axis AX on the pupil surface 51 is expressed such as r (0th-order)=M·sin $\Phi$.

Further, the distance of the (−) primary diffracted light component Dm from the optical axis on the pupil surface is expressed such as r ((−) primary) =M·sin $\Phi$($\theta$m−$\Phi$). At this time, if sin $\Phi$=sin($\theta$m−$\Phi$), a relative wavefront aberration due to defocusing of the 0th-order diffracted light component Do and the (−) primary diffracted light component Dm becomes zero. Even when the wafer 30 deviates slightly in the optical-axis direction from the position of the focal point, it follows that the unsharp image of the patterns 28 does not become larger than in the prior arts. Namely, the focal depth increases. As shown in the formula (2), sin ($\theta$m−$\Phi$)+sin $\Phi$=$\lambda$/P, and hence it is possible to remarkably increase the focal depth on condition that the incident angle $\Phi$ of the illumination luminous flux L6 to the reticle 27 is made to have a relation such as sin $\Phi$=$\lambda$/2P with respect to the patterns having the pitch P.

Herein, as discussed above, each of the luminous fluxes L6, L7 is incident on the reticle 28 at the inclined angle $\Phi$ in symmetry with respect to the optical axis of the projection optical system or the illumination optical system. Generated from the patterns 28 are the 0th-order diffracted light component Do, a (−) primary light component Dm and a (+) primary light component Dp.

The incident angle Φ is prescribed by a numerical aperture NA of the projection optical system as well as by the reticle patterns 28. As expressed in the formula (4), this incident angle is selectively set to an incident angle corresponding to the minimum value of the reticle pattern pitch. The incident direction is desirably set to a pitch array direction of the reticle patterns. The optimum conditions of the incident angle will be explained later.

Herein, as described above, the diffraction grating pattern plate 12 is disposed in the position substantially conjugate to the reticle patterns 28. The diffraction grating patterns 13a are therefore projected on the reticle patterns 28 via the illumination optical system. For this reason, a light-and-shade image assuming the diffraction grating configuration is formed on the reticle patterns 28, and the uniformity in amount of illumination light is thereby deteriorated. However, the diffraction grating pattern plate 12 incised with the diffraction grating patterns 13a is oscillated or shifted by one pitch of the diffraction grating patterns 13a or by approximately an integer multiple or greater during an exposure period (while an unillustrated shutter is opened) per shot by a drive member 14 such as a motor, a piezoelement and the like. The light-and-shade image is thereby shifted by approximately one pitch or larger during the exposure period per shot. The luminance is averaged (homogenized) in terms of time, thereby keeping well the uniformity in quantity of the illumination light. The direction in which the light-and-shade image is shifted or oscillated is preferably set to exhibit a less correlation with the direction of the diffraction-grating patterns 13a. For instance, the image is allowed to make a circular motion (synthesized with the oscillations in the directions x and y) wherein a diameter is set to a value which exceeds the pitch Pg of the patterns 13a within the plane vertical to the optical axis.

At this time, one or more optical members closer to the reticle 27 than the diffraction grating pattern plate 12 may be shifted, oscillated or allowed to make the circular motion under the same conditions within the illumination optical system in place of the diffraction grating pattern plate 12. FIG. 1 shows an example where drive members 23, 25 are attached to the condenser lens 22 and the mirror 24.

The light-and-shade image is averaged within the exposure period by giving the above-described shifting, oscillating or circular motion. The illumination light quantity on the reticle patterns 28 can be kept uniform.

There is, however, a possibility to cause unevenness in the light quantity on the reticle pattern surfaces 28 due to a dispersion in diffraction efficiency or in transmissivity within the pattern plane which is derived from a manufacturing error of the diffraction grating patterns 13a. To prevent this phenomenon, a light scattering member 17 such as a diffusion plate of a lemon skin and the like may be disposed in close proximity to the Fourier transform surface 50.

The light emerging from one point on the diffraction grating patterns 13a is scattered by the light scattering member 17 and serves for illumination over a wide area of the reticle pattern surfaces 28. In other words, the light from the wide area of the diffraction grating patterns 13a reaches one point on the reticle pattern surfaces 28. A local error in manufacture of the diffraction grating patterns 13a is relieved. At this time, the light scattering member 17 is shifted, oscillated or rotated by a motor 18 during the exposure period per shot, whereby a time averaging effect is produced. This makes it easier to eliminate the dispersion in the quantity of the illumination light.

Note that when shifting, oscillating or rotating the light scattering member 17, the optical members such as the diffraction grating pattern plate 12 or the condenser lens 22 and the mirror 24 may not be shifted, oscillated or rotated.

This light scattering member 17 provided in the vicinity of the Fourier transform surface deteriorates the image of the diffraction grating patterns 13a but does not cause extreme fluctuations in the angular range of the incident angles of the illumination light incident on the reticle pattern surface 28.

In addition, the fiber bundles may be laid leastwise larger than the spot beams on the Fourier transform surface or over the entire Fourier transform surface in place of the light scattering member 17 to deteriorate the light fluxes. Further, the effect to deteriorate the image can be enhanced by a combination with the light scattering member 17.

Incidentally, the device depicted in FIG. 1 includes: a main control system 58 for generalizing/controlling the device; a bar code reader 61 for reading bar codes BC representing the names prepared a side of the reticle patterns 28 in the course of carrying the reticle 27 just above the projection optical system 29; and a keyboard 62 for inputting commands and data from the operator. Registered beforehand in the main control system 58 are the names of a plurality of reticles dealt with by this stepper and stepper operation parameters corresponding to the respective names. The main controller system 58 outputs, when the bar code reader 61 reads the reticle bar code BC, the previously registered information on the shift and the rotation of the diffraction grating pattern plate 12 to the drive member 14 as one of the operation parameters which corresponds to that name. The optimum distribution of the light quantity can be thereby formed on the Fourier transform surface 50 in accordance with the reticle patterns on the reticle. As one of the parameters corresponding to the names of the reticles, the information on the replacement of the diffraction grating pattern plate 12 is inputted to a reticle replacing member 62. The diffraction grating pattern plate 12 optimal to the reticle patterns 28 formed on the reticle is thereby selectable. The operations discussed above are executable by the operator's inputting the commands and data directly to the main control system 58 from the keyboard 63.

Now, in order to intensify the effect of improving the resolving power in this embodiment, preferably σ=0.1 to 0.3 by adjusting the numerical aperture 8 of the illumination system. The reason for this is that the improvements of the resolving power and of the focal depth are not attainable if the value σ is too large, and whereas if too small, a fidelity declines. Hence, when an exit area of the fly eye lens 7 of the above-described illumination optical system is set to 1, it is desirable to manufacture a fly eye lens having an exit area of, e.g. 0.3 in contrast with that value. The illumination optical system from the elliptical mirror 2 to the fly eye lens 7 may preferably be constructed to maximize the light quantity with respect to σ≅0.3. In addition, the value σ may be variable by changing the width of luminous fluxes incident on the fly eye lens 7 with the lens system 4 being composed of a zoom lens (afocal zoom lens).

The foregoing positions of the respective mirror are not limited to the above-mentioned. For instance, the mirror 24 fitted with the drive member 25 may be disposed closer to the spatial filter 16 than the reticle blind 20.

Next, there will be explained a case where the reticle patterns 28 are not oriented uniformly over the entire surface of the reticle but oriented partially in different directions.

Figure 4:
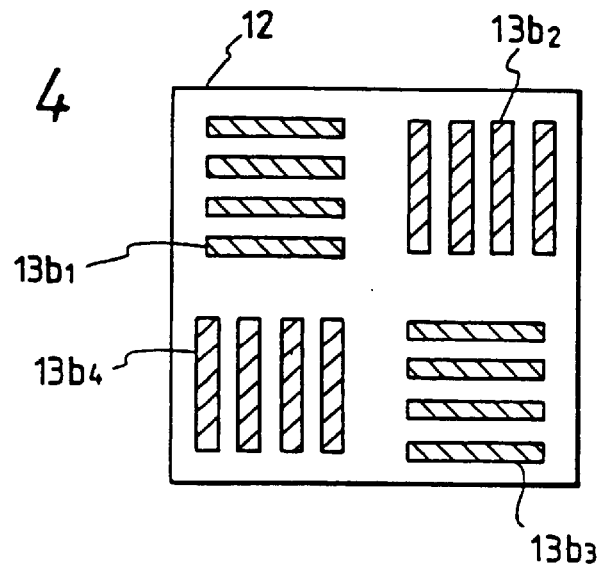
FIGS. 4 and 6 are views each showing a variant form of the periodic structural patterns in the first embodiment of the present invention.

For example, a case where the reticle patterns 28 have the periodic structure in two directions x, y will be described. Where the reticle patterns 28 have the periodic structure in the two directions x, y, there may be employed the diffraction grating pattern plate 12 formed with diffraction grating patterns 13b arrayed partially in different directions as shown in FIG. 4. Referring to FIG. 4, diffraction grating patterns 13b1, 13b3 correspond to the reticle patterns 28 having the periodic structure in the direction y. Diffraction grating patterns 13b2, 13b3 correspond to the reticle patterns 28 having the periodic structure in the direction x. At this time, the pitch array direction of the diffraction grating patterns 13b1, 13b3 is equalized to the pitch array direction of the reticle patterns 28 having the periodic structure in the direction y. The pitch array direction of the diffraction grating patterns 13b2, 13b3 is equalized to the pitch array direction of the reticle patterns 28 having the periodic structure in the direction y.

Figure 5:
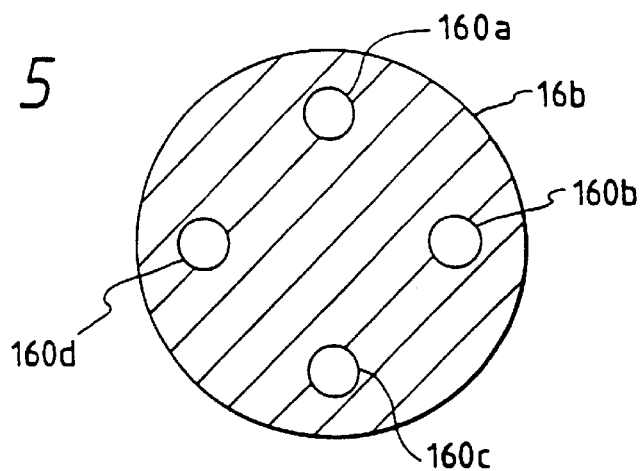
FIG. 5 is a view illustrating a spatial filter corresponding to the patterns shown in FIG. 4.

FIG. 5 is a diagram illustrating a spatial filter 16b corresponding to the diffraction grating pattern 13b depicted in FIG. 4. The spatial filter 16b includes light transmissive portions (openings) 160a, 160b, 160c, 160d. The oblique line portion indicates a light shielding portion. The light transmissive portions 160a, 160c transmit the diffracted light generated from the diffraction grating patterns 13b1, 13b3. A spacing between the light transmissive portions 160a, 160b is determined by a pitch of the diffraction grating patterns 13b1, 13b3. A direction and an angle of the diffracted light incident on the reticle patterns are determined by positions of the beams of refracted light at the spatial filter 16, i.e., by positions of the light transmissive portions 160a, 160c.

Similarly, the light transmissive portions 160b, 160d transmit the diffracted light from the diffraction grating patterns 13b2, 13b4. A direction and an angle of the luminous flux incident on the reticle patterns 28 are determined by the position of the refracted light on the spatial filter 16 which is conditional to the pitch of the diffraction grating patterns 13b2, 13b4.

Figure 6:
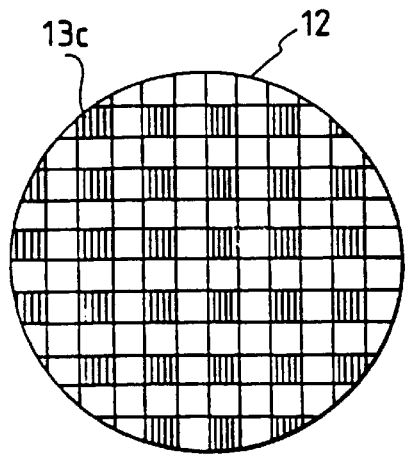

A configuration of the diffraction grating pattern 13b is not limited to the line-and-space depicted in FIG. 4 but may be a checked grating pattern 13c illustrated in FIG. 6. The pitch array direction is desirably matched with the array direction of the reticle patterns 28. As discussed above, if the periodic patterns on the reticle are arrayed in the two directions x, y, as illustrated in FIG. 6, the pitches of the checked grating pattern 13c may be set in the directions x, y. A duty thereof is not limited to 1:1.

Figure 7:
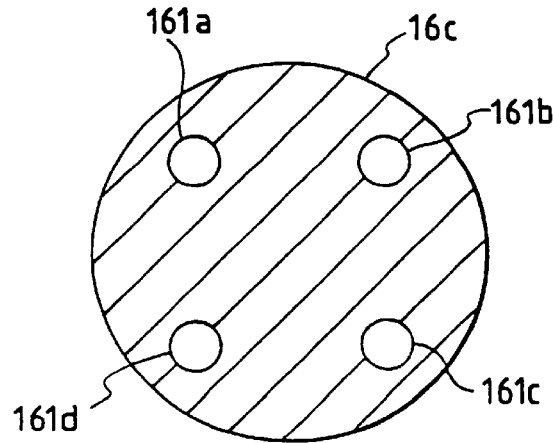
FIG. 7 is a view depicting a spatial filter corresponding to the patterns shown in FIG. 6.

FIG. 7 illustrates a spatial filter 16c for the checked grating pattern 13c shown in FIG. 6. The spatial filter 16c includes light transmissive portions 161a, 161b, 161c, 161d. The oblique line portion indicates the light shielded portion.

Spacings between the light transmissive portions 161a, 161b and 161d, 161c are determined by the x-directional pitch of the diffraction grating pattern 13c shown in FIG. 6. Spacings between the light transmissive portions 161a, 161d and 161b, 161c are determined by the y-directional pitch of the diffraction grating pattern 13c shown in FIG. 6. Where the reticle patterns 28 have the periodic structure in the two directions x, y, the illumination light penetrating the light transmissive portions 161a, 161d is incident on the reticle patterns 28 having the x-directional periodic structure, thereby generating the (+) primary diffracted light component. This diffracted light component passes through substantially the same position as that of the 0th-order diffracted light component of the illumination light which has penetrated the light transmissive portions 161b, 161c respectively on the pupil surface 51 of the projection optical system 29. Reversely, the illumination light penetrating the light transmissive portions 161b, 161c is incident on the reticle patterns 28 having the x-directional periodic structure, thereby generating the (−) primary diffracted light component. This diffracted light component passes through substantially the same position as that of the illumination light which has penetrated the light transmissive portions 161a, 161d respectively on the pupil surface 51 of the projection optical system. Distances from the optical axis to the respective light transmissive portions 161a, 161b, 161c, 161d are equally set. Therefore, the 0th-order diffracted light component and the (+) primary diffracted light component or the (−) primary diffracted light component pass through the positions having substantially equal distances from the optical axis on the pupil surface of the projection optical system. Four beams of illumination light passing through the light transmissive portions 161a to 161d are incident on the reticle patterns 28, thereby generating (+) or (−) primary diffracted light component. Combined light components of any one of these primary diffracted light components and the 0th-order diffracted light component all reach the wafer 30, whereby an image having, as described above, a contrast of approximately 90%, is formed. Further, the 0th-order diffracted light component and the primary diffracted light components travel through the positions having substantially equal distances from the optical axis AX on the pupil surface 51 of the projection optical system 29, and hence the focal depth is also great.

The case of the patterns having the periodicity in the direction x has been described so far. The patterns having the periodicity in the direction y are, however, available. The directions of the gratings are not limited to the above-mentioned but may include, e.g., a slant direction in accordance with the reticle patterns. Two pieces of light transmissive substrates formed with the repetitive diffraction grating patterns 13a shown in FIG. 2 are disposed so that the pattern surfaces confront each other. Two flat plates are relatively rotated about the optical axis of the illumination optical system, and arbitrary patterns may be formed by a adjusting the relative positions of the respective patterns. Further, the repetitive patterns assuming other arbitrary configurations may also be available. The diffraction grating patterns 13 may be not only the rectilinear patterns but also patterns having the periodic structure, e.g., homocentric grating patterns (Fresnel zone plate, etc.) and homocentric elliptical patterns. Additionally, the patterns having arbitrary light-and-shade portions in the two direction x, y may also be created by use of liquid crystal and the like. In these cases also, the spatial filter 16 having the transmissive portions determined based on the positions of diffracted light may be used.

The diffraction grating pattern plate 12 may be the one in which a light shielding film of Cr and the like undergoes patterning on the surface of a transmissive substrate, e.g., a glass substrate. Alternatively, the plate 12 may be the one provided with so-called phase gratings in which a dielectric film of $SiO_2$ or the like is subjected to patterning. The phase gratings exhibit such advantages that the 0th-order diffracted light component can be restrained, the spatial filter 16 can be also omitted, and a loss of the light quantity is small.

As discussed above, the incident directions and the incident angles of the (plurality of) illumination luminous fluxes incident on the reticle patterns 28 are prescribed corresponding to the reticle patterns 28. The incident directions and angles can be adjusted arbitrarily by changing the directivity and the pitch of the diffraction grating patterns 13a. For example, as explained earlier, the diffraction grating pattern plate 12 is replaced with the one having the different pitches, thereby making variable the positions of the luminous fluxes incident on the Fourier transform surface. It is therefore possible to attain an arbitrary distribution of the illumination light quantity on the Fourier transform surface without causing a considerable loss of the illumination light quantity. As stated before, the transmitting positions of the luminous fluxes on the Fourier transform surface are made variable, whereby the incident angle of the illumination light to the reticle patterns 28 is also made variable (the angle of the luminous fluxes incident on the projection optical system is adjustable to a desired angle). For this reason, it is feasible to obtain the projection exposure apparatus having a high resolving power and a smaller loss of the light quantity. The luminous flux transform member is intended to generate the light quantity distribution assuming an arbitrary configuration in accordance with the incident angle to the reticle patterns 28 on the Fourier transform surface or in the vicinity of this Fourier transform surface. Eliminated is an adjustment of the relative positional relation with the reticle patterns.

Note that there will be mentioned in detail the determination about the positions (on which the light quantity distributions concentrate on the entire Fourier transform surface) of the luminous fluxes incident on the Fourier transform surface 50.

The following is an explanation of a method of deteriorating the image by providing optical elements in the light transmissive portions of the spatial filter 16 by way of an example of variant form of the means for deteriorating the image.

Transmissive flat plates having different thicknesses and refractive indices are adhered to the respective light transmissive portions of the spatial filter 16. The beams of light penetrating the individual light transmissive portions travel along the light paths which are each longer by a value of (diffraction grating pattern plate thickness×refractive index). If a difference between the lengths of the light paths of the luminous fluxes penetrating the respective transmissive portions is larger than a coherent length of the illumination light, the beams of light penetrating the respective transmissive portions do not interfere with each other on the reticle pattern surfaces. Namely, it implies that no image of the diffraction grating patterns is formed. For instance, if the illumination light is an i-beam (wavelength=0.365 $\mu$m, wavelength width=0.005 $\mu$m) of the mercury lamp, the coherent length of the illumination light is approximately 27 $\mu$m. Where the glass having a refractive index of 1.5 is used as the above-described diffraction grating pattern plate, a difference ($\Delta t$) between the thicknesses of the flat plates adhered to the respective openings is expressed such as:

$$\Delta t \times (1.5-1) \geq 27 \, \mu m$$

where the refractive index of the air is 1. The difference defined by $\Delta t \geq 54 \, \mu m$ may suffice.

Hence, if the glasses individually having a refractive index of, e.g., 1.5 and thicknesses of 1000 $\mu$m, 1060 $\mu$m (thickness-difference is 60 $\mu$m) are adhered to the respective openings of the spatial filter illustrated in, e.g., FIG. 3, the interference fringes on the reticle pattern surfaces—i.e., the image of the diffraction grating patterns—disappear (deterioration).

Where the light transmissive flat plates having the different thicknesses and refractive indices are adhered to the openings of the spatial filter 16 in this manner, the diffraction grating patterns 13 and the optical member or the light scattering member 17 may not be oscillated, shifted or rotated.

If a coherence length of the illumination light is large, and when using, e.g., a laser beam source, preferably an optical rotatory element such as crystal may be adhered to one opening of the spatial filter 16 to rotate a polarizing direction of the transmission light through approximately 90°. Adhered to other openings are the transmissive flat plates of glass and the like having substantially equal length of the light path as that of the optical rotary element. Where the spatial filter described above is employed, almost a half of the luminous fluxes with which the reticle pattern surfaces are irradiated are orthogonal (alternatively, circularly polarized light in the reverse direction) to each other in terms of their polarizing directions. Therefore, the interference fringes—viz., the image of the diffraction grating patterns—are deteriorated. The diffraction grating patterns 13 are positioned with slight deviations in the optical-axis direction from the conjugate position to the reticle patterns 28, with the result that the image of the diffraction grating patterns 13 projected on the reticle patterns 28 may be deteriorated (defocused).

Deteriorated (homogenized) by the image deteriorating means on the basis of the above-described construction are the unnecessary light-and-shade fringes (the image of the diffraction grating patterns) which are produced by projecting (image-forming) the diffraction grating patterns serving as the luminous flux distributing member on the reticle pattern surfaces through the illumination optical system. Alternatively, the fringes are averaged in time and then homogenized in terms of the distribution of the image surface light quantity. An unevenness of illuminance on the reticle pattern surfaces can be prevented from being deteriorated. Further, it is feasible to remarkably reduce the manufacturing costs for the luminous flux transform members without being influenced by the defects in manufacturing the luminous flux distributing members.

Figure 8:
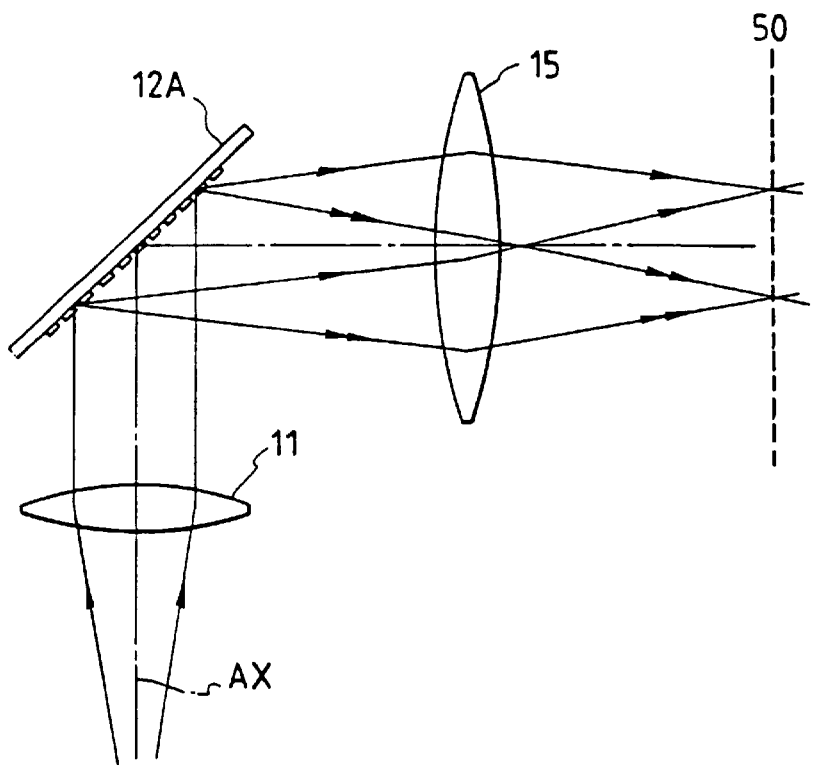
FIGS. 8, 9, 10, 11 and 12 are views each showing a variant form of the luminous flux distributing member in the first embodiment.

The diffraction grating pattern plate 12 may be not only the transmissive pattern plate but also a reflective pattern plate shown in FIG. 8. The optical member for transforming the illumination light described above into a plurality of luminous fluxes and forming an arbitrary light quantity distribution on the Fourier transform surface 50 is not limited to the diffraction grating pattern plate 12 or 12A.

Figure 9:
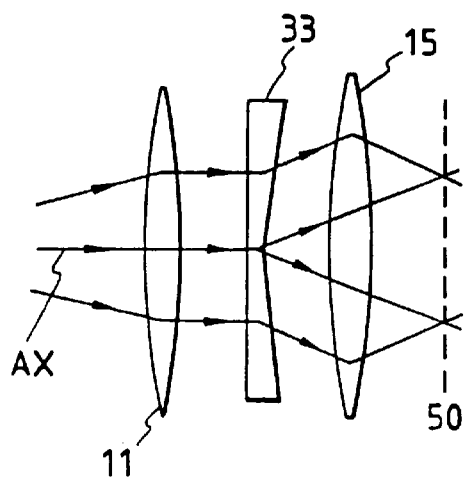

FIG. 9 is a schematic diagram showing an arrangement in which a prism 33 former with a plurality of refractive surfaces is employed as a member (luminous flux distributing member) for guiding a plurality of luminous fluxes onto the Fourier transform surface 50 and forming an arbitrary light quantity distribution on the Fourier transform surface. The configurations toward the light source from a relay lens 11 and toward the reticle from a relay lens 15 are the same as those shown in FIG. 1. The prism 33 in FIG. 9 is divided into two refractive surfaces with the optical axis AX serving as a boundary. The illumination light incident upwardly of the optical axis AX is refracted upwards, whereas the illumination light incident downwardly of the optical axis AX is refracted downwards. Hence, the illumination luminous fluxes can be incident on the Fourier transform surface in accordance with a refracting angle of the prism 33. The dividing number of the refractive surfaces is not limited to 2 but may be any number in accordance with a desired light quantity distribution on the Fourier transform surface. The dividing positions are not necessarily symmetric positions with respect to the optical axis AX.

The incident positions of the illumination luminous fluxes incident on the Fourier transform surface 50 is made variable by exchanging the prism 33.

Further, the prism 33 at this time may be a polarization beam solitter such as wollaston prism, etc. In this case, however, the polarizing directions of the split luminous fluxes are different, and hence the polarization properties may be arranged in one direction, considering the polarization property of the resist of the wafer 30. The device, as a matter of course, incorporates a function to exchange the prism and the like.

Figure 10:
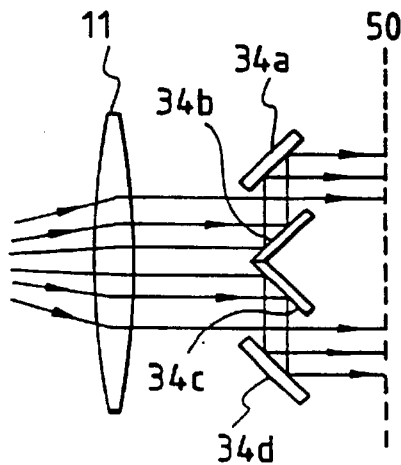

FIG. 10 shows an example where a plurality of mirrors 34a, 34b, 34c, 34d are employed as luminous flux distributing members. The illumination light passing through the relay lens system 11 is so reflected as to be separated into two directions through the primary mirrors 34b, 34c and guided by the secondary mirrors 34a, 34d. The illumination light is again reflected and reaches the Fourier transform surface. Each of the mirrors 34a, 34b, 34c, 34d is provided with a position adjusting mechanism and a mechanism for adjusting an angle of rotation about the optical axis AX. Based on these mechanisms, the illumination light quantity on the Fourier transform surface 50 is arbitrarily made variable. Further, the mirrors 34a, 34b, 34c, 34d may be plane, convex or concave mirrors. As depicted in FIG. 10, it is permitted that some luminous fluxes are not reflected once by the mirrors but the incident directly on the Fourier transform surface 50 from the relay lens 4. Besides, lenses may be interposed between the secondary mirrors 34a, 34d and the Fourier transform surface.

Prepared by twos in FIG. 10 are the primary mirrors 34b, 34c and the secondary mirrors 34a, 34d. The numerical quantity is not limited to this value. The mirrors may be disposed appropriately corresponding to the desired illumination light incident on the Fourier transform surface in accordance with the reticle patterns 28. All the mirrors are, as the necessity arises, constructed to retreat up to such positions that the illumination luminous fluxes strike on the mirrors.

Figure 11:
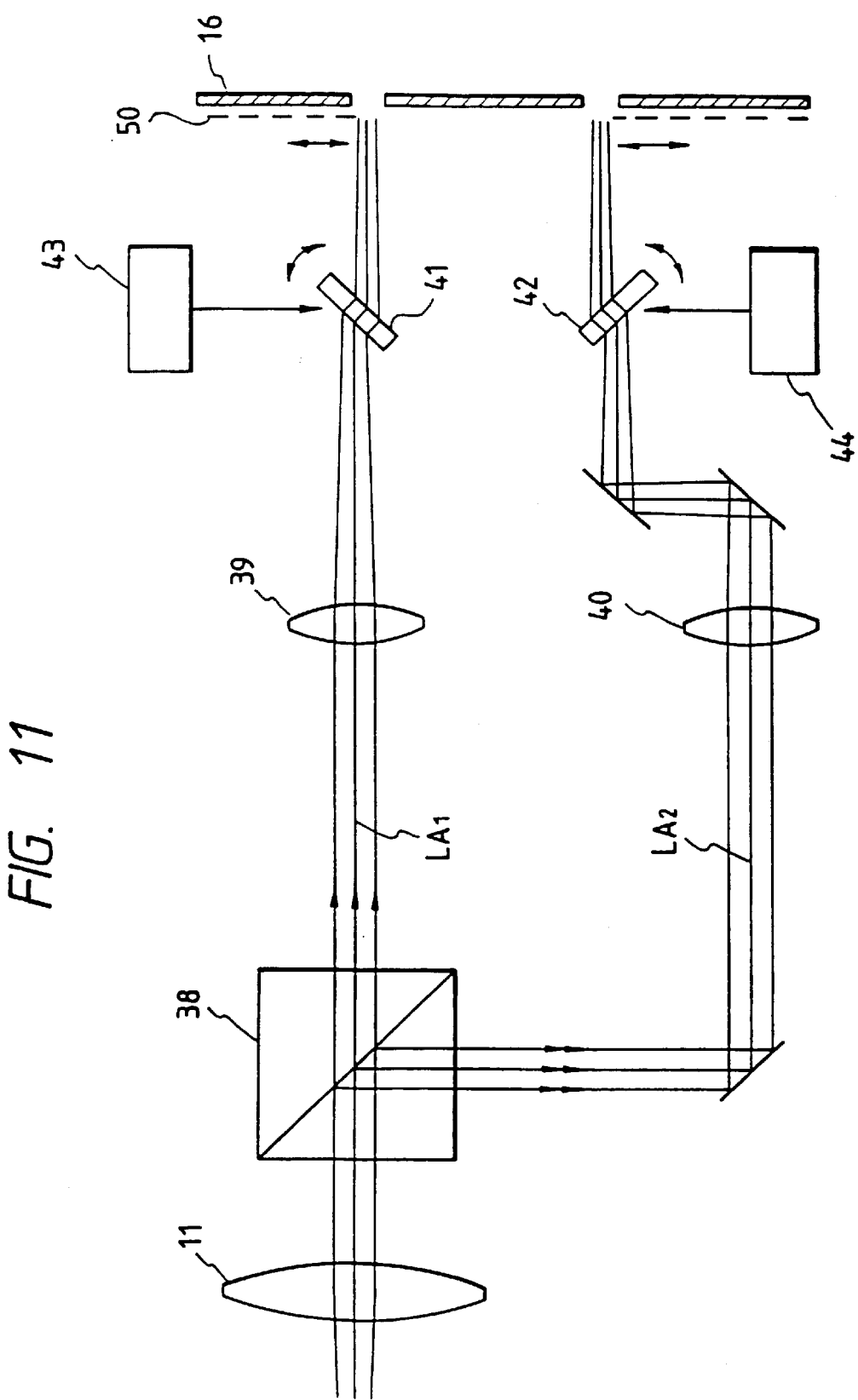

FIG. 11 illustrates an example where a beam splitter is employed as a luminous flux distributing member. The configurations toward the light source from the relay lens 11 and towards the reticle from the space filter 16 are the same as those shown in FIG. 1. As illustrated in FIG. 11, the illumination light traveling through the relay lens 11 is split into two luminous fluxes LA1, LA2 by means of a beam splitter 38 provided in the illumination optical system. The luminous fluxes LA1, LA2 are distributed as those having a certain magnitude (thickness) on the Fourier transform surface 50 through lens systems 39, 40 and plane parallels 41, 42. The lens systems 39, 40 are properly selected, whereby a magnitude of the illumination light quantity distribution on the Fourier transform surface 50 can be arbitrarily set. The plane parallels 41, 42 are minutely movable (inclinable) by drive systems 43, 44. The distributed positions of the luminous fluxes distributed on the Fourier transform surface 50 can be minutely adjustable. The drive systems 43, 44 are constructed of motors, gears or piezoelements and so on.

Figure 12:
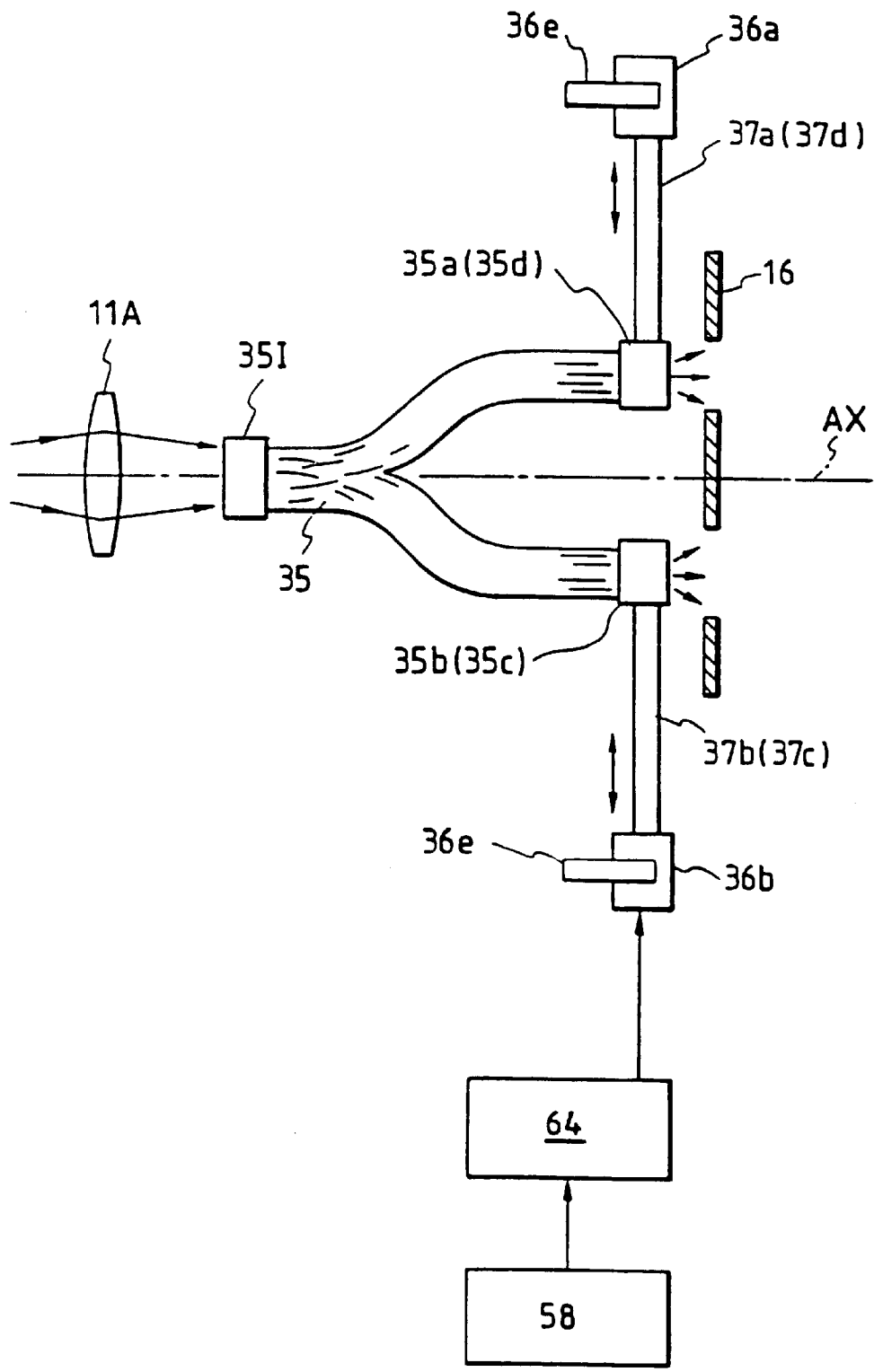

The luminous flux distributing member may involve the use of a waveguide member such as optical fibers and the like. FIG. 12 is a schematic diagram in a case where an optical fiber bundle 35 is used as a luminous flux distributing member. The configurations towards the light source from the relay lens 11A and towards the reticle from the spatial filter 16 are the same as those shown in FIG. 1. The illumination light emerging from the light source and penetrating the relay lens 11A is incident via an incident portion 351 on the optical fiber bundle 35 while being adjusted to a predetermined numerical aperture (NA). The illumination luminous fluxes incident via the incident portion 351 on the optical fiber bundle 35 are split into a plurality of luminous fluxes and exit a plurality of exit portions 35a, 35b. The plurality of exit portions 35a, 35b are provided in positions eccentric from the optical axis AX on the Fourier transform surface (pupil surface of the illumination optical system) 50. only the luminous fluxes which exit only the exit portions 35a, 35b are formed in close proximity to the Fourier transform surface.

It is therefore possible to form an arbitrary distribution of the illumination light quantity in the vicinity of the Fourier transform surface even by using the optical fiber bundle 35 as in the same way with the above-mentioned diffracting grating pattern plate 12.

At this time, lenses (e.g., filed lenses) may be interposed between the exit portions 35a, 35b of the optical fiber bundle 35 and the spatial filter 16.

As discussed above, the incident angles of the illumination light falling on the reticle 27 and the reticle patterns 28 are determined by the positions (eccentric from the optical axis AX) of the exit portions 35a, 35b within the plane vertical to the optical axis AX. For this reason, the exit portions 35a, 35b are independently movable with the aid of movable members 36a, 36b for adjusting the positions of the exit portions 35a, 35b within the Fourier transform surface.

Figure 13:
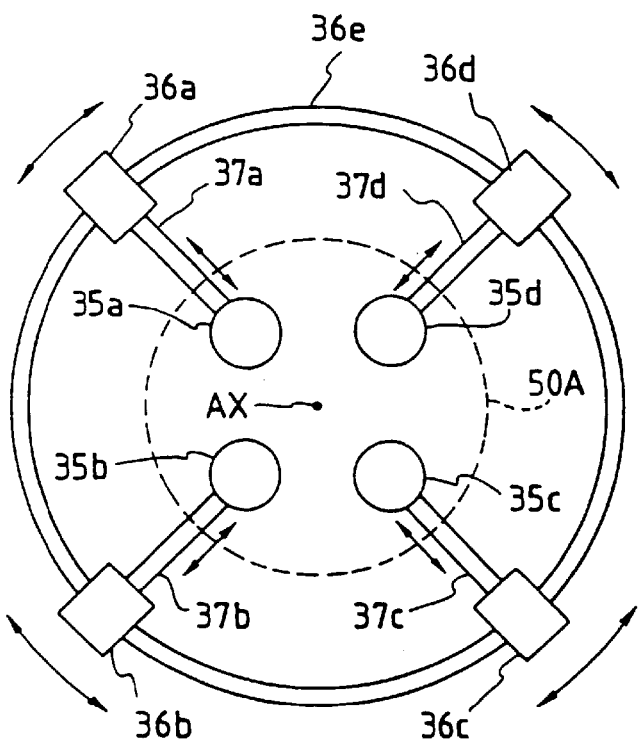
FIG. 13 is a view of a drive unit for the luminous flux distributing member of FIG. 12.

Next, an embodiment of the movable portions movable on the fiber exit portions will be explained with reference to FIGS. 12 and 13. FIG. 12 is a sectional view, as in FIG. 1, taken substantially in the direction vertical to the optical axis. FIG. 13 is a plan view taken substantailly in the optical-axis direction.

Employed herein are four pieces of fiber exit portions 35a, 35b, 35c, 35d as a means for creating an arbitrary light quantity distribution on the Fourier transform surface 50. The respective fiber exit portions are in discrete positions eccentric from the optical axis AX and are disposed at substantially equal distances from the optical axis AX. Turning to FIGS. 12 and 13, the fiber exit portions 35a, 35b, 35c, 35d are stretchable and contractible in the direction perpendicular to the optical axis by means of drive elements such as motors and gears which are incorporated into the movable members 36a, 36b, 36c, 36d through support bars 37a, 37b, 37c, 37d. The movable members 36a, 36b, 36c, 36d themselves are also movable in the circumferential direction abut the optical axis along a fixed guide 36e. Therefore, the individual fiber exit portions 35a, 35b, 35c, 35d are independently movable in the intra-plane direction vertical to the optical axis. Namely, these exit portions are independently movable to arbitrary positions (so as not to overlap with each other). The respective positions (within the plane vertical to the optical axis AX) of the fiber exit portions 35a, 35b, 35c, 35d shown in FIGS. 12 and 13 are changed preferably in accordance with the reticle patterns to be transferred. Exit surfaces of the exit portions 35a, 35b may be formed with the light scattering members such as diffusion plates and with aperture spots for regulating the apertures.

The luminous flux distributing member may be replaced with the spatial filter 16 provided in the vicinity of the Fourier transform surface. In this case, however, a loss of the light quantity increases.

Note that the foregoing luminous flux distributing means (such as the optical fibers and the beam splitter) depicted in FIGS. 9 through 12 are all intended to prepare the light quantity distribution in close proximity to the Fourier transform surface of the reticle patterns. The positions (conjugate relation) in which the exit portions of the luminous distributing means may be arbitrarily set.

Given is a case where the plural beams of illumination light come from the luminous flux distributing member. However, one luminous flux may be incident on the position eccentric by a predetermined quantity from the optical axis AX on the Fourier transform surface. For instance, one luminous flux may fall on the Fourier transform surface 50 by providing one exit portion of the fiber 35 shown in FIG. 12.

Now, the incident positions of the luminous flux distributing member onto the Fourier transform surface are determined (changed) preferably according to the reticle patterns to be transferred. A method of determining the positions in this case is that, as explained referring to FIG. 41, the incident position (incident angle $\Phi$) of the illumination luminous fluxes from the exit portions to the reticle patterns may be set to obtain the effects of improving the resolving power and focal depth which are optimal to the degree of fineness (pitch) of the patterns to be transferred.

By exemplifying a case where the optical fibers are used herein as a luminous flux transform member, there will be next explained a concrete example of determining the position (gravity position of the light quantity distribution created by one luminous flux incident on the Fourier transform surface) of the luminous flux passing above the Fourier transform surface. The explanation will be given with reference to FIGS. 15A through 15D. FIGS. 15A to 15D are diagrams schematically illustrating the exit surfaces of the elements from the exit portions 35A, 35B to the reticle patterns 28. The exit surfaces coincide with the Fourier transform surface 50. At this time, the lenses or a lens group for bringing both of them into a Fourier transform relation are expressed in the form of a single lens 26. Further, it is assumed that f is the distances from the principal point on the side of the fly eye lens to the exit surface and from the principal point on the side of the reticle of the lens 26 to the reticle patterns 28.

Figure 15A:
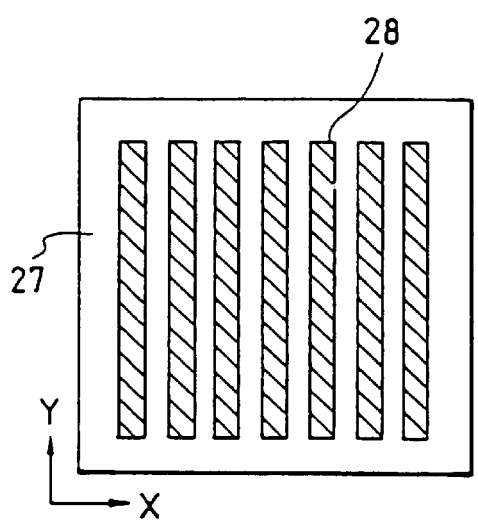
FIGS. 15A and 15C are plan views showing one example of the reticle patterns formed on the mask.
Figure 15C:
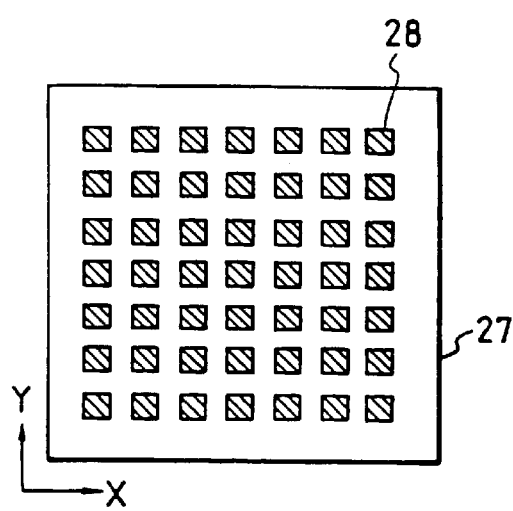
Figure 15B:
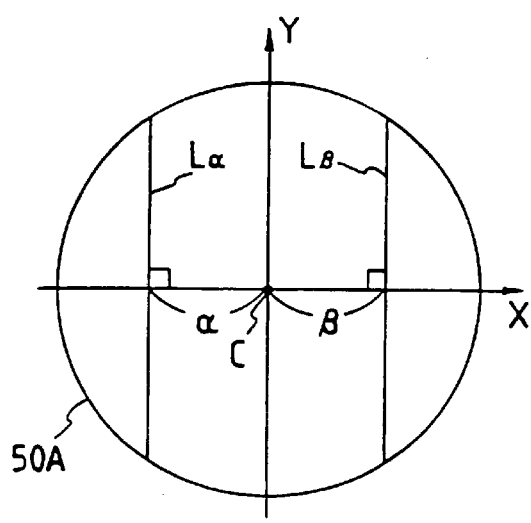
FIGS. 15B and 15D are views of assistance in explaining the placement of respective exit portions (surface illuminant image) on the Fourier transform surface for the reticle patterns corresponding to FIGS. 15A and 15C, respectively.
Figure 15D:
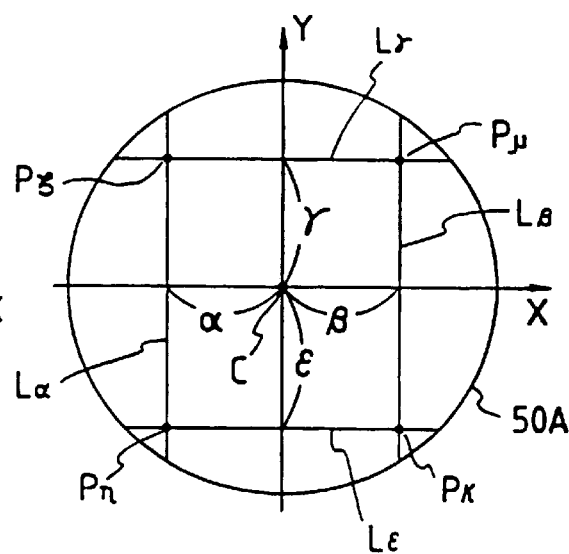

FIGS. 15A and 15C are diagrams each showing an example of some patterns formed in the reticle patterns 28. FIG. 15B illustrates the central position (the optimum position of a peak value of the light quantity distribution on the Fourier transform surface) on the Fourier transform surface (or the pupil surface of the projection optical system) which is optimal to the reticle patterns of FIG. 15A. FIG. 15D is a diagram illustrating the central position (gravity position of the light quantity distribution created by one luminous flux incident on the Fourier transform surface) of the exit portions optical to the reticle patterns of FIG. 15C. FIG. 15A depicts so-called one-dimensional line-and-space patterns wherein the transmissive portions and light shielding portions are arranged with equal widths to assume a striped configuration in the direction Y and also regularly arranged at pitches P in the direction X. At this time, the central position of one exit portion (surface illuminant) is, as illustrated in FIG. 15B, in an arbitrary position on a line segment L$\alpha$ or L$\beta$ in the direction Y which is presumed within the Fourier transform surface. FIG. 15B is a diagram showing a Fourier transform surface 50A associated with the reticle patterns 28 which is viewed substantially in the optical-axis direction AX. Coordinate systems X, Y within the Fourier transform surface 50A are identical with those in FIG. 15, wherein the reticle patterns 28 are observed in the same direction. Now, the distances $\alpha$, $\beta$ from the center C through which the optical axis AX passes to the respective line segments L$\alpha$, L$\beta$ have a relation such as $\alpha=\beta$. These distances are equal such as: $\alpha=\beta=f\cdot(½)\cdot(\lambda/P)$, where $\lambda$ is the exposure wavelength. When the distances $\alpha$, $\beta$ are expressed as f·sin $\Phi$, sin $\Phi=\lambda/2P$. This is identical with the numerical value explained in FIG. 40. Hence, the plurality of exit portions are provided, and the respective central positions of the individual exit portions are on the line segments L$\alpha$, L$\beta$.

On this assumption, it follows that the two diffracted light components i.e., the 0th-order diffracted light component generated from the illumination light coming from the respective exit portions and any one of the ($\pm$) primary diffracted light components pass through the position having almost equal distances from the optical axis AX on the pupil surface 51 of the projection optical system with respect to the line-and-space patterns. Therefore, as discussed above, the focal depth with respect to the line-and-space patterns (FIG. 15A) can be maximized, and the high resolving power is also obtainable. Note that one exit portion (surface illuminant) to be formed on the line segments L$\alpha$, L$\beta$ may suffice if a positional deviation concomitant with the defocus of the wafer 30 is ignored.

Next, FIG. 15C shows a case where the reticle patterns are so-called isolated spatial patterns, wherein Px is the X-directional (crosswise) pitch of the patterns, and Py is the Y-directional (vertical) pitch thereof. FIG. 15D is a diagram illustrating the optimum position of the exit portion in that case. The positional/rotational relationship associated with FIG. 15C are the same as those of FIGS. 15A and 15B. As seen in FIG. 15C, when the illumination light falls on the two-dimensional patterns, the diffracted light components are generated in the two-dimensional directions corresponding to periodicity (X:Px, Y:Py) in the two-dimensional directions of the patterns. Even in the two-dimensional patterns shown in FIG. 15C, if the 0th-order diffracted light component and any one of the ($\pm$) primary diffracted light components in the diffracted light have almost equal distances from the optical axis AX on the projection optical system pupil surface 51, the focal depth can be maximized. In the patterns of FIG. 15C, the X-directional pitch is Px. Therefore, as shown in FIG. 15, if the centers of the respective exit portions are on the line segments L$\alpha$, L$\beta$ defined such as $\alpha=\beta=f\cdot(½)\cdot(\lambda/Px)$, the focal depth can be maximized with respect to the X-directional elements of the patterns. Similarly, if the centers of the respective exit portions are on line segments L$\gamma$, L$\epsilon$ defined such as $\gamma=\epsilon=f\cdot(½)\cdot(\lambda/Py)$, the focal depth can be maximized with respect to the Y-directional elements of the patterns.

When the illumination luminous fluxes corresponding to the exit portions disposed in the respective positions shown thus in FIGS. 15B and 15D are incident on the reticle patterns 28, the 0th-order diffracted light component Do and any one of a (+) primary diffracted light component Dp and a (−) primary diffracted light component Dm pass through the light paths having the equal distances from optical axis AX on the pupil surface 51 within the projection optical system 29. Consequently, as stated in conjunction with FIG. 4, it is possible to actualize a projection type exposure apparatus with a high resolving power and a large focal depth. Only two examples of the reticle patterns 28 shown in FIGS. 15A and 15B have been considered so far. Even in other patterns, however, the attention is paid to the periodicity (degree of fineness) thereof. The respective exit portions may be disposed in such positions that two luminous fluxes i.e., the 0th-order diffracted light component and any one of the (+) primary diffracted light component and the (−) primary diffracted light component travel through the light paths having the substantially equal distances from the optical axis AX on the pupil surface 51 within the projection optical system. Provided in the pattern examples of FIGS. 15A and 15C are the patterns having a ratio (duty ratio), 1:1, of the line portion to the spatial portions. Consequently, ($\pm$) primary diffracted light components become intensive in the diffracted light generated. For this reason, the emphasis is placed on the positional relation between one of the ($\pm$)

primary diffracted light components and the 0th-order diffracted light component. In the case of being different from the duty ratio of 1:1, however, the positional relation between other diffracted light components, e.g., one of (±) secondary diffracted light components and the 0th-order diffracted light component may be set to give the substantially equal distances from the optical axis AX on the projection optical system.

If the reticle patterns 28, as seen in FIG. 15D, contain the two-dimensional periodic patterns, and when paying the attention to one specific 0th-order diffracted light component, there probably exist higher-order diffracted light components than the primary light components which are distributed in the X-direction (the first direction) and in the Y-direction (the second direction) about the single 0th-order diffracted light component on the pupil surface 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components and one specific 0th-order diffracted light component are distributed at the substantially equal distances from the optical axis AX on the pupil surface 51 of the projection optical system. For instance, the central position of the exit portion in FIG. 15D is arranged to coincide with any one of points Pξ, Pη, Pκ, Pμ. The points Pξ, Pη, Pκ, Pμ are all intersections of the line segment Lα or L β (the optimum position to the X-directional periodicity, i.e., the position in which the 0th-order diffracted light component and one of the (±) primary diffracted light components in the X-direction have the substantially equal distances from the optical axis on the pupil surface 51 of the projection optical system) and line segments, Lγ, Lε (the optimum positions to the Y-direction periodicity). Therefore, those positions are the light source positions optimal to either the pattern direction X or the pattern direction Y.

Presumed in the above-described arrangement are the patterns as two-dimensional patterns having the two-dimensional directivities at the same place on the reticle. The aforementioned method is applicable to a case where a plurality of patterns having different directivities exist in different positions in the same reticle patterns.

Where the patterns on the reticle have the plurality of directivities and degrees of fineness, the optimum position of the secondary illuminant image, as explained earlier, corresponds to the respective directivities and degrees of fineness of the patterns. Alternatively, however, the secondary illuminant image may be in the averaged position of the respective optimum positions. Besides, this averaged position may also undergo load averaging in which a weight corresponding to the significance and degree of fineness of the pattern is added.

(One or a plurality of) luminous fluxes with which the reticle 27 is irradiated are incident on the reticle 27 with an inclination to the optical axis AX of the projection optical system 29. At this time, if the direction of the light quantity gravity of those illumination luminous fluxes is inclined to the optical axis AX, there arises such a problem that the position of a transferred image shifts in the intra-wafer-surface direction during minute defocusing of the wafer 30. To prevent this problem, the direction of the light quantity gravity of the illumination luminous fluxes distributed on the Fourier transform surface is made perpendicular to the reticle patterns 28, i.e., parallel to the optical axis AX. For example, where the optical fibers are employed as a luminous flux transform member, the arrangement is effected to make zero a vector sum (integration) of a product of the exit portion's position (positional vector within the Fourier transform surface from the optical axis AX of the gravity of the light quantity distribution created by the exit portions) and the transmission light quantity. Note that when using the diffraction grating pattern plate 12 as a member for forming the light quantity distribution on the Fourier transform surface, this condition is automatically satisfied. The following is a definite example of the above-mentioned distribution of the illumination light quantity. The number of luminous fluxes is set to 2m (m is the natural number), and positions of the m-number luminous fluxes are arbitrarily set, while positions of remaining m-numbered luminous fluxes may be set in symmetry with respect to the optical axis AX and the former m-numbered luminous fluxes as well.

Besides, the exit surfaces of the exit portions 35a, 35b may be formed with aperture stops for regulating the apertures and with light scattering members such as diffusion plates, etc.

The number of the plurality of the exit portions is not limited to 4 but may be arbitrarily set corresponding to the reticle patterns 28. For instance, three pieces of exit portions are available. The center of a single piece of secondary illuminant image formed by one exit portion is set in the position eccentric by a quantity corresponding to the reticle patterns 28 from the optical axis AX. The secondary illuminant image may be changed depending on the time.

In addition, if necessary, the reticle 27 may be arranged so as not to undergo an irradiation of the illumination light from specific one of the exit portions. For example, supposing that a broken line circle 50A in FIG. 13 is formed corresponding to a size of the pupil surface 51 of the projection optical system 29, the light shielding member is provided outwardly of this broken line circle 50A in combination with the Fourier transform surface 50 (FIG. 1) of the illumination system. When the unnecessary exit portions retreat to this light shielding portion (outside the broken line circle 50A of FIG. 13), it is possible to obtain a desired number of exit portions.

A diameter (numerical aperture of one beam of illumination light on the Fourier transform surface of the illumination system) of opening of each exit portion is preferably set so that a so-called σ-value (a ratio of the numerical aperture of the illumination optical system which is estimated in the projection optical system to the numerical aperture of the projection optical system) becomes approximately 0.1 to 0.3 per luminous flux. If the σ-value is 0.1 or under, the image fidelity declines, whereas if this value is 0.3 or above, the increasing effect of the focal depth is reduced.

Figure 16:
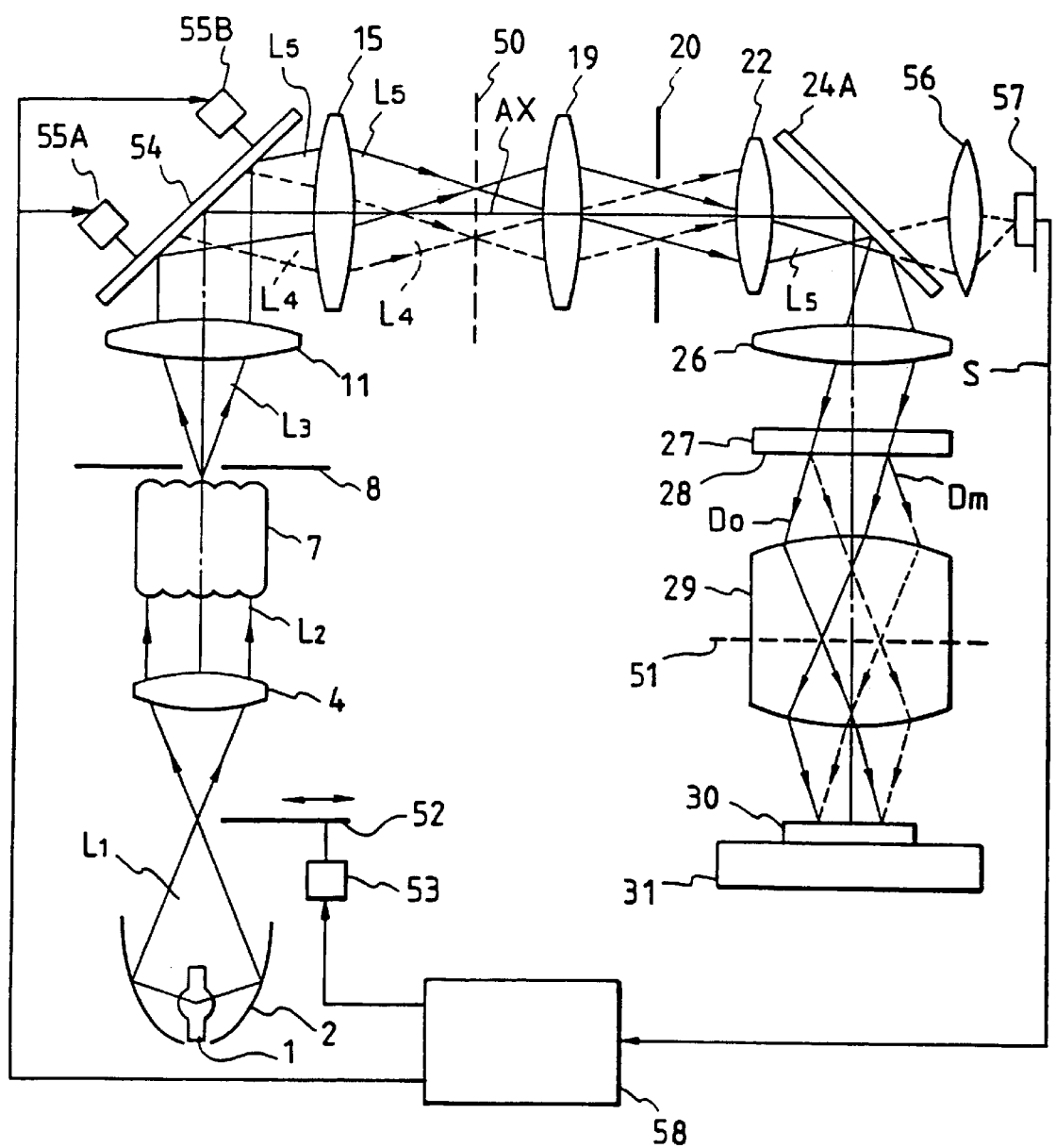
FIG. 16 is a view schematically illustrating a projection type exposure apparatus in a second embodiment of the present invention.

FIG. 16 is a diagram schematically illustrating a construction of the projection type exposure apparatus in accordance with a second embodiment of this invention. The principal configuration of the aligner is the same as that of FIG. 1. The same members as those in FIG. 1 are marked with the same reference numbers. In this embodiment, the means for forming an arbitrary light quantity distribution on the Fourier transform surface involves the use of a movable optical member such as a reflection mirror and the like in place of the luminous flux distributing member used in the first embodiment.

The lens system 4 is irradiated with a luminous flux L1 emitted from the light source 1 via the elliptical mirror 2. The luminous flux L1 is shaped into a substantially collimated luminous flux L2 by means of the lens system 4 and becomes a luminous flux L3 through the fly eye lens 7 and the aperture stop 8. A reflector 54 is irradiated with the luminous flux L3 via the lens system 11. A field stop 20 is irradiated with a luminous flux L4 reflected by the reflector 54 through lens systems 15, 19. Further, a half-mirror 24A is irradiated with a luminous flux L5 passing through the filed stop 20 via a lens system 22. The luminous flux L5 reflected by the half-mirror 24A then falls on the reticle 27 at a predetermined incident angle through a lens system (principal condenser lens) 26. The configuration towards the wafer from the lens system 26 is the same as that of FIG. 1 (the first embodiment), the description is therefore omitted. Note that the aperture stop 8 is a stop for determining a coherent factor a of the illumination luminous flux as in the first embodiment.

On the other hand, the luminous flux penetrating the half-mirror 24A is condensed by a lens system 56 and undergoes a photoelectric conversion in a light quantity meter 57 such as a semiconductor sensor and the like. A light quantity signal S obtained from the light quantity meter 57 is transmitted as an electric signal to a control circuit 58. Based on the light quantity signal S, the control circuit 58 gives instructions to a shutter drive unit 53 for driving a shutter 52 and to drive elements 55A, 55B for driving the reflector 54. When the shutter drive unit 53 is operated, the luminous flux 2 is cut off by the shutter 52, thereby stopping the exposure. Note that this embodiment has a construction to control the shutter drive unit 53 and the drive elements 55A, 55B by use of the light quantity meter 57. The effects of the present invention are not varied by the arrangement that the control is performed simply in accordance with the exposure time without providing the light quantity meter 57.

Based on the construction given above, the incident surface of the fly eye lens 7, the field stop 20, the reticle patterns 28 (pattern surfaces) of the reticle 27 and the wafer 30 are conjugate to each other. Further, the exit surface of the fly eye lens 7, the Fourier transform surface 50 of the reticle 27 and the pupil surface 51 of the projection optical system 29 are also conjugate to each other.

Note that for making the illuminance on the reticle surface 27 homogeneous, the incident surface of the fly eye lens 7 is positioned to have an image forming relation with the reticle 27. On the other hand, the exit surface of the fly eye lens 7 is positioned corresponding to the Fourier surface (pupil surface) with the reticle patterns 28 of the reticle 27 serving as object surfaces.

The reflector 54 is, as described above, in the position substantially conjugate to the reticle 27 and rotatable about two axes orthogonal to each other on, e.g., a reflecting surface. The reflector 54 is rotated by the drive elements 55A, 55B such as motors, piezoelements and the like.

Turning to FIG. 16, the reflected light L4 traveling towards the luminous flux L4a is shown by a solid line. The reflected luminous flux L4a is allowed to travel in the direction of, e.g., a luminous flux L4b by changing a rotary angle of the reflector 54. That is, one secondary illuminant image at the exit end of the fly eye lens 7 is shifted on the Fourier transform surface 50. It is also, as a matter of course, possible to provide a component movable in the direction perpendicular to the sheet of FIG. 16.

In the thus constructed exposure apparatus, the reflector 54 is driven by the drive elements 55A, 55B and set in predetermined positions. Thereupon, the luminous flux L4 whose principal beam is coaxial with the optical axis AX of the illumination optical system is changed into luminous fluxes L4a, L4b whose principal beams are inclined to the optical axis AX. These luminous fluxes L4a, L4b are con- densed respectively in positions different from the optical axis AX in the vicinity of the Fourier transform surface 50 of the reticle 27. For this reason, a luminous flux L5 (corresponding to the luminous flux L4a) with which the reticle 27 is irradiated is obliquely incident on the reticle 27. As explained in FIG. 41, the high resolving power and the large focal depth are attainable. Supposing that an illumination luminous flux L5a for illuminating the reticle 27 is always incident on the reticle 27 at a constant incident angle, however, the light quantity gravity (in other words, the principal beam of the luminous flux L5a) in the incident direction of the luminous flux L5a by which the image is formed on the wafer 30 comes to assume a slant state (non-telecentric state) to the wafer 30. Namely, it may happen that the image position deviates sideways within the wafer surface with a minute deviation (defocus) of the wafer 30 in the direction of the optical axis AX. Taken in this embodiment is such a measure for preventing this lateral deviation that the incident angle of the illumination luminous flux on the reticle 27 is changed by the reflector 54. Hence, after performing the illumination with a predetermined amount of exposure by use of the luminous flux L5a incident at a certain incident angle 100 , and thereafter the reflector 9 is moved. The illumination is effected this time to have the same amount of exposure as the above-mentioned by using the luminous flux L5b incident at an incident angle $-\Phi$. The lateral deviation of the light quantity gravity incident on the wafer from a normal line of the wafer surface is thereby offset with the exposure at incident angle $+\Phi$ and the exposure at the incident angle $-\Phi$. The projection type exposure apparatus in this embodiment is provided with the light quantity meter 57 for measuring the quantity of light with which the reticle is irradiated. It is therefore feasible to easily make constant the exposure quantity at the incident angle $+\Phi$ and the exposure quantity at the incident angle $-\Phi$ and further equalize these values. Even in the case of controlling the exposure time instead of providing the light quantity meter, it is similarly possible to make the respective exposure quantities constant and equalize these values. An arbitrary light quantity distribution on the Fourier transform surface 50 can be formed in this manner by use of the movable reflector.

In accordance with this embodiment, the reflector 54 defined as a movable optical member existing in the position substantially conjugate to the reticle 27 is moved. It can be therefore considered that if the field stop 20 is disposed closer to the light source than the reflector 54, a positional relation between the reticle 27 and the field stop 20, though small, deviates with the movement of the reflector 54. Hence, the field stop 20 is desirably is placed closer to the reticle 27 than the reflector 54.

If there is an insufficient compensation of chromatic aberration of the optical elements in the projection optical system 29 and the illumination optical system (from the lens system 26 to the light source 1 in the Figure), a wavelength selecting element such as a band-pass filter is used in the illumination luminous flux, e.g., the luminous flux L2. Alternatively, the reflection member such as the elliptical mirror 2 may involve the use of a multilayer dielectric mirror to enhance a reflectivity of only the specific wavelength.

It is to be noted that even in the case of transferring circuit patterns by the projection type exposure apparatus in this embodiment, as in the first embodiment, the ratio, i.e., a so-called coherent factor σ, of the numerical aperture of the illumination luminous flux to the numerical aperture on the part of the photo mask of the projection optical system is preferably 0.1 to 0.3. Hence, the fly eye lens 7 and the aperture stop 8 are set so that σ=0.1 to 0.3.

Figure 17:
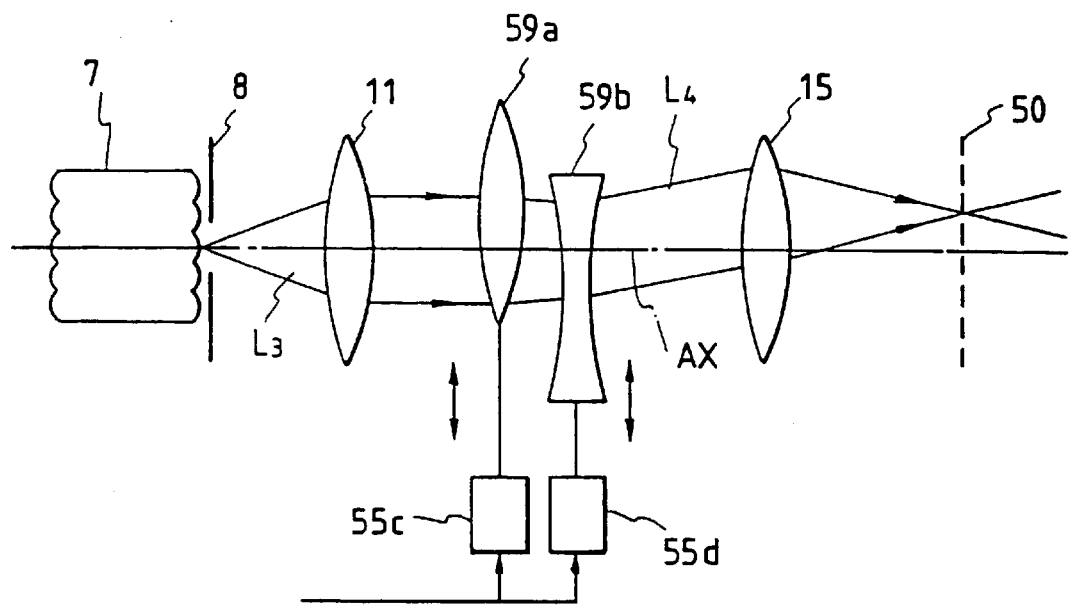
FIGS. 17 and 18 are views showing a variant form of the movable optical member according to the present invention.

FIG. 17 is a diagram depicting a configuration of a variant form 1 of the projection type exposure apparatus in this embodiment. This variant form employs a lens system as a movable optical member. However, the constructions toward the light source from the fly eye lens 7 and toward the reticle from the Fourier transform surface (pupil surface of the illumination optical system) 50 are the same as those in FIG. 16, and the description is therefore omitted. The luminous flux emerging from the fly eye lens falls on a lens system 59a having a positive power via the lens system 11 on a lens system 59b having a negative power. The lens systems 59a, 59b are disposed in close proximity to the surface conjugate to the reticle 27. A sum of the powers of the lens systems 59a, 59b becomes 0. The lens systems 59a, 59b are movably respectively by the lens drive members 55c, 55d within the surface vertical to the optical axis AX. The luminous flux penetrating the lens systems 59a, 59b movably by the drive members 55c, 55d becomes a luminous flux having the principal beam different from the optical axis AX of the illumination optical system. The luminous fluxes is condensed in a position different from the optical axis AX on the Fourier transform surface 50.

Referring to FIG. 17, the lens systems 59a, 59b are moved almost an equal distance in the direction opposite to the optical axis. As a result, the luminous flux penetrating the lens systems 59a, 59b is incident on the lens system 15 at a given angle inclined to the optical axis AX. If the positions of the lens systems 59a, 59b are changed by the lens drive members 55c, 55d, the luminous flux exited can e oriented in an arbitrary direction. Note that the lens drive members 55c, 55d are controlled by a control circuit 58.

A new lens system having a positive power is disposed closer to the reticle 27 than the lens system 59b and movably by the lens drive member. Further, a total of powers of the lens systems 59a, 59b and of the newly added lens system having the positive power may be arranged to be 0. Similarly, a lens system having a negative power is disposed closer to the light source than the lens system 59a. A total of powers of the lens systems 59a, 59b and of the newly added lens system having the negative power may be also arranged to be 0. Note that the arrangement of the lens system in which that position is variable is not limited to only the combinations given above. A permissible arrangement is that the lens group composed of a plurality of lens elements has a power total of 0, and the illumination luminous flux can be oriented in an arbitrary direction by moving the respective lens elements. The lens elements to be driven are not specified. Similarly, the lens elements capable of orienting the illumination luminous flux in an arbitrary direction are satisfactory.

Figure 18:
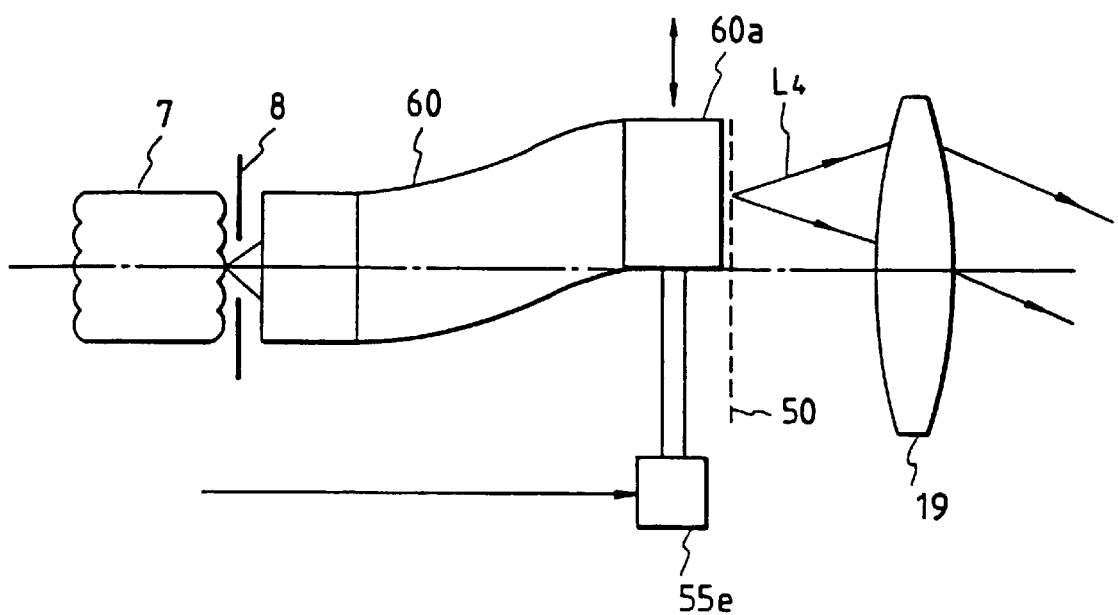

FIG. 18 is a diagram schematically illustrating a second variant form of the projection type exposure apparatus in this embodiment. In this variant form, the movable optical element involves the use of a photo transmitting means such as fibers. An arbitrary light quantity distribution is formed on the Fourier transform surface. However, the constructions toward the light source from the fly eye lens 7 and toward the reticle from the lens system 19 are the same as those in FIG. 16, and the description is therefore omitted. The Fourier transform surface 50 is linked via the photo transmitting means such as optical fibers 60 to the exit side of the fly eye lens 7. Hence, the exit surface of the fly eye lens 7 corresponds to the Fourier transform surface 50. The exit side of the optical fibers 60, i.e., the portion on the side of the Fourier transform surface 50, is movable by a drive member 55e. The illumination luminous flux (illuminant image) can be thereby distributed in arbitrary positions within the Fourier transform surface 50. The drive member 55e is, as in the same way with the variant form 1 of this embodiment, controlled by the control circuit 58.

Next, an exposure method by use of the exposure apparatus in the second embodiment will be described with reference to FIGS. 19A and 19B.

FIGS. 19A and 19B are flowcharts each showing the exposure method in the embodiment of this invention. A difference between FIGS. 19A and 19B lies in whether the exposure is stopped or not when driving the reflector 54. In advance of the exposure, the shutter 52 is in such a status as to cut off the luminous flux L2. Determined herein are the number of positional changes of the reflector 54, coordinates of the respective positions of the reflector and exposure quantities for the respective coordinates (step 101). As stated before, however, if a so-called light quantity gravity of the illumination light when the luminous flux L5 corresponding to each position of the reflector 54 falls on the reticle 27 deviates from the optical axes AX of the illumination optical system and the projection optical system 20, there exists a possibility of causing a lateral deviation of the transferred image due to a very small defocus of the wafer 30. It is thus required to determine the respective positions of the reflector 54 and the illumination light quantities (exposure quantities) for illumination according to the respective positions of the reflector 54 so that the light quantity gravity coincides with the optical axis AX. This may be accomplished by determining, when one pattern exposure is completed by effecting 2m-time (m is the natural number) exposing processes, the coordinates of the reflector 54 effecting the m-time exposures thereof. Further, the coordinates of the reflector effecting the remaining m-time exposures may be set in symmetry with respect to the optical axis AX and the incident luminous flux in a case where the incident luminous flux is associated with the former m-time exposures. Incidentally, a method of determining the coordinates of the reflector 54 which is performing the exposing processes at respective angles in a plurality of positions may be prescribed so that the light quantity distribution (positional coordinates of the luminous fluxes) on the Fourier transform surface 50 has the conditions explained in the first embodiment with reference to FIGS. 14 and 15. More specifically, the position of the reflector 54 may, when transferring the patterns depicted in FIG. 15A, be determined so that the center (principal beam) of the illumination luminous flux L4a or L4b reflected by the reflector 54 coincides on the line segment Lα or Lβ on the Fourier transform surface 50. When transferring the patterns shown in FIG. 15B, the central position of the illumination luminous flux reflected by the reflector 54 may be determined to coincide on the line segment Lα or Lβ and the line segment Lγ or Lε. The optimum position in this case includes four points Pξ, Pη, Pκ, Pμ.

Next, operating instructions are issued from the control circuit 58 to the drive members 55a, 55b, and the reflector 54 is set in a predetermined first position (step 102). The operator inputs the first position by means of an input unit incorporated into the control circuit 58. Alternatively, the control circuit 58 is allowed to determine the first position of the reflector 54 on the basis of the information on the circuit patterns 28 on the reticle 27, the information being inputted by the operator through the input unit. A necessary total exposure quantity E is likewise inputted by the operator through the input unit. The control circuit 58 is, even when being inputted by the operator, permitted to decide specific degrees of exposures which are effected in the respective positions of the reflector 54. As in the first embodiment, the information described above may be obtained by reading the bar codes BC provided on the mask.

Subsequently, the action enters the actual exposing process. The reflector 54 is almost fixed in the first position previously determined. In this state, the control circuit 58 issues an instruction of "Open shutter" to the shutter drive unit 53. A shutter 52 is opened, and the exposure is started (step 103). The reticle is illuminated with the illumination luminous flux. Consequently, the reticle patterns 28 are transferred on the wafer 30. At this moment, some illumination luminous fluxes passing through the half-mirror 24A are received and converted photoelectrically by the light quantity meter 57. When an integrated value of the light quantity signal S thereof reaches a predetermined value, i.e., an exposure quantity corresponding to the previously determined first position (step 104), or just before reaching that value, the control circuit 58 gives the operating instructions to the drive members 55a, 55b. The position of the reflector 54 is thereby changed to a predetermined second position (step 105). Note that when the integrated value (integrated light quantity) of the light quantity signal S, as shown in FIG. 19B, reaches the predetermined value, the shutter 52 is temporarily stopped (step 105a). The reflector 54 is moved after stopping the exposure. The reflector 54 is substantially fixed in the predetermined position, and thereafter the shutter 52 is opened (step 105b). Then, the exposure may resume.

When the integrated value of the light quantity signal S comes to the predetermined value in the second position of the reflector 54 (step 106), or just before reaching this value, the reflector 54 is moved in the same manner as before. The reflector 54 is substantially fixed in a third position, and the exposure continues. At this time also, the shutter 52 is temporarily closed as in the previous case, and the exposure may be stopped.

Thereafter, the position of the reflector 54 is likewise changed to m-numbered positions, thus performing the exposures. When the integrated value of the light quantity signal S somes to the preset total exposure quantity E in the m-th position of the reflector 54 (step 107), the shutter 52 is closed, thus completing the exposure.

Incidentally, where $E_1, E_2, \ldots, E_m$ ($\Sigma E_i = E$, $1 \leq i \leq m$) are the exposure quantities in the respective positions, the exposure in the first position is ended when the integrated value of the light quantity signal S reaches $E_1$ or just before reaching it. The exposure in the second position is ended when the integrated value reaches ($E_1 + E_2$) or just before reaching it. Namely, the exposure in the arbitrary n-th position among the exposures in the first through m-th positions comes to an end when the integrated value reaches $\Sigma E_i$ ($1 \leq i \leq n$).

Adopted is a method of stopping the exposure by closing the shutter 52 during a movement of the reflector 54. In this case, the integrated value is reset to 0 during a stoppage of the exposure. Thereafter, the exposure resumes, and when the integrated value of the light quantity signal S reaches the predetermined value En, the exposure in the arbitrary n-th position may be ended.

The exposures in accordance with the second embodiment of this invention are thus completed. Therefore, the wafer 30 is carried in parallel within the surface vertical to the optical axis AX by a wafer stage 31. The exposures may be newly effected in other exposure regions of the wafer 30. Besides, the exposures may be performed in the exposed region by replacing the reticle 27 while superposing other circuit patterns thereon. Note that when newly effecting the exposures in other positions of the wafer 30, the sequence of positions of the reflector 54 may be so reversed as to start with the m-th position and end up with the first position.

Based on the above-described exposure method, the reflector 54 is moved while making the exposure continue. In this case, the illumination light emerging from directions other than the predetermined one is incident on the reticle 27 during the movement of the reflector 54. This causes a possibility where the effects to obtain the foregoing high resolving power and large focal depth will decline. For preventing this, a space filter having transmissive portions only in predetermined positions is provided in the vicinity of the Fourier transform surface 50 between the lens systems 15, 19 shown in FIGS. 16. In this spatial filter, the transmissive portions are formed in the predetermined positions eccentric from the optical axis AX on the Fourier transform surface 50, while the light shielding portions are formed in other positions. The predetermined positions of the transmissive portions are those through which the illumination luminous fluxes L4a, L4b generated from the reflector 54 in the respective positions for obtaining the desired resolving power and focal depth pass above the Fourier transform surface 50. Diameters of the respective transmissive portions serve to determine σ-values of the individual illumination luminous fluxes. Hence, this diameter is optically equivalent to the aperture stop 8 on the surface of the exit side of the fly eye lens 7 which has been previously determined; viz., the diameter is set considering a relation in magnification between the surface (conjugate to the Fourier transform surface 50) on the exit side of the fly eye lens 7 and the Fourier transform surface 50. The diameter of the specific transmissive portion may be smaller than the above-mentioned (equivalent) diameter. Namely, the σ-value of the specific luminous flux among the luminous fluxes incident on the reticle 27 may be decreased.

A light scattering member such as a lemon skin filter and the like may be provided on the Fourier transform surface 50. This light scattering member is capable of making unsharp defects and dusts on the movable optical member. It is therefore possible to prevent the unevenness of illuminance on the reticle 27 which is caused by the dusts and defects. Note that an image forming relation between the reticle 27 and the movable optical member (reflector 54) becomes unsharp due to the light scattering member but does not exert any adverse influence on the effects of the present invention.

A third embodiment of the present invention will next be explained with reference to the drawings. In accordance with the first and second embodiment described above, the luminous flux transform member for forming an arbitrary light quantity distribution on the Fourier transform surface and the movable optical member are interposed between the reticle and the optical integrator of the fly eye lens or the like. In this embodiment, however, the luminous flux transform member and the movable optical member are interposed between the optical integrator and the light source, thereby improving the illuminance homogenizing effect.

Figure 20:
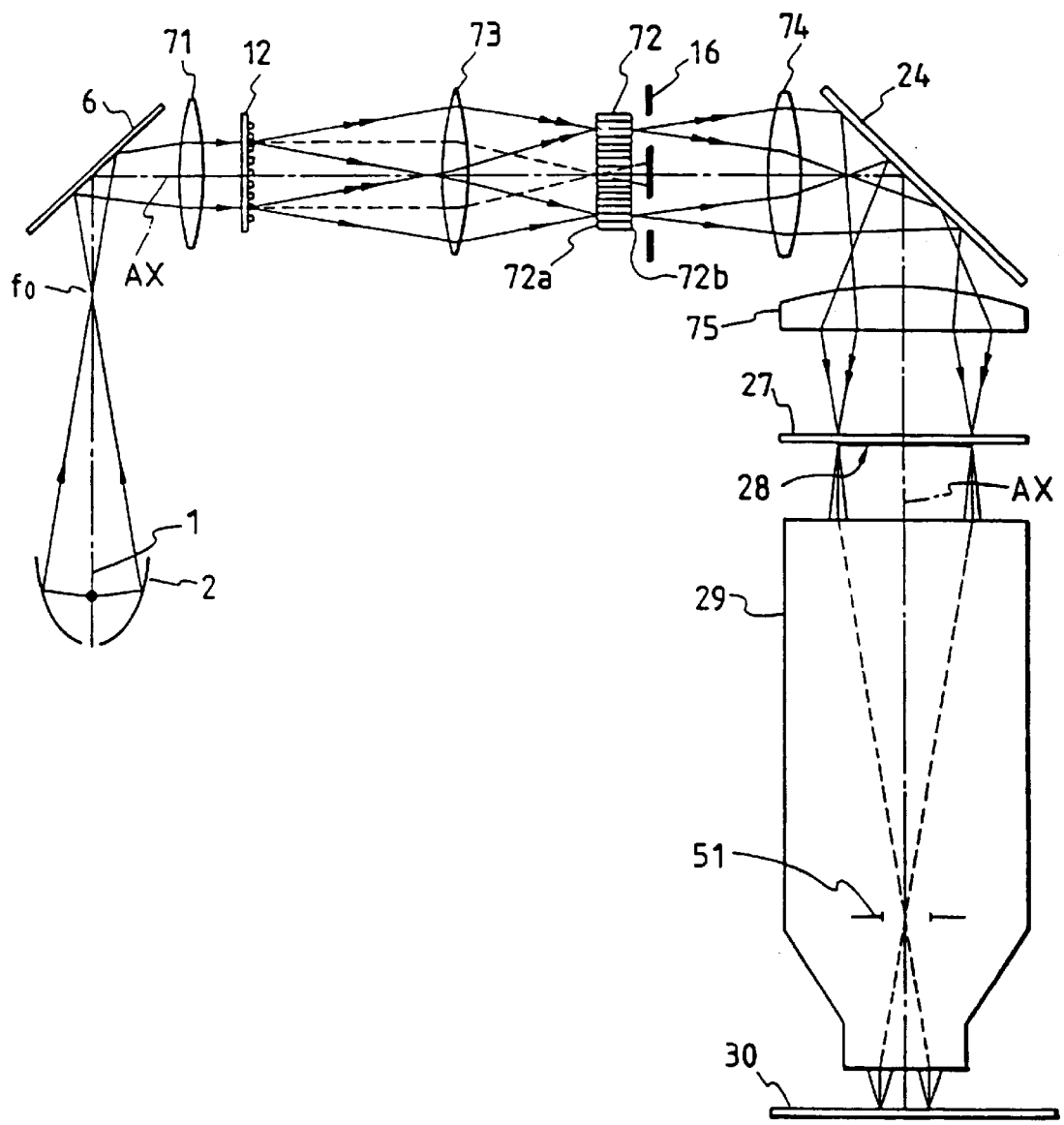
FIG. 20 is a view schematically illustrating a projection type exposure apparatus in a third embodiment of the present invention.

FIG. 20 illustrates an outline of a projection type exposure apparatus (stepper) suitable for the third embodiment of this invention. Provided is a diffraction grating pattern plate 12 as an optical member (a part of an input optical system of this invention) for concentrating the illumination light on a light-source-side focal surface 72a of a fly eye lens 72. Note that the same members as those in the first and second embodiments are marked with the like symbols.

The illumination luminous fluxes emerging from the mercury lamp 1 are condensed at a second focal point of the elliptical mirror 2. Thereafter, the diffraction grating pattern plate 12 is irradiated with the condensed luminous flux via a mirror 6 and a lens system 71 of a relay system. An illumination method at this time may be the Kohler illumination method or the critical illumination method. However, the critical illumination method is desirable in terms of obtaining a more intensive light quantity. The diffracted light generated from the diffraction grating pattern plate 12 is incident in concentration on the position eccentric from the optical axis AX of the light-source-side focal surface 72a (incident surface) of the fly eye lens 72 with the aid of the relay lens 73. It is herein assumed that the 0th-order and (±) primary diffracted light components are generated. At this moment, the light-source-side focal surface 72a of the fly eye lens 72 and the diffraction grating pattern plate 12 have substantially a Fourier transform relation through the relay lens 71. Note that the illumination light on the diffraction grating pattern plate 12 is illustrated as collimated luminous fluxes in FIG. 20, but they are actually divergent luminous fluxes. Hence, the luminous flux incident on the light-source-side focal surface 72a of the fly eye lens 72 has a certain magnitude (thickness). Correspondingly, the exit luminous flux from a reticle-side focal surface 72b of the fly eye lens 72 in accordance with the incident light flux on the light-source-side focal surface 72a also has a certain magnitude.

On the other hand, the reticle-side focal surface 72b of the fly eye lens 72 is so disposed as to be substantially coincident with the Fourier transform surface (pupil conjugate surface) of the reticle patterns 28.

The respective lens elements of the fly eye lens 72 depicted in FIG. 20 are double convex lens elements, shown therein is a case where the light-source-side focal surface 72a coincides with the incident surface, and the reticle-side focal surface 72b coincides with the exit surface. The lens elements of the fly eye lens do not strictly fulfill this relationship. Those lens elements may be plane-convex lens elements, convexo-plane lens elements or plane-concave lens elements. The fly eye lens is composed of one or more lens elements.

Note that the light-source-side focal surface 72a of the fly eye lens 72 and the reticle-side focal surface 72b have, as a matter of course, the Fourier transform relation. Hence, in the example of FIG. 1, the reticle-side focal surface 72b of the fly eye lens 72, i.e., the fly eye lens exit surface, has the image forming (conjugate) relation with the diffraction grating pattern plate 12.

Now, the reticle 27 is illuminated to have a homogeneous illuminating distribution with the luminous flux emerging from the reticle-side focal surface 72b of the fly eye lens 72 via condenser lenses 74, 75 and a mirror 24. In accordance with this embodiment, the spatial filter 16 composed of a metal plate or the like and bored with two openings corresponding to the (±) primary diffracted light components from the diffraction grating pattern plate 12 is disposed in the vicinity of the reticle-side focal surface 72b (exit side) of the fly eye lens 72. The 0th-order diffracted light component from the diffraction grating pattern plate 12 is thereby cut off. The illumination light with which the reticle patterns 28 are illuminated are therefore limited to the one having two secondary illuminant images in the positions eccentric from the optical axis AX on the reticle-side focal surface 72b of the fly eye lens 72. The diffraction grating pattern plate 12 is employed as an optical member for concentrating the illumination light on the light-source-side focal surface 72a of the fly eye lens 72. Formed are the two secondary illuminant images symmetric with respect to the optical axis AX. Hence, the illumination light with which the reticle patterns 28 are illuminated are limited to only the luminous fluxes having specific incident angles on the reticle patterns 28. As discussed above, the image of the diffraction grating pattern plate 12 is formed on the reticle-side focal surface 72b of the fly eye lens 72. The reticle-side focal surface 72b and the reticle pattern surfaces 28 have the Fourier transform surface relation. This eliminates such possibilities that the image of the diffraction grating pattern plate 12 itself is formed on the reticle 27 to deteriorate the illuminance homogeneity, and further there is produced the ununiformity due to the dusts and the defects of the diffraction grating pattern plate 12. Note that the spatial filter 16 is provided in close proximity to the light-source-side focal surface 72b of the fly eye lens 72, i.e., on the side of the exit surface of the fly eye lens 72; but this filter may be provided on the reticle-side focal surface 72a, i.e., on the side of the incident surface.

The diffracted light generated from the reticle patterns 28 on the thus illuminated reticle 27 is, as in the same way explained with reference to FIG. 40, condensed and image-formed by the telecentric projection optical system 29. The image of the reticle patterns 28 is transferred on the wafer 30.

Figure 21:
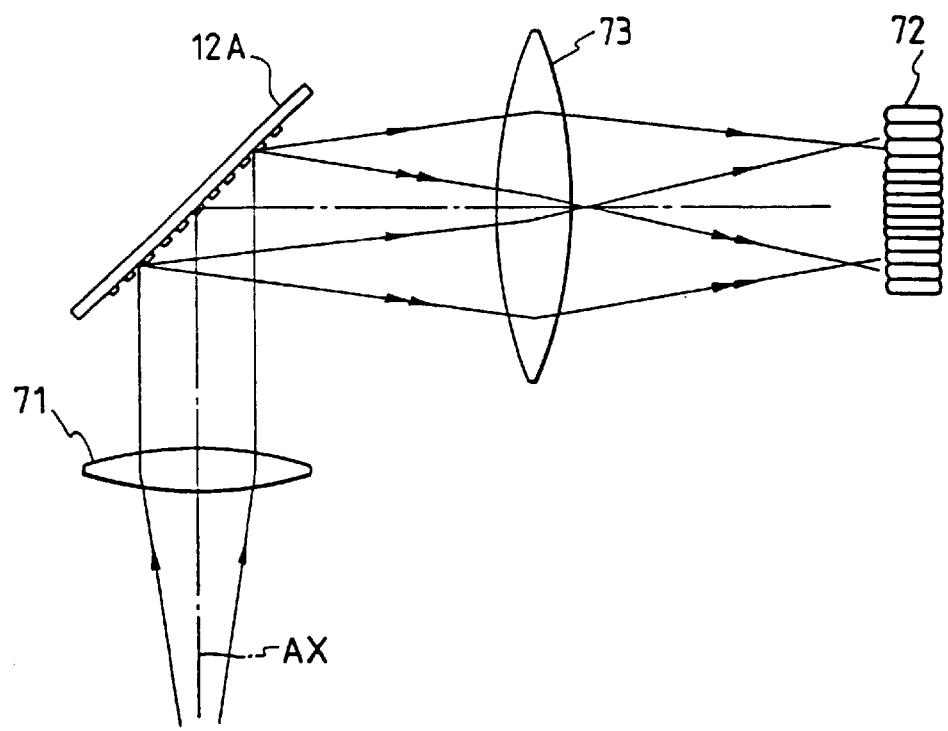
FIGS. 21, 22, 23, 24 and 25 are views each showing a part of an input optical system.

The diffraction grating pattern plate 12 may be not only the transmissive pattern plate similar to that in the first embodiment but also a reflective pattern plate. If the diffraction grating pattern plate 12 exhibits a reflective property, as illustrated in FIG. 21, a reflective diffraction grating pattern plate 12A is, as depicted in FIG. 8, illuminated with the illumination luminous flux from the relay lens 71. The diffracted light reflected and diffracted therein may be incident on the fly eye lens 72. The constructions toward the light source from the relay lens 71 and toward the reticle from the fly eye lens 72 are the same as those of FIG. 20. At this time, as in the first embodiment, the incident directions and incident angles of the illumination luminous fluxes (plural) incident on the reticle patterns 28 of the reticle 27 are determined depending on the reticle patterns 28. The incident directions and angles are arbitrarily adjustable by changing directivities and pitches of the diffraction grating pattern plates 12, 12A. For instance, diffraction grating patterns 5, 5a are replaced with those having different pitches, thereby making variable the illumination light incident on the light-source-side focal surface 72a of the fly eye lens 72 and further making variable a distance of the secondary illuminant image from the optical axis AX on the reticle-side focal surface 72b of the fly eye lens 72. It is therefore feasible to make variable the incident angle of the illumination light on the reticle patterns 28 of the reticle 27. As in the first embodiment, when the diffraction grating pattern plates 12, 12A are made rotatable (e.g., through 90°) in an, arbitrary direction within the surface vertical to the optical axis AX, it is possible to correspond to the case where the pitch direction of the line-and-space patterns of the reticle patterns 28 is different from the directions x, y. Further, the relay lens 73 may come under a zoom lens system (such as an afocal zoom expander, etc.) consisting of a plurality of lens elements, and the condensing position can be varied by changing the focal distance. At this time, however, it is required to keep substantially the Fourier transform relation between the diffraction grating pattern plate 12 or 12A and the light-source-side focal surface 72a of the fly eye lens 72. The optical member for concentrating the illumination light on the light-source-side focal surface 72a of the fly eye lens 72 described above is not limited to the diffraction grating pattern plate 12 or 12A.

Figure 22:
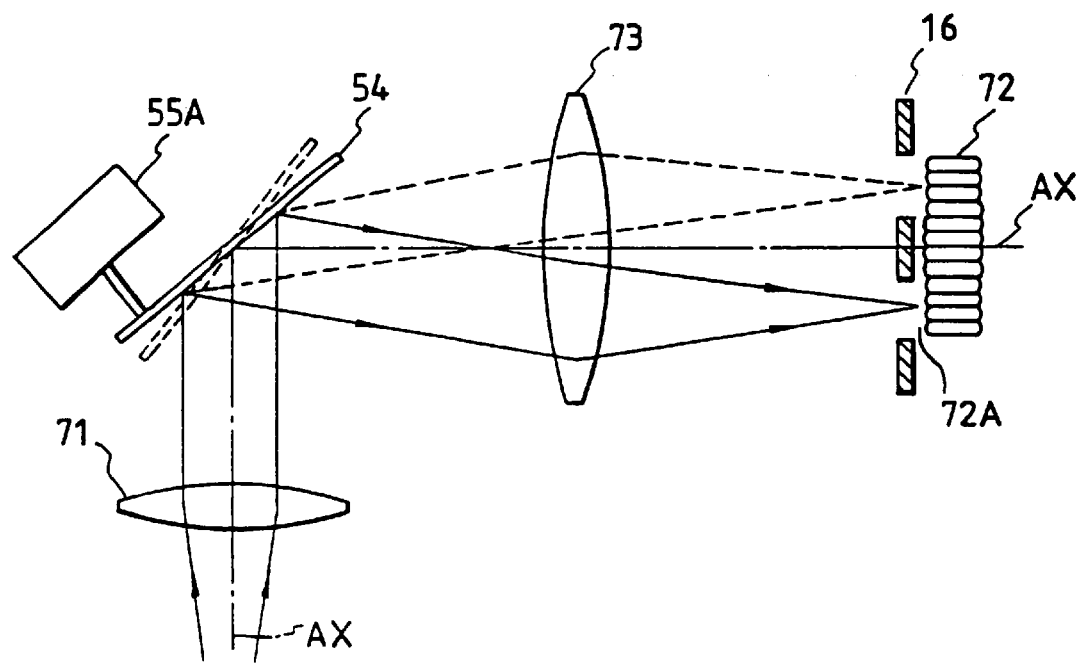

As depicted in FIG. 22, the movable optical member shown in the second embodiment, e.g., a movable plane mirror 54 is disposed instead of the reflective diffraction grating pattern plate 12A illustrated in FIG. 21. Provided also is a drive member 55*a* such as a motor for making the plane mirror 54 rotatable. The plane mirror 54 is rotated or oscillated by the drive member 55*a*. The illumination light is incident on the light-source-side focal surface 72*a* of the fly eye lens 72, whereby the secondary illuminant image of the reticle-side focal surface 72*b* of the fly eye lens 72 can be varied according to the time. If the plane mirror 54 is rotated to a plurality of proper angular positions during the exposing process, the secondary illuminant image of the reticle-side focal surface 72*b* of the fly eye lens 72 can be formed in arbitrary configurations. Note that when using this type of movable reflection mirror 54, the relay lens system 73 may be omitted. By the way, the spatial filter 16 depicted in FIG. 22 is provided on the side of the incident surface of the fly eye lens 72 but may be, as in the same way with FIG. 20, provided on the side of the exit surface.

The optical member for concentrating the illumination light on the light-source-side focal surface 72*a* of the fly eye lens 72 may involve the use of the beam splitter shown in FIG. 11, the optical fibers of FIGS. 12 and 19, the prism of FIG. 9, the plurality of mirrors of FIG. 10 and the optical member of FIG. 17.

Figure 23:
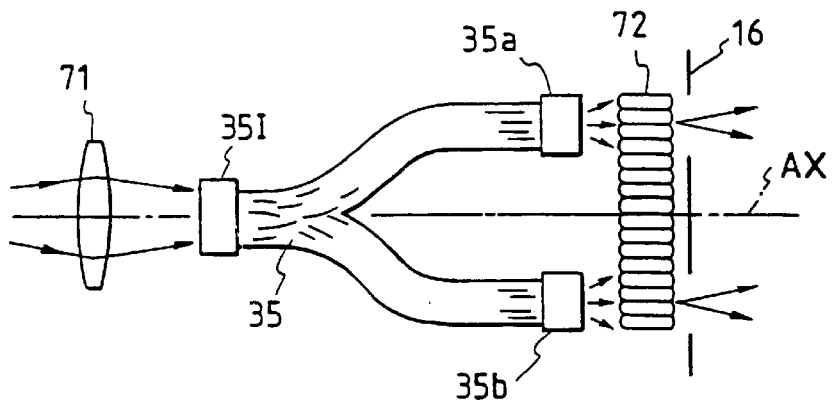

FIG. 23 is a schematic diagram wherein an optical fiber bundle 35 is employed. The constructions toward the light source from the relay lens 71 and toward the reticle from the fly eye lens 72 are the same as those shown in FIG. 20. Respective exit portions 35*a*, 35*b* of the optical fiber bundle 35 are disposed in positions corresponding to the reticle patterns 28 in the vicinity of the light-source-side focal surface 72*a* of the fly eye lens. At this time, lenses (e.g., field lenses) may be interposed between the respective exit portions 35*a*, 35*b* of the optical fiber bundle 35 and the fly eye lens 72. Further, there may be given the Fourier transform relation between the light-source-side focal surface 72*a* of the fly eye lens and the light exit surfaces of the optical fiber exit portions 35*a*, 35*b* owing to the lenses interposed therebetween. As in the first embodiment, the respective exit portions (or the lenses between the exit portions 35*a*, 35*b* and the fly eye lens 72) are made movable one-dimensionally or two-dimensionally within the surface perpendicular to the optical axis by means of the drive member such as a motor, etc. The illumination light incident on the light-source-side focal surface of the fly eye lens is thereby made variable. The secondary illuminant image on the reticle-side focal surface 72*b* of the fly eye lens is also made variable.

Figure 24:
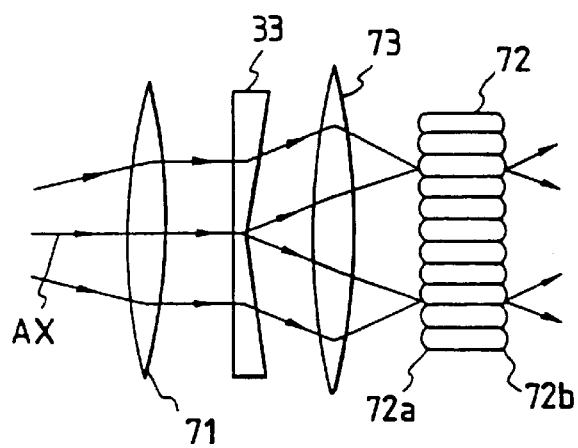

FIG. 24 shows an example of using a prism 33 having a plurality of refraction surfaces as an optical member for concentrating the illumination light on the light-source-side focal surface 72*a* of the fly eye lens 72. The illumination luminous fluxes can be incident on the light-source-side focal surface 72*a* of the fly eye lens 72 in accordance with refraction angles of the prism 33. The constructions toward the light source from the relay lens 71 and toward the reticle from the fly eye lens 72 are the same as those of FIG. 20. The incident position of the illumination luminous flux incident on the light-source-side focal surface 72*a* of the fly eye lens is made variable by replacing the prism 33. In place of the prism 33, a reflection mirror having differently-angled reflection surfaces is used and, as illustrated in FIG. 22, disposed, thereby eliminating the necessity for the drive member 55*a*. The device, as a matter of course, incorporates a function to exchange the prism and the like. When employing this type of prism also, the relay lens system 73 may be omitted.

Figure 25:
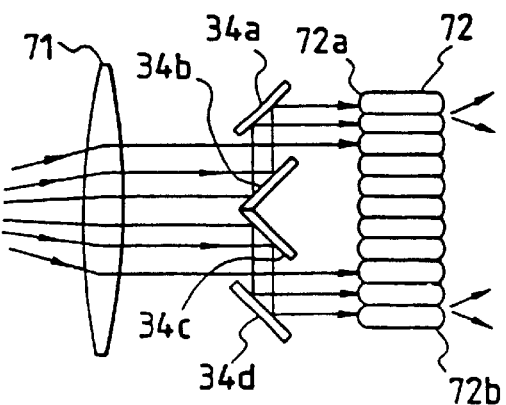

FIG. 25 shows an example where a plurality of mirrors 34*a*–34*d* are used as optical members for condensing the illumination light on the light-source-side focal surface 72*a* of the fly eye lens 72. The constructions toward the light source from the relay lens 71 and toward the reticle from the fly eye lens 72 are the same as those of FIG. 20. Provided in the respective mirrors 34*a*–34*d* are position adjusting mechanisms and mechanisms for adjusting an angle of rotation about the optical axis AX by which a illumination light quantity distribution on the light-source-side focal surface 72*a* of the fly eye lens 72 is made arbitrarily variable. Besides, the prism 33 may be combined with the movable plane mirror 54 or with the mirrors 34*a*–34*d*.

Further, the optical member for concentrating the illumination light on the light-source-side focal surface 72*a* of the fly eye lens 72 may be replaced with the spatial filter 16 provided in the vicinity of the light-source-side focal surface 72*a* of the fly eye lens. The components in the embodiments shown in FIGS. 20 through 25 may be combined with the spatial filter 16. At this time, the number of openings of the spatial filter 16 is not 1 but may be arbitrary numbers corresponding to the reticle patterns 28.

Figure 26:
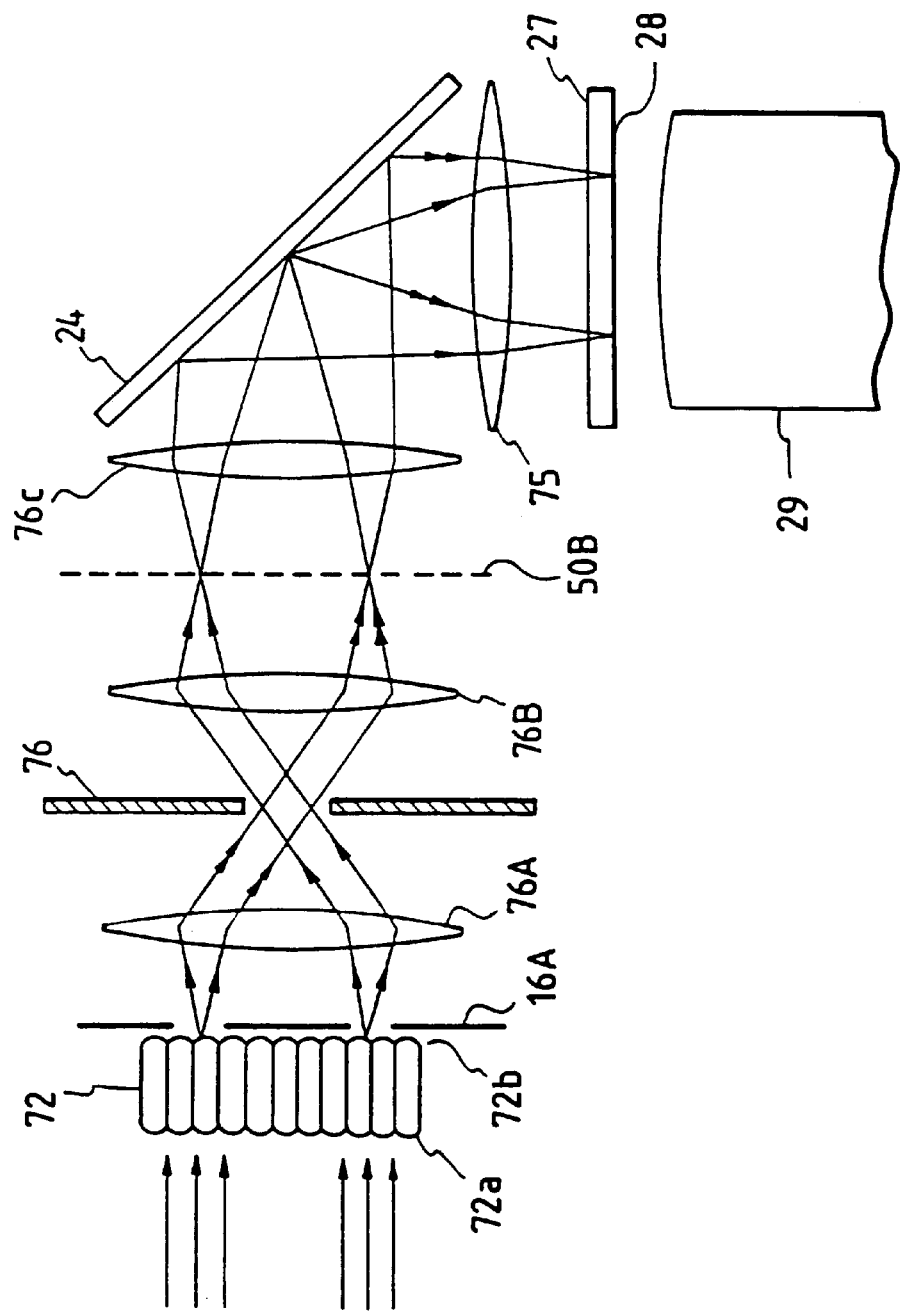
FIG. 26 is a view showing an illumination system when incorporating a reticle blind into the exposure apparatus of FIG. 20.

FIG. 26 is a diagram depicting a construction of the projection type exposure apparatus in a further embodiment of this invention. The mirror 24, the condenser lens 75, the reticle 27 and the projection optical system 29 are the same as those shown in FIG. 20. As a construction toward the light source from the fly eye lens 72, any one of the examples shown in FIGS. 20 through 25 and the example in which the spatial filter 16 is provided in the vicinity of the light-source-side focal surface 72*a* of the fly eye lens 72. A spatial filter 16A formed with arbitrary openings (transmissive portions, or further semitransmissive portions) is provided in close proximity to the reticle-side focal surface 72*b* of the fly eye lens 72. The illumination luminous flux emerging from the fly eye lens 72 is thereby regulated. The Fourier transform surface of a reticle-side focal surface 72*b* of the fly eye lens 72 with respect to a relay lens 76A is defined as a conjugate surface to the reticle patterns 28, and hence a variable field stop (reticle blind) 76 is provided therein. The illumination luminous flux is Fourier-transformed again by the relay lens 76B and reaches a conjugate surface (Fourier surface) 50B of the reticle-side focal surface 72B of the fly eye lens 72. The above-mentioned spatial filter 16A may be provided on the Fourier surface 50B. The illumination luminous flux from the fly eye lens 72 is further guided to the reticle 27 with the aid of the condenser lenses 76B, 75 and the mirror 24. Note that if there exists a system for condensing the illumination light on the position eccentric by a quantity from the optical axis which is determined corresponding to the reticle patterns 28 on the light-source-side focal surface 72A of the fly eye lens 72, the spatial filter may not be disposed in the position of the optical member 16A or 50B.

In this case also, the field stop (reticle blind) 76 is usable.

Shown is the example where the plural beams of illumination light come from the optical member for concentrating the illumination light on the light-source-side focal surface 72*a* of the fly eye lens 72 described above. However, one luminous flux may be incident on the position eccentric by a predetermined quantity from the optical axis AX. For example, one exit portion of the fiber bundle 35 shown in FIG. 23 is prepared, while one luminous flux may be incident on the light-source-side focal surface 72A of the fly eye lens 72.

In all the embodiments of FIGS. 20 through 26, a diameter of one opening of the spatial filters 16, 16A is desirably set so that a ratio, a so-called σ-value, of a numerical aperture for the reticle 27 associated with the illumination luminous fluxes penetrating the openings to a reticle-side numerical aperture ($NA_R$) of the projection optical system 29 is approximately 0.1 to 0.3.

For satisfying the condition of the σ-value determined by one illumination luminous flux incident on the light-source-side focal surface 72a of the fly eye lens 72, a function to make the σ-value variable may be given to an optical member for concentrating the illumination light on the light-source-side focal surface 72a of the fly eye lens and making variable a light quantity distribution in the vicinity of the focal surface 72a in place of the spatial filter 16A disposed close to the reticle-side focal surface 72b of the fly eye lens 72. For instance, the spatial filter 16 is disposed on the light-source-side focal surface 72a of the fly eye lens, and the σ-value per luminous flux may be determined by the diameter of the opening thereof. Concomitantly, it is possible to further optimize the σ-value and NA in the form of the projection system by providing a variable aperture stop (NA regulating stop) in the vicinity of the pupil (incident pupil or exit pupil) 51 within the projection optical system 29. The spatial filter 16 also exhibits an effect to shield unnecessary luminous fluxes among the fluxes generated from the optical member for condensing the illumination light on the light-source-side focal surface 72a of the fly eye lens 72. This filter further exhibits an effect to reduce the quantity of light which reaches the wafer by decreasing a transmissivity of the opening with respect to specific luminous fluxes.

It is preferable to determine (change) the incident position (position of the secondary illuminant image on the light-source-side focal surface 72b of the fly eye lens 72) of (one or plural) illumination luminous flux(es) on the light-source-side focal surface 72a of the fly eye lens 72 in accordance with the reticle patterns to be transferred. In this case, the method of determining the position is that, as stated earlier, the incident position (incident angle Φ) of the illumination luminous flux from the fly eye lens 72 on the reticle patterns may be set to obtain the effect of improving the resolving power and focal depth that are optimal to the degree of fineness (pitch) of the patterns to be transferred. A concrete example of the positional determination of the secondary illuminant image (surface illuminant image) is the same as the determining method explained in the first embodiment with reference to FIGS. 14 and 15. It is assumed that the central position (the optimum position of the gravity of the light quantity distribution created by one secondary illuminant image) of one secondary illuminant image is, as illustrated in FIG. 15B, on the Y-directional line segment Lα presumed within the Fourier transform surface. Alternatively, it is assumed that the centers of the respective secondary illuminant images are placed on arbitrary positions on the line segment Lβ, or, as illustrated in FIG. 15D, on the line segments Lα, Lβ defined such as $\alpha=\beta=f\cdot(½)\cdot(\lambda/Px)$ or on the line segments Lγ, Lε defined such is $\gamma=\epsilon=f\cdot(½)\cdot(\lambda/Py)$. Based on these assumptions, the focal depth can be maximized. As in the first embodiment, the 0th-order diffracted light component Do coming from the reticle patterns 28 and any one of the (+) primary diffracted light component Dp and the (−) primary diffracted light component Dm may be arranged to pass through the light paths having the equal distances from the optical axis AX on the pupil surface 51 within the projection optical system 29. If the reticle patterns 28, as seen in FIG. 15D, contain the two-dimensional periodic patterns, and when paying the attention to one specific 0th-order diffracted light component, there probably exist higher-order diffracted light components than the primary light components which are distributed in the X-direction (the first direction) and in the Y-direction (the second direction) about the single 0th-order diffracted light component on the pupil surface 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components distributed in the second direction and one specific 0th-order diffracted light component are distributed at the substantially equal distances from the optical axis AX on the pupil surface 51 of the projection optical system. For instance, the central position of the exit portion in FIG. 15D is arranged to coincide with any one of points Pξ, Pη, Pκ, Pμ. The points Pξ, Pη, Pκ, Pμ are all intersections of the line segment Lα or Lβ (the optimum position to the X-directional periodicity, i.e., the position in which the 0th-order diffracted light component and one of the (±) primary diffracted light components in the X-direction have the substantially equal distances from the optical axis on the pupil surface 51 of the projection optical system) and line segments Lγ, Lε (the optimum positions to the Y-directional periodicity). Therefore, those positions are the light source positions optimal to either the pattern direction X or the pattern direction Y.

Note that in this embodiment, an arbitrary light quantity distribution can be, as in the first embodiment, formed on the Fourier transform surface by controlling the luminous flux transform member and the movable optical member on the basis of the information of bar codes and the like.

A light scattering member such as a diffusion plate and an optical fiber bundle are provided in close proximity to the light-source-side focal surface 72a of the fly eye lens 11, thereby homogenizing the illumination light. Alternatively, the illumination light may be homogenized by employing an optical integrator such as a further fly eye lens (hereinafter referred to as the other fly eye lens) separately from the fly eye lens 72 used in the embodiments of the present invention. At this time, the other fly eye lens is disposed preferably closer to the light source (lamp) 1 than the optical member e.g., the diffraction grating pattern plate 12 or 12A shown in FIGS. 20 and 21 for making variable the illumination light quantity distribution in the vicinity of the light-source-side focal surface 72a of the fly eye lens 72. A sectional configuration of each lens element of the other fly eye lens is desirably a regular hexagon rather than a square (rectangle).

Figure 27:
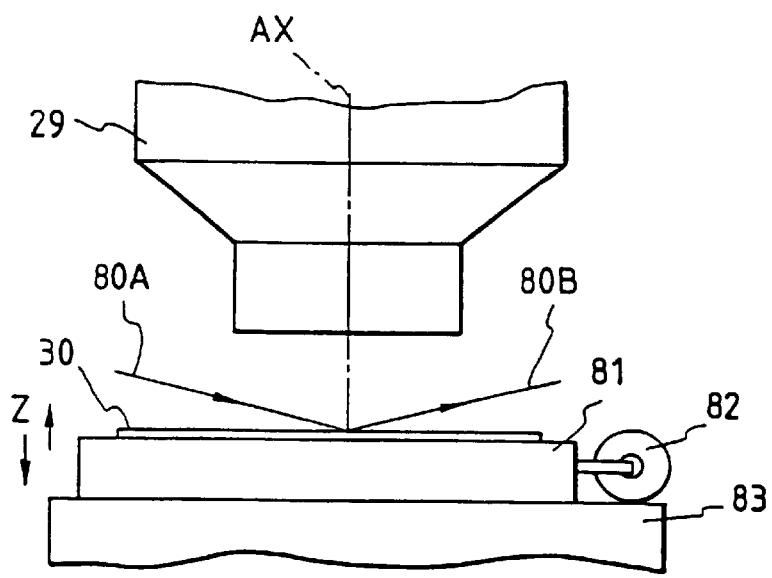
FIG. 27 is a view depicting a configuration about a wafer stage of the projection type exposure apparatus in the third embodiment of the present invention.

FIG. 27 illustrates a configuration ambient to a wafer stage of the projection exposure apparatus applied to the respective embodiments of this invention. A beam 80A obliquely strikes on an interior of a projection field region on the wafer 30 in the projection optical system 29. Provided is an auto-focus sensor of an oblique incidence system which receives a reflected beam 80B. This focus sensor detects a deviation in the optical-axis direction AX between the surface of the wafer 30 and the best image forming surface of the projection optical system 29. A motor 82 of a Z-stage 81 mounted with the wafer 30 is servo-controlled so that the deviation becomes zero. The Z-stage 81 is thereby moved slightly in the vertical directions (optical-axis directions) with respect to an XY-stage 83, wherein the exposure is executed invariably in the best focus state. In the exposure apparatus capable of this focus controlling process, the Z-stage 81 is moved with such a velocity characteristic as to be controlled in the optical-axis directions during the exposing process. An apparent focal depth can be thereby further enlarged. This method is attainable by any type of steppers on condition that the image side (wafer side) of the projection optical system 29 is telecentric.

Figures 28A, 28B:
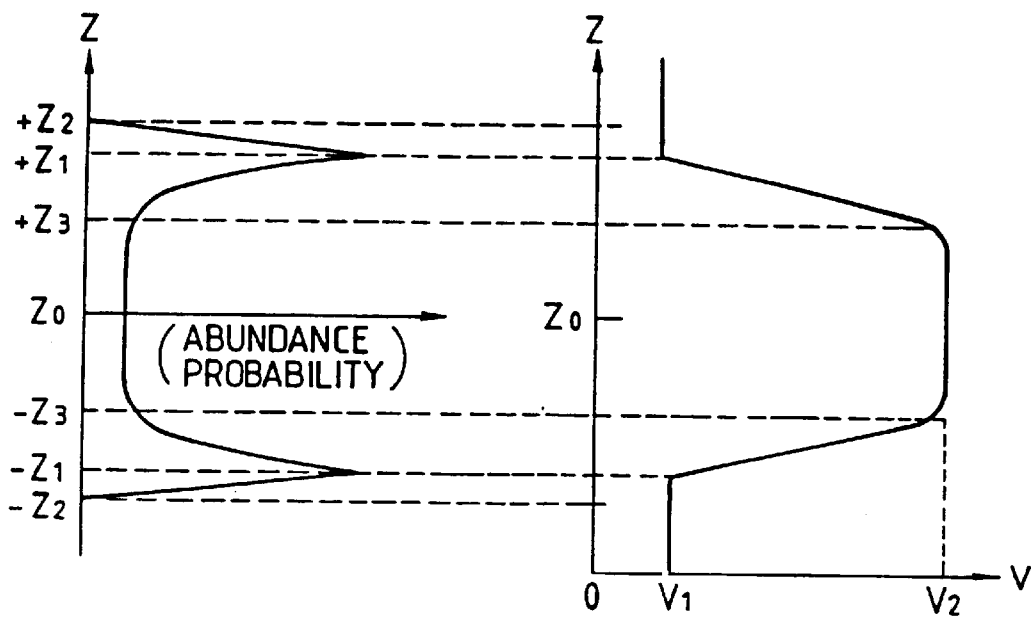
FIGS. 28A and 28B are graphic charts each showing velocity characteristics of a Z-stage and abundance probabilities of the exposure quantity when executing a cumulative focal point exposure method by use of the Z-stage of the wafer stage.

FIG. 28 shows light quantity (dose) distributions in the optical-axis directions which are obtained within the resist layers with a movement of the Z-stage 81 during the exposure or abundance probabilities. FIG. 28B shows velocity characteristics of the Z-stage 81 for obtaining the distribution illustrated in FIG. 28A. Referring to FIGS. 28A and 28B, the axis of ordinate indicates wafer positions in Z-direction (optical-axis direction). The axis of abscissa of FIG. 28A indicates the abundance probability. The axis of abscissa of FIG. 28B indicates a velocity of the Z-stage 81. In the same Figures, a position Zo is the best focus position.

The abundance probabilities are herein arranged to be substantially equal maximal values in two positions +Z1, −Z1 spaced vertically from the position Z0 by a theoretical focal depth ±ΔDof of the projection optical system 29. In a range from +Z3 to −Z3 therebetween, the abundance probabilities are restrained down to small values. For this purpose, the Z-stage 81 moves up and down equally at a low velocity V1 in the position −Z2 when starting a release of the shutter within the illumination system. Immediately after the shutter has been fully opened, the Z-stage is accelerated up to a high velocity V2. While the Z-stage 81 moves up and down at the velocity V2, the abundance probabilities are restrained down to the small values. Just when reaching the position +Z3, the Z-stage 81 starts decelerating down to the low velocity V1. The abundance probability comes to the maximal value in the position +Z1. At this moment, a closing command of the shutter is outputted almost simultaneously. The shutter is completely closed in the position +Z2.

In this manner, the velocity of the Z-stage 81 is controlled so that the optical-axis-directional light quantity distributions (abundance probabilities) of the exposure quantities imparted to the resist layers of the wafer 30 are arranged to be the maximal values at the two points spaced away by approximately a width ($2 \cdot \Delta D_0$ f) of the focal depth. Although a contrast of the patterns formed on the resist layers is a little bit reduced, the uniform resolving power can be obtained over a wide range in the optical-axis directions.

The above-described cumulative focal point exposure method is applicable in much the same manner to the projection exposure apparatus which adopts the special illumination method shown in this embodiment. The apparent focal depth is enlarged by a quantity corresponding substantially to a product of an enlarge portion obtained by the illumination method of this invention and an enlarged portion obtained by the cumulative focal point exposure method. Besides, since the special illumination method is adopted, the resolving power itself also increases. For instance, the minimum line width possible to exposure by combining an i-beam stepper (NA 0.42 of the projection lens) which is contracted one-fifth that the prior art with a phase shift reticle is approximately 0.3 to 0.35 μm. An enlargement rate of the focal depth is about 40% at the maximum. In contrast, the special illumination method according to the present invention is incorporated into the i-beam stepper, and a test is carried out with the ordinary reticle. As a result, the minimum line width of 0.25–0.3 μm is obtained. Obtained also is much the same enlargement rate of the focal depth as that in using the phase shift reticle.

Figure 29:
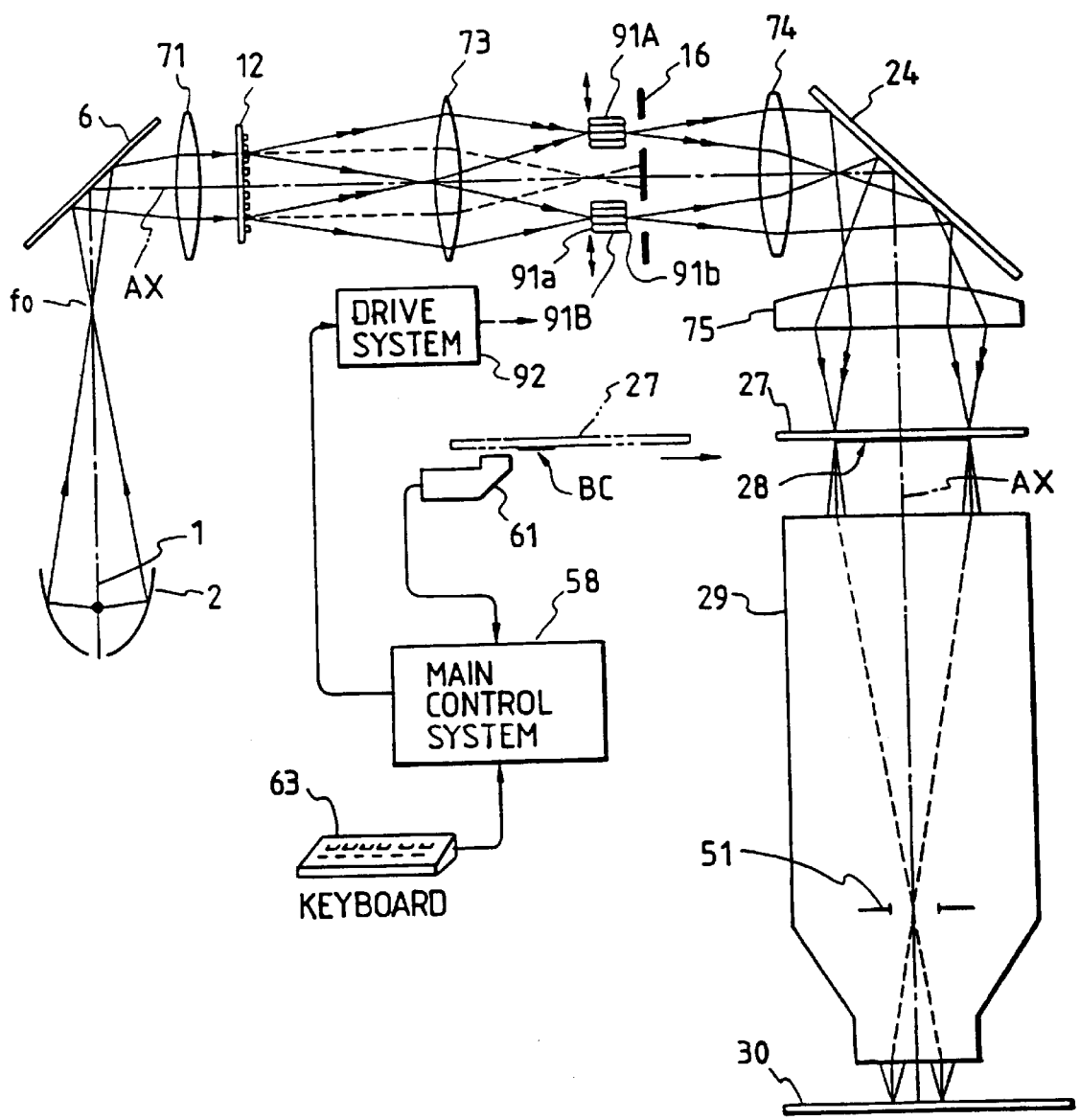
FIG. 29 is a view schematically illustrating a projection type exposure apparatus in a fourth embodiment of the present invention.

A fourth embodiment of the present invention will next be described. FIG. 29 depicts a projection type exposure apparatus (stepper) in the fourth embodiment of this invention. The fly eye lens is divided into a plurality of fly eye lens groups. The light quantity distribution is focused on each of the fly eye lens groups. The diffraction grating pattern plate 12 is provided as an optical member (a part of the input optical system of this invention) for focusing the light quantity distribution of the illumination light on each of light-source-side focal surfaces 91a of the fly eye lens groups 91A, 91B. Note that the constructions toward the light source from the relay lens system 71 and toward the wafer 30 from the spatial filter 16 are the same as those of FIG. 20, and the same members are marked with the like symbols.

The diffracted light generated from the diffraction grating pattern plate 12 is incident in concentration on each of the fly eye lens groups 91A, 91B via the relay lens 73. At this moment, the light-source-side focal surfaces 91a of the fly eye lens groups 91A, 91B and the diffraction grating pattern plate 12 have substantially the Fourier transform relation through the relay lens 73.

On the other hand, reticle-side focal surfaces 91b of the fly eye lens groups 91A, 91B are disposed in an intra-surface direction perpendicular to the optical axis AX so as to coincide substantially with the Fourier transform surface (pupil conjugate surface) of the reticle patterns 28. Each of the fly eye lens groups 91A, 91B is independently movable in the intra-surface direction vertical to the optical axis AX and held by a movable member (position adjusting member in the present invention) for making the lens group movable. The detailed explanation thereof will be given later.

The individual fly eye lens groups 91A, 91B desirably assume the same configuration and are composed of the same material (refractive index). Respective lens elements of the individual fly eye lens groups 91A, 91B are double-convex lenses as in the third embodiment. Given therein is the example where the light-source-side focal surface 91a coincide with the incident surface, and the reticle-side focal surface 91b coincide with the exit surface. The fly eye lens elements may not strictly satisfy this relation but may be plano-convex lenses, convexo-plane lenses or plano-concave lenses. Note that the light-source-side focal surfaces 91a of the fly eye lens groups and the reticle-side focal surfaces thereof have, as a matter of course, the Fourier transform relation. Hence, in the example of FIG. 29, the reticle-side focal surfaces 91b of the fly eye lens groups— i.e., the exit surfaces of the fly eye lens groups 91A, 91B—have an image forming (conjugate) relation to the diffraction grating pattern plate 12.

Now, the reticle 27 is illuminated in a homogeneous illuminance distribution with the luminous fluxes emitted from the reticle-side focal surfaces 91b of the fly eye lens groups 91A, 91B through the condenser lenses 74, 75 and the mirror 24. In accordance with this embodiment, the spatial filter 16 is disposed on the exit side of the fly eye lens groups 91A, 91B, thereby cutting off the 0th-order diffracted light components from the diffraction grating pattern plate 12. The openings of the spatial filter 16 correspond to the respective positions of the fly eye lens groups 91A, 91B. For this reason, the illumination light quantity distributions in the vicinity of the reticle-side focal surfaces 91b of the fly eye lens groups 91A, 91B can be made zero in portions other than the positions of the fly eye lens groups 91A, 91B. Therefore, the illumination light with which the reticle patterns 28 are illuminated is limited to the luminous fluxes (from the secondary illuminant images) emitted from the respective fly eye lens groups 91A, 91B. Hence, the luminous fluxes incident on the reticle patterns are limited to those having specific incident angles (plural) thereon.

Note that in the embodiment, each of the fly eye lens groups 91A, 91B is movable, and the openings of the spatial filter 16 are correspondingly movable; or alternatively the spatial filter 16 itself has to be exchangeable (the spatial filter 16 will be mentioned later). The illumination luminous fluxes are diffracted by use of the foregoing diffraction grating pattern plate 12. The diffracted light components are concentrated on the specific positions (fly eye lens groups) within the light-source-side focal surfaces of the fly eye lens groups 91A, 91B. On this occasion, the concentrated positions are varied depending on the pitch and the directivity of the diffraction grating pattern plate 12. Therefore, the pitch and the directivity of the diffraction grating pattern plate 12 are determined to concentrate the illumination light on the positions of the fly eye lens groups 91A, 91B.

As discussed above, the image of the diffraction grating pattern plate 12 is formed on the reticle-side focal surface 91*b* of the fly eye lens 91. As in the third embodiment described above, however, the reticle pattern surfaces 28 and the reticle-side focal surfaces 91*b* of the fly eye lens groups 91A, 91B have the Fourier transform relation. There is no possibility wherein the illumination intensity distribution on the reticle 27 is unhomogenized, or the illuminance homogeneity is deteriorated.

The diffraction grating pattern plate 12 may, as explained in the third embodiment referring to FIG. 21, be not only the transmissive pattern plate but also the reflective pattern plate.

Figure 30:
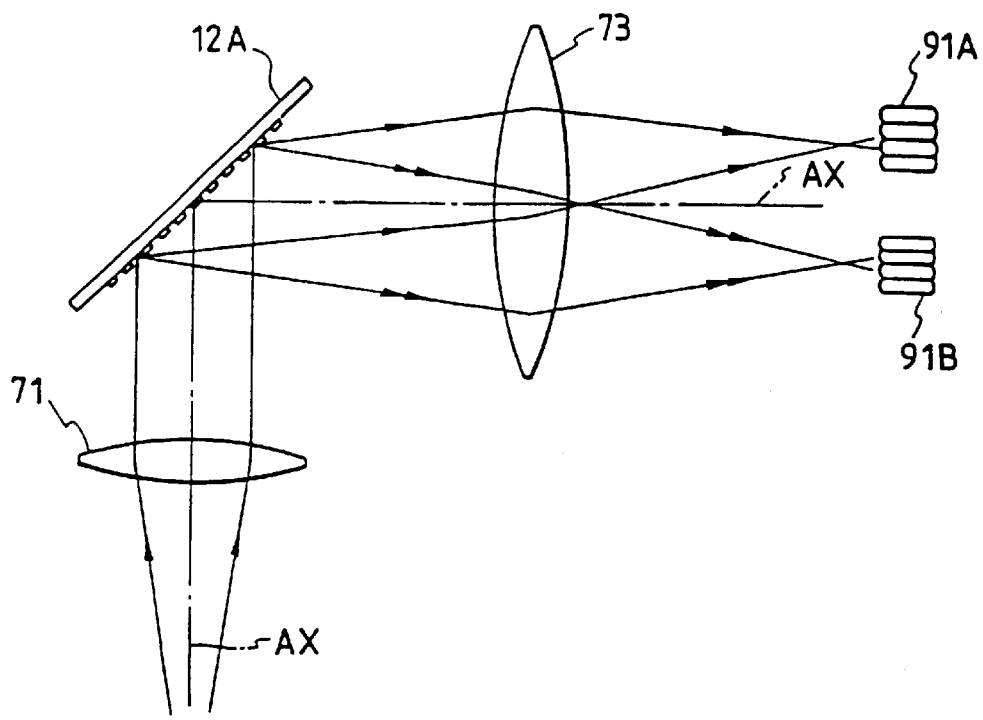
FIGS. 30, 31, 32, 33 and 34 are views showing variant forms of the input optical system.

If the diffraction grating pattern plate 12 is reflective, as illustrated in FIG. 30, the diffracted light components reflected by the reflective diffraction grating pattern plate 12A are concentrated in the vicinity of the fly eye lens groups 91A, 91B through the relay lens 73. Incidentally, the diffraction grating pattern plate 12 or 12A is exchangeable with a plate having a different pitch so that the illumination light can be concentrated in the vicinity of the respective fly eye lens groups 91A, 91B even when the individual fly eye lens groups 91A, 91B move. The diffraction grating pattern plate 12 or 12A may be rotatable in an arbitrary direction within the surface vertical to the optical axis AX. In this case, however, the Fourier transform relation between the diffraction grating pattern plate 12 or 12A and the light-source-side focal surfaces 91*a* of the fly eye lens groups 91A, 91B should be kept.

By the way, referring to FIG. 29, as in the first embodiment, there are provided a main control system 58 for generalizing and controlling the device, a bar code reader 61, a keyboard 63 and a drive system (motor, gear train, etc.) such as movable members for moving the fly eye lens groups 91A, 91B. Registered beforehand in the main control system 58 are names of a plurality of reticles dealt with by the stepper and stepper operating parameters corresponding to these names. When the bar code reader 61 reads reticle bar codes BC, the main control system 58 outputs, to the drive system 92, the previously registered information on the moving positions (within the Fourier transform surface) of the fly eye lens groups 91A, 91B as one of the operating parameters corresponding to the names. The positions of the fly eye lens groups 91A, 91B are thereby adjusted to form the optimum light quantity distributions described in the first embodiment. The operations given above can be also executed even by inputting the commands and data directly from the keyboard 63.

The optical members (input optical system) are not limited to the diffraction grating pattern plates 12, 12A, these optical members being intended to concentrate the light quantity distributions over the light-source-side focal surfaces of the fly eye lens groups 91A, 91B on the portions in the vicinity of the individual fly eye lens positions. As in the cases shown in FIGS. 22–25 in accordance with the third embodiment, the movable plane mirror, the optical fibers, the prism and the reflection mirror are available.

Figure 31:
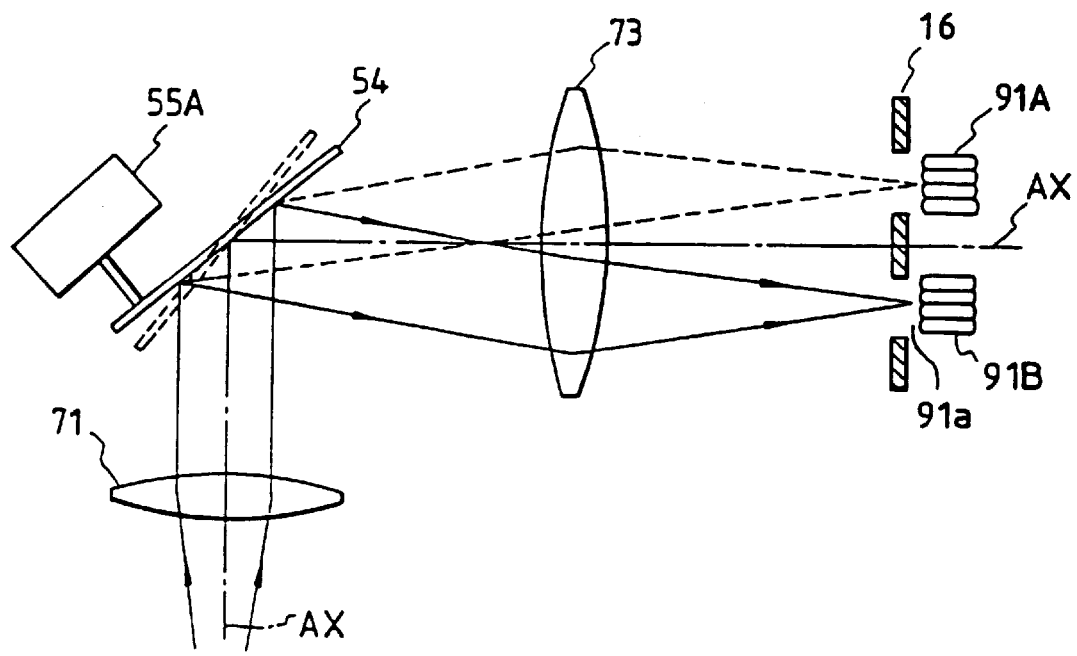

FIG. 31 shows the case where the movable plane mirror 54 is employed as an input optical system. The constructions toward the light source from the relay lens system 71 and toward the reticle from the fly eye lens group 91 are the same as those of FIG. 29. The plane mirror 54 is rotated to a plurality of angular positions during the exposure, thereby making it possible to concentrate the light quantity distributions over the light-source-side focal surfaces 91*a* of the fly eye lens groups 91A, 91B on only the portion vicinal to the position of one fly eye lens group of the plurality of the fly eye lens groups. Note that when using this type of movable plane mirror 54, the relay lens system 73 may be omitted. Further, when each of the fly eye lens groups 91A, 91B moves, angular coordinates of the plurality of angular positions of the plane mirror 54 are changed, and the reflected luminous fluxes may be concentrated in the vicinity of the position of the fly eye lens group in a new position. Incidentally, the spatial filter 16 illustrated in FIG. 31 is provided on the side of the incident surfaces of the fly eye lens groups 91A, 91B but may be provided on the side of the exit surfaces as seen in FIG. 29.

Figure 32:
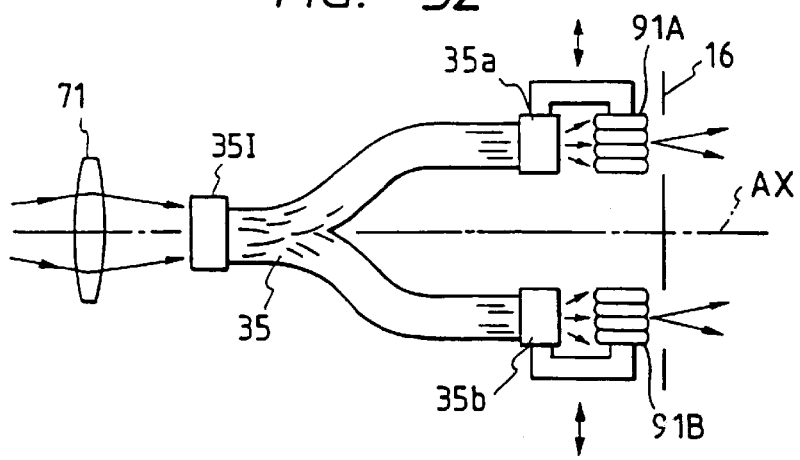

FIG. 32 shows a case of using the optical fibers of the input optical system. The exit portions 35A, 35B provided corresponding to the number of the fly eye lens groups 91A, 91B are constructed integrally with the respective fly eye lens groups in the close proximity to the light-source-side focal surfaces 91*a* of the fly eye lens groups 91A, 91B.

The exit portions 35A, 35B (or the lenses between the exit portions 35 and the fly eye lens groups 91) are one-dimensionally or two-dimensionally movable within the surface vertical to the optical axis by means of the drive members such as motors. Even when the individual fly eye lens groups 91A, 91B are gathered up, the illumination luminous fluxes can be concentrated in the vicinity of the position of each of the fly eye lens groups after being moved.

Figure 33:
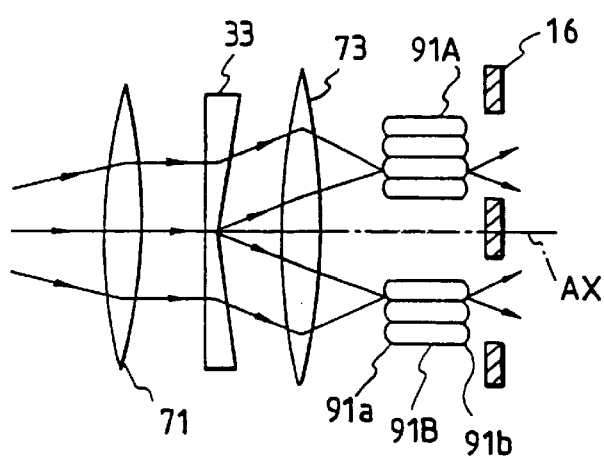

FIG. 33 shows a case of employing the prism 33 formed with a plurality of refractive surfaces as an input optical system. The illumination light can be concentrated in the vicinity of each of the fly eye lens groups 91A, 91B in accordance with a refractive angle of the prism 33 on the light-source-side focal surfaces 91*a* of the fly eye lens groups 91A, 91B. Even when the respective fly eye lens groups 91A, 91B move by exchanging the prism 33, the illumination light can be exactly concentrated on the position of each of the fly eye lens groups 91A, 91B. The device, as a matter of course, incorporates a function to exchange the prism or the like. Where this type of prism is employed, the relay lens system 73 can be omitted.

Figure 34:
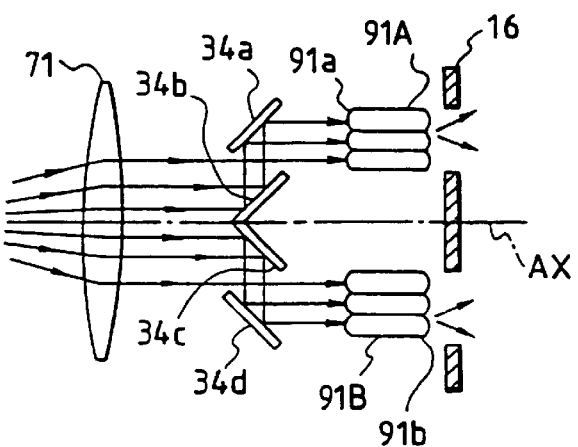

FIG. 34 shows a case where a plurality of mirrors are used as an input optical system. When each of the mirrors 34A–34D is provided with a position adjusting mechanism and a mechanism for adjusting an angle of rotation about the optical axis AX, and even after the individual fly eye lens groups 91A, 91B have moved, the illumination luminous fluxes can be focused in the vicinity of the respective fly eye lens groups 91A, 91B. A numerical value of the mirrors is not limited. The mirrors may be disposed depending on a numerical value of the fly eye lens groups.

Two groups of the fly eye lenses are prepared throughout the fourth embodiment described above, however, three or more groups of the fly eye lenses may be of course prepared. Stated also is the optical member for concentrating the illumination light mainly on the two portions of the individual fly eye lens groups. The illumination light is, as a matter of course, concentrated on a plurality of positions corresponding to the number of the fly eye lens groups. In all the embodiments given above, the illumination light can be concentrated on arbitrary positions (corresponding to the positions of the fly eye lens groups). The optical member for concentrating the illumination light on the respective fly eye lens groups is not limited to the types exemplified in the embodiments but may adopt any other types.

Besides, the spatial filter 16 provided in close proximity to the light-source-side focal surfaces 91a of the fly eye lenses may be employed in combination with the respective embodiments shown in FIGS. 29 through 34. Spatial filters 210, 16 can be, though not limited to the reticle-side focal surfaces 91b and light-source-side focal surfaces 91a of the fly eye lens groups, disposed in arbitrary positions. For example, the spatial filter is disposed suitably between the above-described two focal surfaces 91a, 91b.

The optical member for concentrating the illumination light only in the vicinity of the individual fly eye lens groups 91A, 91B is intended to prevent a loss in quantity of the illumination light with which the reticle 27 is illuminated. The optical member is not associated directly with the constitution for obtaining the effects of the high resolving power and large focal depth that are characteristic of the projection type exposure apparatus according to the present invention. Hence, the optical member may be only a lens system having a large diameter enough to make the illumination light incident in flood on each of the fly eye lens groups after being adjusted in terms of position.

In the construction, depicted in FIG. 26, of the third embodiment, the spatial filter 16A may be provided, or a variable field stop 76 may also be provided as in the same way with the third embodiment. The spatial filter 16A is placed on the reticle-side focal surface 91b of the fly eye lens group 91 or in the vicinity of the conjugate surface thereof, thereby regulating the illumination luminous fluxes emerging from the fly eye lens groups 91A, 91B. Note that if there is a system capable of focusing the illumination luminous fluxes incident on the fly eye lens groups 91A, 91B only thereon effectively, the spatial filter 16 may not be provided on the reticle-side focal surface 91b or in the vicinity of the conjugate surface thereof.

For satisfying the condition of the σ-value ($0.1 \leq \sigma \leq 0.3$) determined by one of the fly eye lens groups, a magnitude (in the intra-surface direction vertical to the optical axis) of the exit end areas of each of the fly eye lens groups 91A, 91B may be determined to match with the illumination luminous fluxes (exit luminous fluxes).

A variable aperture stop (equivalent to the spatial filter 16) is provided in the vicinity of the reticle-side focal surface 91b of each of the fly eye lens groups 91A, 91B, and the numerical aperture of the luminous flux from each of the fly eye lens groups is made variable, thus changing the σ-value. Correspondingly, the variable aperture stop (NA regulating stop) is disposed close to the pupil (incident pupil or exit pupil) 51 of the projection optical system 29, thereby further optimizing the σ-value with respect to NA in the projection system.

The illumination of the luminous fluxes incident on the respective fly eye lens groups expands to some extent outwardly of the incident end surfaces of the fly eye lens groups. Besides, if the distributions in quantity of the light incident on the respective fly eye lens groups are uniform, the illuminance homogeneity on the reticle pattern surfaces can be preferably further enhanced.

Next, an embodiment of the movable portions for making the fly eye lens groups movable will be explained in conjunction with FIGS. 35 and 36.

Figure 35:
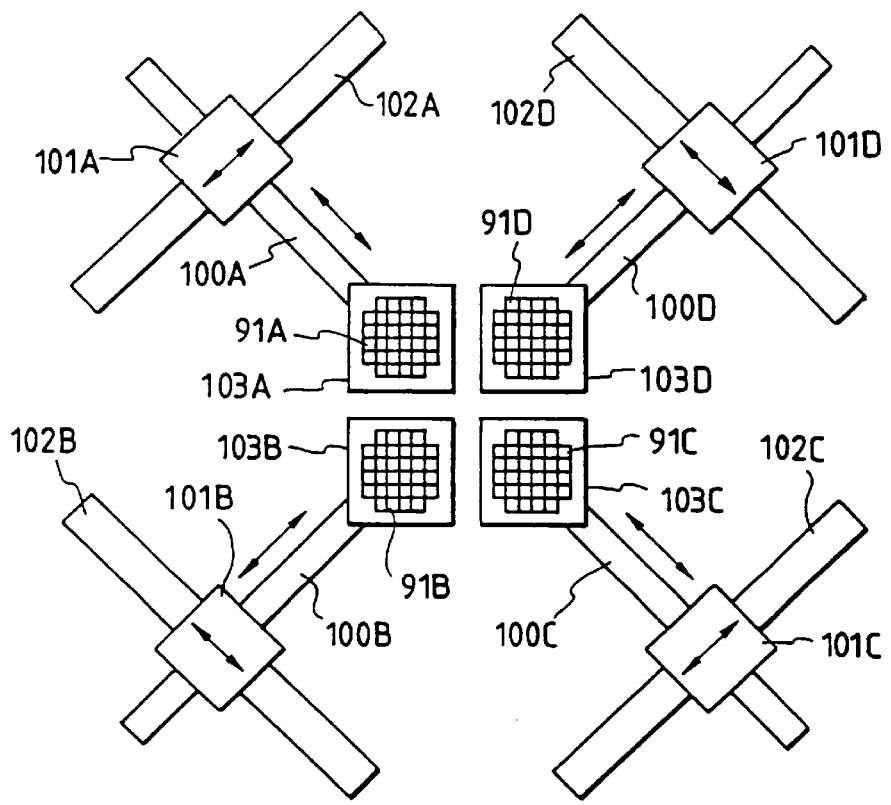
FIG. 35 is a plan view taken substantially in the optical-axis direction, showing a placement of movable fly eye lens groups and a construction of a movable member thereof.

FIG. 35 is a diagram illustrating the movable portions viewed from the optical-axis direction. FIG. 36 is a diagram showing the same viewed from the direction vertical to the optical axis.

A plurality of, i.e., four fly eye lens groups 91A, 91B, 91C, 91D are disposed at substantially equal distances from the optical axis in FIG. 35. Each of the fly eye lens groups 91A, 91B, 91C, 91D is, as illustrated in FIG. 35, composed of, though not limited to this, 32 pieces of lens elements. In an extreme case, the fly eye lens group may be constructed of one lens element. Now, turning to FIGS. 35 and 36, the fly eye lens groups 91A, 91B, 91C, 91D are held by jigs 103a, 103b, 103c, 103d. These jigs 103a, 103b, 103c, 103d are further supported on movable members 101a, 101b, 101c, 101d through support bars 100a, 100b, 100c, 100d. These support bars 100a, 100b, 100c, 100d are stretchable and contractible in the optical-axis direction with the aid of drive elements such as motors and gears incorporated into the movable members 101a, 101b, 101c, 101d. The movable members 101a, 101b, 101c, 101d themselves are movable along fixed guides 102a, 102b, 102c, 102d. The individual fly eye lens groups 91A, 91B, 91C, 91D are therefore independently movable in the intra-surface direction perpendicular to the optical axis.

Figure 36:
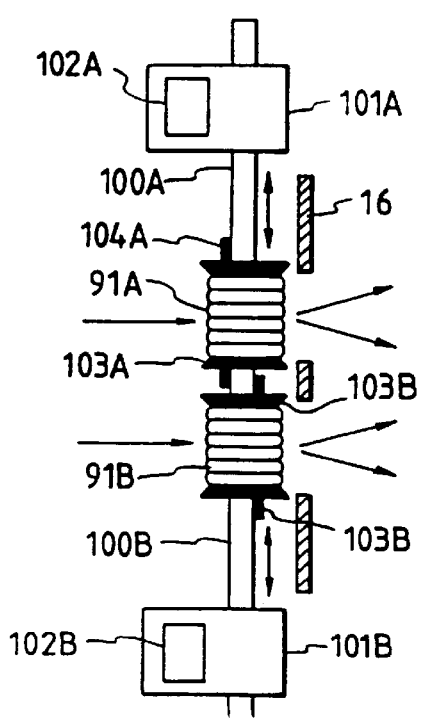
FIG. 36 is a view taken substantially in the direction vertical to the optical axis, showing the construction of FIG. 35.

Respective positions (within the surface vertical to the optical axis) of the fly eye lens groups 91A, 91B, 91C, 91D depicted in FIG. 36 are determined (changed) preferably depending on the reticle patterns to be transferred.

Figure 14:
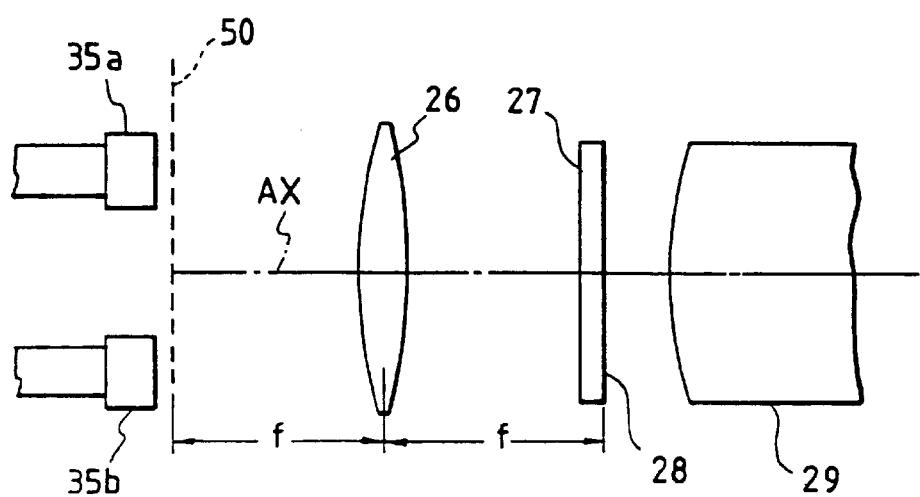
FIG. 14 is a view schematically showing a light path from the Fourier transform surface for the reticle to the projection optical system in the projection type exposure apparatus according to the first embodiment of the present invention.

The optimum positions of the respective fly eye lens groups are set under the same conditions as those explained referring to FIGS. 14 and 15 in the first embodiment.

A concrete example of the positional determination of each of the fly eye lens groups is the same as the determining method explained in the first embodiment with reference to FIGS. 14 and 15. It is assumed that the central position (the optimum position of the gravity of the light quantity distribution of the secondary illuminant image which is created by each of the fly eye lens groups) of each of the fly eye lens groups is, as illustrated in FIG. 15B, on the Y-directional line segment Lα presumed within the Fourier transform surface. Alternatively, it is assumed that the center of each of the fly eye lens groups is placed on an arbitrary position on the line segment Lβ, or, as illustrated in FIG. 15D, on the line segments Lα, Lβ defined such as $\alpha = \beta = f \cdot (½) \cdot (\lambda/Px)$ or on the line segments Lγ, Lε defined such as $\gamma = \epsilon = f \cdot (½) \cdot (\lambda/Py)$. Based on these assumptions, the focal depth can be maximized. As in the first embodiment, the 0th-order diffracted light component Do coming from the reticle patterns 28 and any one of the (+) primary diffracted light component Dp and the (−) primary diffracted light component Dm may be arranged to pass through the light paths having the equal distances from the optical axis AX on the pupil surface 51 within the projection optical system 29. If the reticle patterns 28, as seen in FIG. 15D, contain the two-dimensional periodic patterns, and when paying the attention to one specific 0th-order diffracted light component, there probably exist higher-order diffracted light components than the primary light components which are distributed in the X-direction (the first direction) and in the Y-direction (the second direction) about the single 0th-order diffracted light component on the pupil surface 51 of the projection optical system. Supposing that the image of the two-dimensional patterns is formed well with respect to one specific 0th-order diffracted light component, the position of the specific 0th-order diffracted light component may be adjusted so that three light components i.e., one of the higher-order diffracted light components distributed in the first direction, one of the higher-order diffracted light components distributed in the second direction and one specific 0th-order diffracted light component are distributed at the substantially equal distances from the optical axis AX on the pupil surface 51 of the projection optical system. For instance, the central position of the exit portion in FIG. 15D is arranged to coincide with any one of points $P\xi$, $P\eta$, $P\kappa$, $P\mu$. The points $P\xi$, $P\eta$, $P\kappa$, $P\mu$ are all intersections of the line segment $L\alpha$ or $L\beta$ (the optimum position to the X-directional periodicity, i.e., the position in which the 0th-order diffracted light component and one of the (±) primary diffracted light components in the X-direction have the substantially equal distances from the optical axis on the pupil surface 51 of the projection optical system) and line segments $L\gamma$, $L\epsilon$ (the optimum positions to the Y-directional periodicity). Therefore, those positions are the light source positions optimal to either the pattern direction X or the pattern direction Y.

Note that in this embodiment, an arbitrary light quantity distribution can be, as in the first embodiment, formed on the Fourier transform surface by controlling the luminous flux transform member and the movable optical member on the basis of the information of bar codes and the like. In this case, the fly eye lens groups 91A to 91D are disposed not only discretely but also integrally about the optical axis, whereby a changeover to the ordinary illumination can be performed.

A light scattering member such as a diffusion plate and an optical fiber bundle are provided in close proximity to the light-source-side focal surface 91a of the fly eye lens 91, thereby homogenizing the illumination light. Alternatively, the illumination light may be homogenized by employing an optical integrator such as a further fly eye lens (hereinafter referred to as the other fly eye lens) separately from the fly eye lens 72 used in the embodiments of the present invention. At this time, the other fly eye lens is disposed preferably closer to the light source (lamp) 1 than the optical member e.g., the diffraction grating pattern plate 12 or 12A shown in FIGS. 29 and 30 for making variable the illumination light quantity distribution in the vicinity of the light-source-side focal surface 91a of the fly eye lens 91. A sectional configuration of each lens element of the other fly eye lens is desirably a regular hexagon rather than a square (rectangle). In this case, the σ-value may be made variable by making the numerical aperture of the illumination system variable while providing an aperture stop on the reticle-side focal surface of the other fly eye lens. Further, the σ-value may be also made variable by changing a magnitude of the luminous flux incident on the other fly eye lens while providing a zoom lens (afocal zoom lens) on the light path leading from the light source up to the other fly eye lens.

Given above is the example of determining the positions of the plurality of fly eye lens groups. The illumination luminous fluxes are concentrated corresponding to the moving positions of the respective fly eye lens groups by means of the foregoing optical members (the diffraction grating pattern plate, the movable mirror, the prism or the fibers). The optical member for this concentrating process may not be provided.

The luminous fluxes emitted from the fly eye lens groups are incident obliquely on the reticle. If a direction of the light quantity gravity of the (plural) incident luminous fluxes inclined thereto is not perpendicular to the reticle, there arises a problem in which a position of the transferred image shifts in the intra-surface direction of the wafer during minute defocusing of the wafer 30. In order to prevent this shift, the direction of the light quantity gravity of the (plural) illumination luminous fluxes from the fly eye lens groups is kept vertical to the reticle patterns, viz., parallel to the optical axis AX.

More specifically, on the assumption that the optical axis (central line) is set in the respective fly eye lens groups, it may be sufficient to make zero a vector sum of a product of the intra Fourier transform surface positional vector of the optical axis (central line) on the basis of the optical axis AX of the projection optical system 29 and a quantity of light emitted from each of the fly eye lens groups. An easier method is that 2m-groups (m is the natural number) of fly eye lenses are provided; positions of m-groups of the fly eye lenses are determined by the optimizing method described above; and remaining m-groups and the former m-groups of fly eye lenses are disposed in symmetry with respect to the optical axis AX.

If the device further includes n-groups (n is the natural number), and when the number of groups of the fly eye lenses is set to m smaller than n, the remaining (n−m) groups of fly eye lenses may not be used. To eliminate the use of the (n−m) groups of fly eye lenses, the spatial filters 210 or 16 may be provided on the positions of (n−m) groups of fly eye lenses. At this time, the optical member for concentrating the illumination light on the positions of (n−m) groups of fly eye lenses preferably does not concentrate the light on the (n−m) groups of fly eye lenses.

The positions of openings of the spatial filter 210 or 16 are desirably variable corresponding to the movements of the fly eye lens groups. Alternatively, there is provided a mechanism for exchanging the spatial filters 210, 16 in accordance with the positions of the respective fly eye lenses. The device may incorporate some kinds of light shielding members.

As depicted in FIG. 36, each of the jigs 103a, 103b, 103c, 103d for holding the respective fly eye lens groups 91A, 91B, 91C, 91D has light shielding blades 104a, 104b. In this case, the opening of the spatial filter 16 may be formed considerably larger than the diameter of the fly eye lens. Hence, one spatial filter 16 is capable of corresponding to the positions of a variety of fly eye lenses. If the light shielding blades 194a, 194b deviate slightly in the optical-axis direction, a constraint given to the moving range of the fly eye lens groups is reduced.

Light scattering members such as diffusion plates and optical fibers are employed in the vicinity of the light-source-side focal surfaces 91a of the fly eye lens groups 91A, 91B, 91C, 91D, thereby homogenizing the illumination light.

A fifth embodiment will be next explained. Provided in this embodiment is a holding member for integrally holding the plurality of fly eye lens groups. The fly eye lens groups held in the optimum placement are selectable by driving the holding member.

Figure 37:
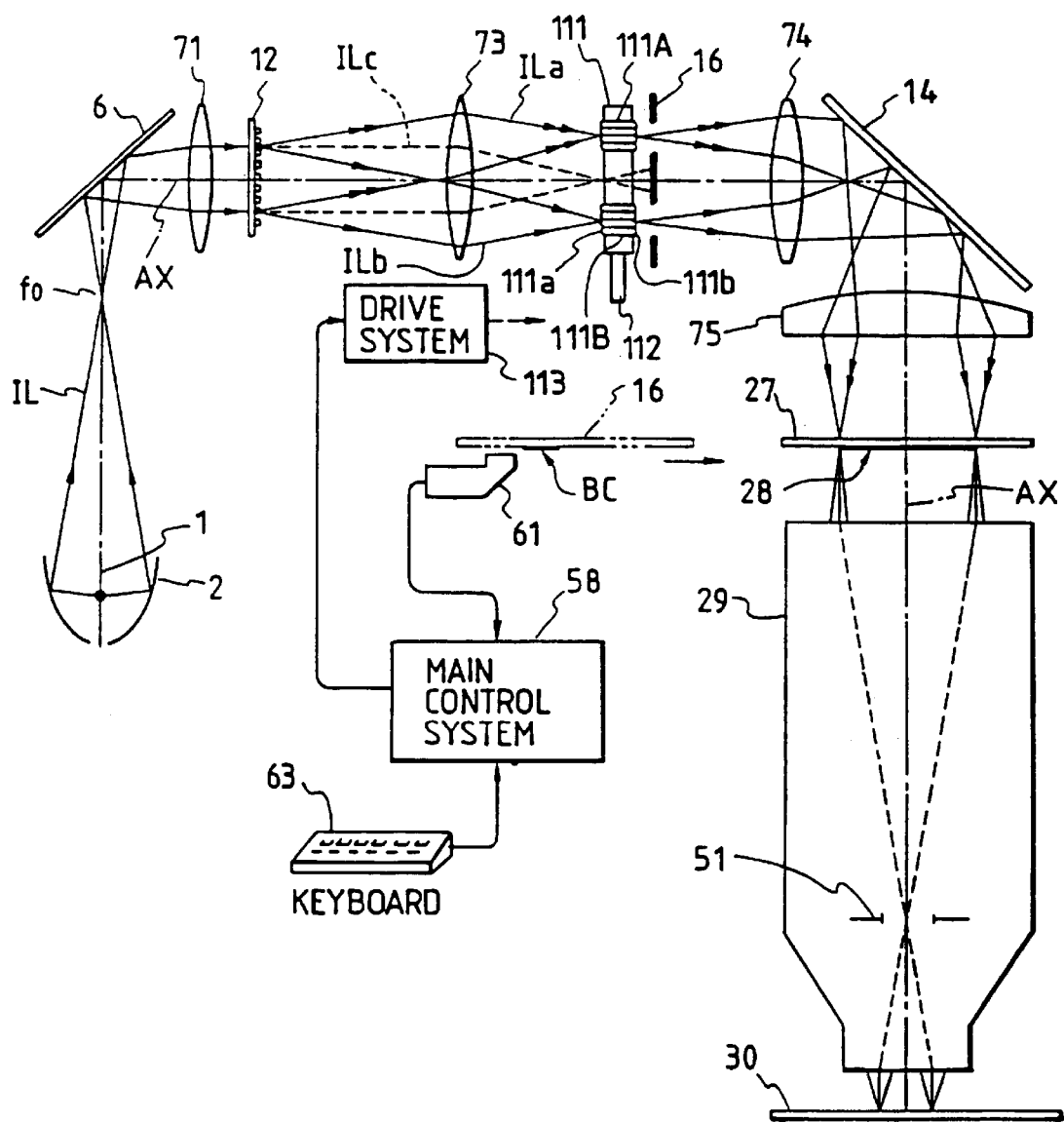
FIG. 37 is a view schematically illustrating a projection type exposure apparatus in a fifth embodiment of the present invention.

FIG. 37 illustrates a construction of the projection type exposure apparatus in the fifth embodiment of the present invention. The diffraction grating pattern plate 12 is given as an optical member (a part of the input optical system) for concentrating the light quantity distributions of the illumination light on the light-source-side focal surfaces of the fly eye lens groups. Note that the same members as those in FIG. 29 are marked with the like symbols.

A holding member 111 integrally holds fly eye lens groups 111A, 111B so that the center (in other words, the gravity of the each of the light quantity distributions created by the secondary illuminant images in the respective fly eye lens groups 111A, 111B) of each of the fly eye lens groups 111A, 111B is set in a discrete position eccentric from the optical axis AX by a quantity determined depending on the periodicity of the reticle patterns. Fixed integrally to a movable member 112 (switching member in this invention) together with the holding member 111 are a plurality of holding member (not illustrated) for holding the plurality of fly eye lens groups while making their eccentric states relative to the optical axis AX different from each other in accordance with a difference in terms of the periodicity of the reticle patterns 28. This movable member 112 is driven, with the result that the plurality of holding members can be so disposed in the light path of the illumination optical system as to be individually exchangeable. The detailed description thereof will be given later.

Each of the plurality of fly eye lens groups (111A, 111B) fixed by the same holding member desirably assumes the same configuration and is composed of the same material (refractive index). In this embodiment, the holding members (fly eye lens groups 111A, 111B) are exchangeable, and hence the openings of the spatial filter 16 have to be variable correspondingly; or alternatively, the spatial filter 16 has to be also exchangeable. For instance, the spatial filter 16 is fixed to the holding member together with the fly eye lens groups 111A, 111B, and desirably they are arranged to be integrally exchangeable. Note that a magnitude (thickness) of the luminous flux incident on each of the fly eye lens groups 111A, 111B is set equal to or smaller than a magnitude of each of the light-source-side focal surfaces 111a of the fly eye lens groups 111A, 111B. In this case, the spatial filter 16 is not particularly, as a matter of course, provided in the illumination optical system (in the vicinity of the fly eye lens groups).

The diffraction grating pattern plate 5 or 5A may be rotatable in an arbitrary direction within the surface vertical to the optical axis AX. With this arrangement, it is possible to correspond to such a case that the pitch direction of the line-and-space patterns of the reticle patterns 28 is different from the directions X, Y (i.e., the fly eye lens groups 111A, 111B move in the pitch direction (rotate about the optical axis AX)).

Provided according to this embodiment, as in the fourth embodiment, the main control system 58 for generalizing and controlling the device, the bar code reader 61, the keyboard 63 and the drive system (motor, gear train, etc.) 92 of movable members for moving the fly eye lens groups 111A, 111B. Registered beforehand in the main control system 58 are names of a plurality of reticles dealt with by the stepper and stepper operating parameters corresponding to the names. Then, the main control system 58 outputs, when the bar code reader 61 reads the reticle bar codes BC, a predetermined drive command to the drive system 113 by selecting one of the plurality of holding members which matches best with the previously registered information (corresponding to the periodicity of the reticle patterns) on the positions (within the pupil conjugate surface) of the fly eye lens groups 111A, 111B as one of the operating parameters corresponding to the names thereof. The fly eye lens groups 111A, 111B held by the previously selected holding member are thereby set in the positions shown in FIGS. 14 and 15 in the first embodiment. The operations described above are executable even by the operator's inputting the commands and the data from the keyboard 63 directly to the main control system 58.

The optical member (input optical system) is not limited to the transmissive diffraction grating pattern plate 12, this optical member being intended to concentrate the light quantity distributions over the light-source-side focal surfaces of the fly eye lens groups in the vicinity of the positions of the individual fly eye lenses. As explained in the fourth embodiment with reference to FIGS. 30–34, the reflective diffraction grating pattern plate 12A, the movable plane mirror 54, the optical fibers 35, the prism 33 and the plurality of reflection mirrors 34 may be provided in place of the diffraction grating pattern plate 12. Additionally, the diffraction grating pattern plates 12, 12A and the prism 33 are replaced; or a plurality of angular position coordinates of the movable plane mirror 54 are changed; or the exit portions of the optical fibers are made movable; or each of the reflection mirrors is provided with the position adjusting mechanism and the mechanism for adjusting the angle of rotation about the optical axis AX. With these arrangements, if the fly eye lens groups move with the replacement of the holding member, the illumination luminous fluxes can be concentrated in the vicinity of the positions of the respective fly eye lens groups after being moved.

As in the fourth embodiment, the spatial filter 16 may be replaced with the spatial filter 10 shown in FIG. 12 or used in combination with the above-mentioned input optical system. The placement of the spatial filters 10, 16 is not limited to the light-source-side focal surfaces 111a and the reticle-side focal surfaces 111a of the fly eye lens groups but may be disposed in arbitrary positions. Further, the optical member (input optical system) for concentrating the illumination light only in the vicinity of the individual fly eye lens groups 111A, 111B may be only a lens having a large diameter enough to make the illumination light incident in flood on each of the plurality of fly eye lens groups.

As explained in the fourth embodiment in conjunction with FIG. 26, the spatial filter 16A and the field stop may be provided.

Next, a construction of the movable member 112 (switching member in the present invention) for exchanging the holding member will be described referring to FIGS. 38 and 39.

Figure 38:
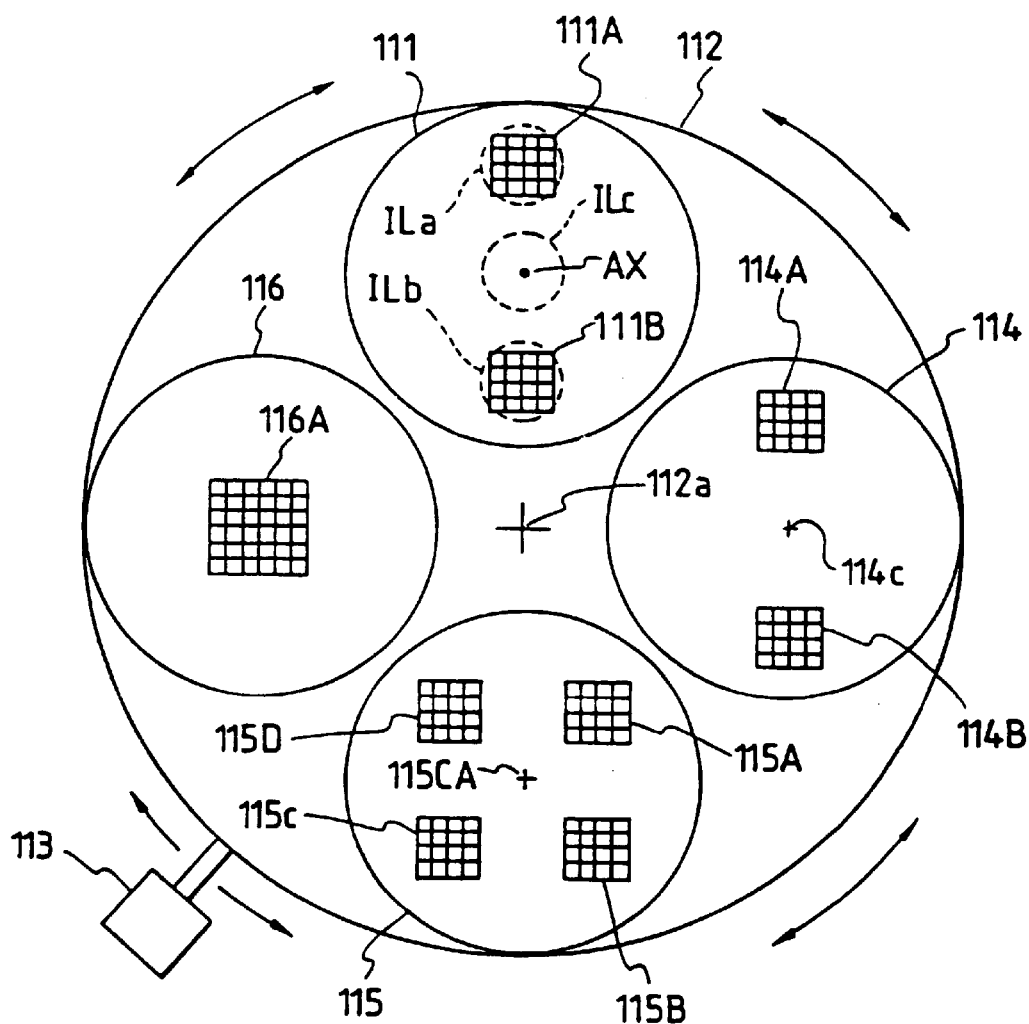
FIG. 38 is a view depicting a concrete construction of the movable member (switching member of this invention) for exchanging four pieces of holding members consisting of a plurality of fly eye lens groups.

FIG. 38 shows a concrete construction of the movable member. Four pieces of holding members 111, 114, 115, 116 are herein disposed at intervals of approximately 90 degrees on the movable member (turret plate) 112 rotatable about a rotary axis 112a. FIG. 38 illustrates a situation in which illumination luminous fluxes IL$a$, IL$b$ (dotted lines) are incident on the respective fly eye lens groups 111A, 111B; and the holding member 111 is disposed in the illumination optical system. At this time, the holding member 111 is placed in the illumination optical system so that the center of this member coincides substantially with the optical axis AX. The plurality of fly eye lens groups 111A, 111B are held integrally by the holding member 111 so that the centers of these lens groups are set in discrete positions eccentric from the optical axis AX of the illumination optical system by a quantity determined depending on the periodicity of the reticle patterns. These lens groups are placed substantially in symmetry with respect to the center (optical axis AX) of the holding member 111.

Now, each of the four holding members 111, 114, 115, 116 holds the plurality of fly eye lens groups while making their eccentric states (i.e., positions within the surface substantially perpendicular to the optical axis AX) from the optical axis AX (center of the holding member) different from each other in accordance with a difference in terms of the periodicity of the reticle patterns 28. Both of the holding members 111, 114 have two fly eye lens groups (111A, 111B) and (114A, 114B). These fly eye lens groups are, when being disposed in the illumination optical system, fixed so that their array directions are substantially orthogonal to each other. The holding member 115 places and fixes the four fly eye lens groups 115A–115D substantially at equal distances from the center 115cA (optical axis AX) thereof. In accordance with this embodiment, the holding member 116, which fixes one fly eye lens group 116A substantially at the center, is used for effecting the exposure based on a known method.

As is obvious from FIG. 38, the turret plate 112 is rotated by the drive element 117 consisting of a motor and a gear, as stated earlier, in accordance with the information of the reticle bar codes BC. The four holding members 111, 114, 115, 116 are thereby exchanged, and the desired holding member corresponding to the periodicity (pitch, array direction, etc.) of the reticle patterns can be disposed in the illumination optical system.

Selected, as discussed above, in accordance with the information of the reticle bar codes BC is whether to effect either the known exposure for forming the light quantity distributions substantially about the optical axis on the Fourier transform surface or the exposure by the inclined illumination light explained in this embodiment. In the case of performing the known exposure, the holding member 116 is selected. In the case of performing the exposure based on the inclined illumination light, any one of the holding members 111, 114, 115 may be selected. When executing the known exposure, and if the holding member 116 is selected, it is required that the input optical system be exchanged for effecting the illumination as it used to be done. If the illumination light can be concentrated through the lens 71 on the fly eye lens group 116A, the input optical system such as fibers, it may be sufficient, retreat from within the light path.

In each of the four holding members, the plurality of fly eye lens groups are herein fixed in a predetermined positional relation, and hence there is no necessity for performing the positional adjustment between the plurality of fly eye lens groups when exchanging the holding member. Therefore, positioning of the holding members as a whole may be effected with respect to the optical axis AX of the illumination optical system. Consequently, there is produced such an advantage that no precise positioning mechanism is needed. At this time, the drive element 113 is used for the positioning process, and it is therefore desirable to provide a rotary angle measuring member such as, e.g., a rotary encoder. Note that each of the plurality of fly eye lens groups constituting the holding members comprises, as shown in FIG. 38, 16 pieces of lens elements (only the fly eye lens group 116A is composed of 36 pieces lens elements). The numerical number is not limited to this. In an extreme case, the fly eye lens group consisting of one lens element may also be available.

Referring to FIG. 37, the spatial filter 16 is disposed in rear (reticle-side) of the holding member 111. In each of the holding members, when the portions other than the fly eye lens groups are formed as light shielding portions, the spatial filter 16 is not particularly provided. At this time, the turret plate 112 may be a transmissive portion or a light shielding portion. The number of the holding members to be fixed to the turret plate 112 and the eccentric states (positions) of the plurality of fly eye lens groups are not limited to those shown in FIG. 38 but may be arbitrarily set corresponding to the periodicity of the reticle patterns to be transferred. If there is a necessity for strictly setting the incident angles and the like of the illumination luminous fluxes on the reticle patterns, each of the plurality of fly eye lens groups may be so constructed as to be minutely movable in the radial directions (radiant directions) about the optical axis AX in the holding member. Further, the holding members (fly eye lens groups 111A, 111B) may be so constructed as to be rotatable about the optical axis AX. On this occasion, if especially the optical fiber bundle 35 is employed as an optical member (input optical system) for concentrating the illumination luminous fluxes in the vicinity of each of the plurality of fly eye lens groups, the exit ends 35A, 35B thereof are arranged to move with movements of the fly eye lens groups. For instance, the exit ends 35A, 35B and the fly eye lens groups may be integrally fixed. In addition, the rectangular fly eye lens groups are relatively inclined with rotation of the holding member. However, when rotating the holding member, it is desirable that only the positions of the fly eye lens groups are moved without causing the above-mentioned inclination.

When exchanging the holding member, it is necessary to exchange the input optical system such as, e.g., the diffraction grating pattern plate 12, the relay lens 73 (FIG. 37) and the optical fiber bundle 35. Desirably, the input optical systems corresponding to the eccentric states of the plurality of fly eye lens groups are integrally constructed for every holding member and fixed to the movable member 112.

Figure 39:
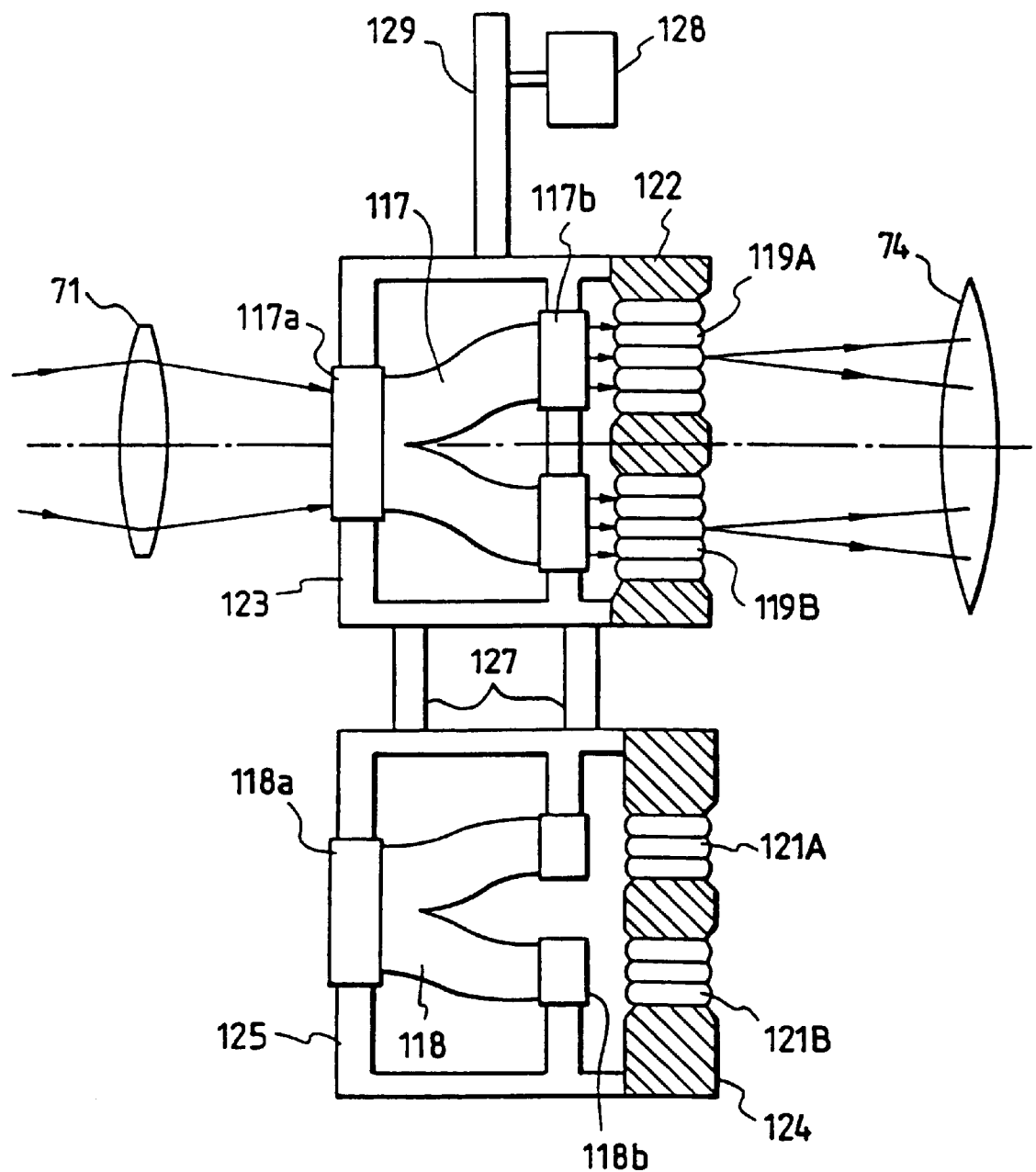
FIG. 39 is a view showing a variant form of the movable member for exchanging the plurality of holding member.

FIG. 39 is a diagram showing a variant form of the movable member for exchanging the holding member. The input optical system (optical fiber bundles 117, 118) and the holding members (12, 124) are integrally fixed to the movable member (support bar 125). It is permitted that the above-described other optical systems, though the optical fiber bundle is exemplified herein, may be employed as an input optical system. Incidentally, the fundamental construction (the example where the optical fiber bundle is used as an input optical system) has been already explained in the fourth embodiment (FIG. 32) and therefore touched briefly herein.

Referring to FIG. 39, the two fly eye lens groups 119A, 119B are integrally held by the holding member 122, while an incident portion 117a and an exit portion 117b of the optical fiber bundle 117 are both held by a fixing tool 123. At the same moment, the holding member 122 is integrally fixed to the fixing tool 123. Excepting the fly eye lens groups 119A, 119B, the light shielding portions (the illustrated oblique line portions corresponding to, e.g., the spatial filter 16 of FIG. 37) occupy the interior of the holding member. On the other hand, the fly eye lens groups 121A, 121B for the replacement are integrally held by the holding member 124. An incident portion 118a and an exit portion 118b of an optical fiber bundle 118 are both held by a fixing tool 125. Simultaneously, the holding member 124 is integrally fixed to the fixing tool 125. As in the same way described above, the interior of the holding member 124 is formed with the light shielding portions. Further, the fixing tools 123, 125 are connectively fixed by means of a connecting member 127. Therefore, the holding members may be exchanged for every fixing tool. Note that in FIG. 39, the fixing tool 123 (holding member 122) exists in the illumination optical system, whereas the fixing tool 125 for the replacement is set in a position deviating from the illumination optical system. The constructions toward the light source from the relay lens system 71 and toward the reticle from the condenser lens 74 are the same as those shown in FIG. 37.

By the way, the holding member is exchanged by pushing or pulling the support bar 129 with the help of the drive element 128. Hence, as illustrated in FIG. 39, when exchanging the holding member, the fly eye lens groups and the optical fiber bundle are so arranged as to be integrally exchangeable. With this arrangement, it may be sufficient that the foregoing integral member groups (fixing tools) are matched in position with the illumination optical system as a whole. Produced is an advantage of eliminating the necessity for effecting the positional adjustments between the respective members (fly eye lens groups, optical fiber bundle, etc.) per exchanging process. At this time, the drive element 128 is employed also for positioning. It is therefore desirable to provide a position measuring member such as, for example, a linear encoder, a potentiometer, etc.

Note that the number of the fly eye lens groups per holding member shown in FIGS. 38 and 39 and the number of the lens elements constituting the fly eye lens groups may be arbitrarily set. Besides, the configurations of the fly eye lens group and of the incident or exit surface of the lens element are not limited to the rectangle.

Now, the respective positions of the plurality of fly eye lens groups depicted in FIGS. 38 and 39 in other words, the holding member to be selected are preferably determined (changed) depending on the reticle patterns to be transferred. A method of determining (selecting) the positions of the respective fly eye lens groups is the same with the fourth embodiment (the method being identical with that explained in the first embodiment). To be more specific, the holding member including the fly eye lens group may be disposed in the incident position (incident angle) or in the vicinity thereof on the reticle patterns to obtain the effects given by the improved optimum resolving power and focal depth to the degree of fineness (pitch) of the patterns to be transferred using the illumination luminous fluxes coming from the respective fly eye lens groups.

It is to be noted that the openings of the spatial filter 210 or 16 are desirably variable corresponding to the movements of the respective fly eye lens groups with the exchange of the holding member. Provided alternatively is a mechanism for exchanging the spatial filters 210, 12 in accordance with the positions of the individual fly eye lenses. Besides, the device may incorporate some kinds of light shielding members.

In the embodiment discussed above, the premise is that the plurality of holding members (fly eye lens groups) are so constructed as to be exchangeable. According to the present invention, as a matter of course, the holding members are not necessarily so constructed as to be exchangeable. For instance, only the holding member 111 depicted in FIG. 38 is merely disposed in the illumination optical system. With this arrangement, there can be of course attained the effects (to actualize the projection type exposure apparatus exhibiting the high resolving power and large focal depth) of the present invention. Incidentally, if it is permitted to cause somewhat a loss in the illumination light quantity from the light source, the optical member (input optical system) for concerning the illumination luminous fluxes on the fly eye lens groups is not particularly disposed.

In this embodiment also, the other fly eye lens may be also provided. The σ-value determined by one if the respective fly eye lens groups is set to preferably 0.1 through 0.3.

The cumulative focal point exposure method described in the third embodiment is, though the first to fifth embodiments have been described so far, applicable to the first, second, fourth and fifth embodiments.

In the first through fifth embodiments discussed above, the explanations have been given by use of the mercury lamp 1 as a light source. The light source may include, however, other bright-line lamps and lasers (excimers, etc.); or a continuous spectrum light source is also available. A large proportion of the optical members in the illumination optical system are composed of the lenses. However, the mirrors (concave and convex mirrors) are also available. The projection optical system may come under a refractive system or reflective system or reflective/refractive system. In the embodiments, the double-side telecentric system is used. However, a one-side telecentric system or non-telecentric system is also available. If the correction of the chromatic aberration of each optical system is insufficient, a band-pass filter and a dichroic mirror intervene in the light path of the illumination system to utilize only the monochromatic light.

Although the illustrative embodiment of the present invention have been described in detail with reference to the accompanying drawings, it is to be understood that the present invention is not limited to those embodiments. Various changes or modifications may be effected therein by one skilled in the art without departing from the scope or spirit of the invention.

What is claimed is:

1. A method of exposing an object through a projection optical system with light irradiated on a pattern having linear features extending in orthogonal first and second directions from a light source through an illumination optical system, comprising:

disposing a diffraction optical element that generates diffracted light in different directions from an optical axis of the illumination optical system between the light source and an optical integrator in the illumination optical system;

distributing the diffracted light at regions apart from the optical axis on a predetermined plane substantially conjugate with a pupil plane of the projection optical system in the illumination optical system to form on the predetermined plane an intensity distribution having increased intensity portions relative to a portion on first and second axes defined to intersect with each other at the optical axis and defined along the first and second directions, the increased intensity portions having first distances substantially equal to each other from the optical axis with respect to the first direction and having second distances substantially equal to each other from the optical axis with respect to the second direction, the first distances being determined in accordance with fineness of the pattern with respect to the first direction and the second distances being determined in accordance with fineness of the pattern with respect to the second direction; and projecting onto the object through the projection optical system the illuminated pattern with light of which the intensity distribution has the increased intensity portions on the predetermined plane in the illumination optical system.

2. A method according to claim 1, wherein two diffracted light having different order generated from said pattern by irradiation of light from each one of said increased intensity portions are distributed at different regions, of which distances from an optical axis of said projection optical system are substantially equal, on the pupil plane of said projection optical system.

3. A method according to claim 2, wherein said two diffracted light includes 0-order diffracted light and non-0-order diffracted light that satisfies the following relation in the resolution limit of said projection optical system:

$$\sin(\theta-\Phi) = NA_R$$

where $\Phi$ is an incident angle of light from each one of said increased intensity portions, $\theta$ is an angle of diffraction of the non-0-order diffracted light, and $NA_R$ is a numerical aperture of said projection optical system.

4. A method according to claim 1, wherein first diffracted light generated from said pattern by irradiation of light from a first one of said increased intensity portions is distributed at a region, on the pupil plane of said projection optical system, at which at least part of second diffracted light having different order from the first diffracted light, generated from said pattern by irradiation of light from a second one of said increased intensity portions different from the first portion is distributed.

5. A method according to claim 1, wherein an incident angle of light from each one of said increased intensity portions satisfies the following relation:

$$\sin\Phi = \lambda/2P$$

where $\Phi$ is the incident angle, $\lambda$ is a wavelength of the light, and P is a pitch of said pattern.

6. A method according to claim 1, wherein three diffracted light generated from said pattern by irradiation of light from each one of said increased intensity portions are distributed at substantially equal distances from an optical axis of said projection optical system on the pupil plane of said projection optical system, the three diffracted light including 0-order diffracted light, non-0-order diffracted light distributed in a first direction about the 0-order diffracted light and non-0-order diffracted light distributed in a second direction about the 0-order diffracted light.

7. A method according to claim 1, wherein said increased intensity portions are substantially disposed on intersection points of first and second pairs of line segments, the first pair of line segments being defined along said first direction and defined apart from the optical axis of said illumination optical system by said second distances, and the second pair of line segments being defined along said second direction and defined apart from the optical axis of said illumination optical system by said first distances.

8. A method according to claim 1, wherein a minimum pitch of said pattern is defined to be:

$$\lambda/(NA_R + \sin\Phi)$$

where $\Phi$ is an incident angle of light from each one of said increased intensity portions, $\lambda$ is a wavelength of the light, and $NA_R$ is a numerical aperture of said projection optical system.

9. A method according to claim 1, wherein said pattern includes periodic features whose pitch is smaller than $\lambda/NA_R$, where $\lambda$ is a wavelength of the light, and $NA_R$ is a numerical aperture of said projection optical system.

10. A method according to claim 1, wherein a ratio of a numerical aperture of light from each one of said increased intensity portions to that of said projection optical system is substantially 0.1–0.3.

11. A method according to claim 1, further comprising:
moving an image plane of said projection optical system and said object relative to each other with respect to a direction along an optical axis of said projection optical system during exposure of said object.

12. A method of exposing an object through a projection optical system with light irradiated on a mask from a light source through an illumination optical system, comprising:
disposing a diffraction optical element that generates diffracted light in different directions from an optical axis of the illumination optical system between the light source and an optical integrator in the illumination optical system;
distributing the diffracted light at regions apart from the optical axis on a predetermined plane substantially conjugate with a pupil plane of the projection optical system in the illumination optical system to form on the predetermined plane an intensity distribution having increased intensity portions apart from the optical axis relative to a portion of the intensity distribution on the optical axis, two diffracted light having different order generated from a pattern by irradiation of light from each one of the increased intensity portions being distributed at different regions, of which distances from an optical axis of said projection optical system are substantially equal, on the pupil plane of the projection optical system, the two diffracted light including 0-order diffracted light and non-0-order diffracted light that satisfies the following relation in the resolution limit of the projection optical system:

$$\sin(\theta - \Phi) = NA_R$$

where $\Phi$ is an incident angle of light from each one of the increased intensity portions, $\theta$ is an angle of diffraction of the non-0-order diffracted light, and $NA_R$ is a numerical aperture of the projection optical system; and projecting onto the object through the projection optical system the illuminated pattern with light of which the intensity distribution has the increased intensity portions on the predetermined plane in the illumination optical system.

13. A method according to claim 12, wherein first diffracted light generated from said pattern by irradiation of light from a first one of said increased intensity portions is distributed at a region, on the pupil plane of said projection optical system, at which at least part of second diffracted light having different order from the first diffracted light, generated from said pattern by irradiation of light from a second one of said increased intensity portions different from the first portion is distributed.

14. A method according to claim 12, wherein an incident angle of light from each one of said increased intensity portions satisfies the following relation:

$$\sin\Phi = \lambda/2P$$

where $\Phi$ is the incident angle, $\lambda$ is a wavelength of the light, and P is a pitch of said pattern.

15. A method according to claim 12, wherein three diffracted light generated from said pattern by irradiation of light from each one of said increased intensity portions are distributed at substantially equal distances from an optical axis of said projection optical system on the pupil plane of said projection optical system, the three diffracted light including 0-order diffracted light, non-0-order diffracted light distributed in a first direction about the 0-order diffracted light and non-0-order diffracted light distributed in a second direction about the 0-order diffracted light.

16. A method according to claim 12, wherein said increased intensity portions are substantially disposed on intersection points of first and second pairs of line segments, the first pair of line segments being defined along a first direction and defined apart from the optical axis of said illumination optical system by a first distance corresponding to fineness of said pattern with respect to a second direction perpendicular to the first direction, and the second pair of line segments being defined along the second direction and defined apart from the optical axis of said illumination optical system by a second distance corresponding to fineness of said pattern with respect to the first direction.

17. A method according to claim 12, wherein a minimum pitch of said pattern is defined to be:

$$\lambda/(NA_R + \sin \Phi)$$

where $\Phi$ is an incident angle of light from each one of said increased intensity portions, $\lambda$ is a wavelength of the light, and $NA_R$ is a numerical aperture of said projection optical system.

18. A method according to claim 12, wherein said pattern includes periodic features whose pitch is smaller than $\lambda/NA_R$, where $\lambda$ is a wavelength of the light, and $NA_R$ is a numerical aperture of said projection optical system.

19. A method according to claim 12, wherein a ratio of a numerical aperture of light from each one of said increased intensity portions to that of said projection optical system is substantially 0.1–0.3.

20. A method according to claim 12, further comprising:
moving an image plane of said projection optical system and said object relative to each other with respect to a direction along an optical axis of said projection optical system during exposure of said object.

21. A method of exposing an object through a projection optical system with light irradiated on a mask from a light source through an illumination optical system, comprising:
disposing a diffraction optical element that generates diffracted light in different directions from an optical axis of the illumination optical system between the light source and an optical integrator in the illumination optical system;
distributing the diffracted light at regions apart from the optical axis on a predetermined plane substantially conjugate with a pupil plane of the projection optical system in the illumination optical system to form on the predetermined plane an intensity distribution having increased intensity portions apart from the optical axis relative to a portion of the intensity distribution on the optical axis, first diffracted light generated from a pattern by irradiation of light from a first one of the increased intensity portions being distributed at a region, on an pupil plane of the projection optical system, at which at least part of second diffracted light having different order from the first diffracted light, generated from the pattern by irradiation of light from a second one of the increased intensity portions different from the first increased intensity portion is distributed; and
projecting onto the object through the projection optical system the illuminated pattern with light of which the intensity distribution has the increased intensity portions on the predetermined plane in the illumination optical system.

22. A method according to claim 21, wherein an incident angle of light from each one of said increased intensity portions satisfies the following relation:

$$\sin \Phi = \lambda/2P$$

where $\Phi$ is the incident angle, $\lambda$ is a wavelength of the light, and $P$ is a pitch of said pattern.

23. A method according to claim 21, wherein three diffracted light generated from said pattern by irradiation of light from each one of said increased intensity portions are distributed at substantially equal distances from an optical axis of said projection optical system on the pupil plane of said projection optical system, the three diffracted light including 0-order diffracted light, non-0-order diffracted light distributed in a first direction about the 0-order diffracted light and non-0-order diffracted light distributed in a second direction about the 0-order diffracted light.

24. A method according to claim 21, wherein said increased intensity portions are substantially disposed on intersection points of first and second pairs of line segments, the first pair of line segments being defined along a first direction and defined apart from the optical axis of said illumination optical system by a first distance corresponding to fineness of said pattern with respect to a second direction perpendicular to the first direction, and the second pair of line segments being defined along the second direction and defined apart from the optical axis of said illumination optical system by a second distance corresponding to fineness of said pattern with respect to the first direction.

25. A method according to claim 21, wherein a minimum pitch of said pattern is defined to be:

$$\lambda/(NA_R + \sin \Phi)$$

where $\Phi$ is an incident angle of light from each one of said increased intensity portions, $\lambda$ is a wavelength of the light, and $NA_R$ is a numerical aperture of said projection optical system.

26. A method according to claim 21, wherein said pattern includes periodic features whose pitch is smaller than $\lambda/NA_R$, where $\lambda$ is a wavelength of the light, and $NA_R$ is a numerical aperture of said projection optical system.

27. A method according to claim 21, wherein a ratio of a numerical aperture of light from each one of said increased intensity portions to that of said projection optical system is substantially 0.1–0.3.

28. A method according to claim 21, further comprising:
moving an image plane of said projection optical system and said object relative to each other with respect to a direction along an optical axis of said projection optical system during exposure of said object.

29. A method of exposing an object through a projection optical system with light irradiated on a mask from a light source through an illumination optical system, comprising:
disposing a diffraction optical element that generates diffracted light in different directions from an optical axis of the illumination optical system between the light source and an optical integrator in the illumination optical system;
distributing the diffracted light at regions apart from the optical axis on a predetermined plane substantially conjugate with a pupil plane of the projection optical system in the illumination optical system to form on the predetermined plane an intensity distribution having increased intensity portions apart from the optical axis relative to a portion of the intensity distribution on the optical axis, an incident angle of light from each one of the increased intensity portions satisfying the following relation:

$$\sin \Phi = \lambda/2P$$

where $\Phi$ is the incident angle, $\lambda$ is a wavelength of the light, and $P$ is a pitch of a pattern on the mask; and
projecting onto the object through the projection optical system the illuminated pattern with light of which the intensity distribution has the increased intensity portions on the predetermined plane in the illumination optical system.

30. A method according to claim 29, wherein three diffracted light generated from said pattern by irradiation of light from each one of said increased intensity portions are distributed at substantially equal distances from an optical axis of said projection optical system on the pupil plane of said projection optical system, the three diffracted light including 0-order diffracted light, non-0-order diffracted light distributed in a first direction about the 0-order diffracted light and non-0-order diffracted light distributed in a second direction about the 0-order diffracted light.

31. A method according to claim 29, wherein said increased intensity portions are substantially disposed on intersection points of first and second pairs of line segments, the first pair of line segments being defined along a first direction and defined apart from the optical axis of said illumination optical system by a first distance corresponding to fineness of said pattern with respect to a second direction perpendicular to the first direction, and the second pair of line segments being defined along the second direction and defined apart from the optical axis of said illumination optical system by a second distance corresponding to fineness of said pattern with respect to the first direction.

32. A method according to claim 29, wherein a minimum pitch of said pattern is defined to be:

$$\lambda/(NA_R + \sin \Phi)$$

where $\Phi$ is an incident angle of light from each one of said increased intensity portions, $\lambda$ is a wavelength of the light, and $NA_R$ is a numerical aperture of said projection optical system.

33. A method according to claim 29, wherein said pattern includes periodic features whose pitch is smaller than $\lambda/NA_R$, where $\lambda$ is a wavelength of the light, and $NA_R$ is a numerical aperture of said projection optical system.

34. A method according to claim 29, wherein a ratio of a numerical aperture of light from each one of said increased intensity portions to that of said projection optical system is substantially 0.1–0.3.

35. A method according to claim 29, further comprising:
moving an image plane of said projection optical system and said object relative to each other with respect to a direction along an optical axis of said projection optical system during exposure of said object.

36. A method of exposing an object through a projection optical system with light irradiated on a mask from a light source through an illumination optical system, comprising:
disposing a diffraction optical element that generates diffracted light in different directions from an optical axis of the illumination optical system between the light source and an optical integrator in the illumination optical system;
distributing the diffracted light at regions apart from the optical axis on a predetermined plane substantially conjugate with a pupil plane of the projection optical system in the illumination optical system to form on the predetermined plane an intensity distribution having increased intensity portions apart from the optical axis relative to a portion of the intensity distribution on the optical axis, three diffracted light generated from a pattern by irradiation of light from each one of the increased intensity portions being distributed at substantially equal distances from an optical axis of the projection optical system on the pupil plane of the projection optical system, the three diffracted light including 0-order diffracted light, non-0-order diffracted light distributed in a first direction about the 0-order diffracted light and non-0-order diffracted light distributed in a second direction about the 0-order diffracted light; and
projecting onto the object through the projection optical system the illuminated pattern with light of which the intensity distribution has the increased intensity portions on the predetermined plane in the illumination optical system.

37. A method according to claim 36, wherein said increased intensity portions are substantially disposed on intersection points of first and second pairs of line segments, the first pair of line segments being defined along said first direction and defined apart from the optical axis of said illumination optical system by a first distance corresponding to fineness of said pattern with respect to said second direction, and the second pair of line segments being defined along said second direction and defined apart from the optical axis of said illumination optical system by a second distance corresponding to fineness of said pattern with respect to said first direction.

38. A method according to claim 36, wherein a minimum pitch of said pattern is defined to be:

$$\lambda/(NA_R + \sin \Phi)$$

where $\Phi$ is an incident angle of light from each one of said increased intensity portions, $\lambda$ is a wavelength of the light, and $NA_R$ is a numerical aperture of said projection optical system.

39. A method according to claim 36, wherein said pattern includes periodic features whose pitch is smaller than $\lambda/NA_R$, where $\lambda$ is a wavelength of the light, and $NA_R$ is a numerical aperture of said projection optical system.

40. A method according to claim 36, wherein a ratio of a numerical aperture of light from each one of said increased intensity portions to that of said projection optical system is substantially 0.1–0.3.

41. A method according to claim 36, further comprising:
moving an image plane of said projection optical system and said object relative to each other with respect to a direction along an optical axis of said projection optical system during exposure of said object.

42. A method of exposing an object through a projection optical system with light irradiated on a mask from a light source through an illumination optical system, comprising:
disposing a diffraction optical element that generates diffracted light in different directions from an optical axis of the illumination optical system between the light source and an optical integrator in the illumination optical system;
distributing the diffracted light at regions apart from the optical axis on a predetermined plane substantially conjugate with a pupil plane of the projection optical system in the illumination optical system to form on the predetermined plane an intensity distribution having increased intensity portions substantially disposed on a first pair of line segments relative to a portion of the intensity distribution on the optical axis, the first pair of line segments being defined along a first direction in which a pattern extends and defined apart from the optical axis of the illumination optical system by a first distance corresponding to fineness of the pattern with respect to a second direction perpendicular to the first direction; and
projecting onto the object through the projection optical system the illuminated pattern with light of which the intensity distribution has the increased intensity portions on the predetermined plane in the illumination optical system.

43. A method according to claim 42, wherein said increased intensity portions are substantially disposed on said first pair of line segments and a second pair of line segments defined along said second direction and defined apart from the optical axis of said illumination optical system by a second distance corresponding to fineness of said pattern with respect to said first direction.

44. A method according to claim 43, wherein said increased intensity portions are substantially disposed on intersection points of said first and second pairs of line segments, respectively.

45. A method according to claim 44, wherein a minimum pitch of said pattern is defined to be:

$$\lambda/(NA_R+\sin\Phi)$$

where $\Phi$ is an incident angle of light from each one of said increased intensity portions, $\lambda$ is a wavelength of the light, and $NA_R$ is a numerical aperture of said projection optical system.

46. A method according to claim 42, wherein said pattern includes periodic features whose pitch is smaller than $\lambda/NA_R$, where $\lambda$ is a wavelength of the light, and $NA_R$ is a numerical aperture of said projection optical system.

47. A method according to claim 42, wherein a ratio of a numerical aperture of light from each one of said increased intensity portions to that of said projection optical system is substantially 0.1–0.3.

48. A method according to claim 42, further comprising:

moving an image plane of said projection optical system and said object relative to each other with respect to a direction along an optical axis of said projection optical system during exposure of said object.

* * * * *